US009209249B2

(12) United States Patent
Kachi

(10) Patent No.: US 9,209,249 B2
(45) Date of Patent: Dec. 8, 2015

(54) SEMICONDUCTOR DEVICE AND METHOD OF MANUFACTURING THE SAME

(71) Applicant: Renesas Electronics Corporation, Kawasaki-shi, Kanagawa (JP)

(72) Inventor: Tsuyoshi Kachi, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 32 days.

(21) Appl. No.: 14/149,908

(22) Filed: Jan. 8, 2014

(65) Prior Publication Data

US 2014/0217496 A1  Aug. 7, 2014

(30) Foreign Application Priority Data

Feb. 5, 2013 (JP) .................. 2013-020722

(51) Int. Cl.
*H01L 29/76* (2006.01)
*H01L 29/06* (2006.01)
*H01L 29/66* (2006.01)
*H01L 29/78* (2006.01)

(52) U.S. Cl.
CPC ........ *H01L 29/0696* (2013.01); *H01L 29/0619* (2013.01); *H01L 29/66712* (2013.01); *H01L 29/7813* (2013.01)

(58) Field of Classification Search
CPC ............ H01L 29/7813; H01L 29/0696; H01L 29/66712; H01L 29/06; H01L 29/66; H01L 29/78; H01L 29/0619
USPC ................................ 257/329–331, 335 I, 341
See application file for complete search history.

(56) References Cited

U.S. PATENT DOCUMENTS

| 6,040,600 | A  | * | 3/2000  | Uenishi et al. | 257/330 |
| 8,580,651 | B2 | * | 11/2013 | Ishiguro ....... | 438/433 |
| 2002/0063259 | A1 | * | 5/2002  | Usui et al. ........ | 257/110 |
| 2004/0043565 | A1 | * | 3/2004  | Yamaguchi et al. | 438/268 |
| 2005/0181564 | A1 |   | 8/2005  | Hshieh et al. | |
| 2005/0181577 | A1 |   | 8/2005  | Hshieh | |
| 2006/0231915 | A1 |   | 10/2006 | Hshieh et al. | |
| 2007/0023828 | A1 | * | 2/2007  | Kawamura et al. | 257/330 |
| 2009/0085147 | A1 |   | 4/2009  | Ishiguro et al. | |
| 2011/0291186 | A1 | * | 12/2011 | Yilmaz et al. | 257/334 |

* cited by examiner

*Primary Examiner* — Thanh T Nguyen
(74) *Attorney, Agent, or Firm* — Miles & Stockbridge P.C.

(57) ABSTRACT

To realize a semiconductor device having a power MOSFET satisfying both a low conduction resistance and a high junction breakdown voltage by a simple and easy manufacturing method. Over an n-type substrate, a p-type epitaxial layer of a low concentration is formed, and, in an active part, a plurality of active regions is defined by a plurality of trenches that is formed in the epitaxial layer and extends in a first direction with first intervals in a second direction orthogonal to the first direction. In the epitaxial layer between the adjacent trenches, an n-type diffusion region that functions as a drain offset layer is formed, and, in the epitaxial layer between a side wall of the trench and the n-type diffusion region, a p-type diffusion region connected with a channel region (the p-type diffusion region) is formed, to constitute a super junction structure. Further, by forming an n-type diffusion region in the epitaxial layer, having a prescribed width from a side wall of a trench lying in the end part of the active part toward an outer periphery part, to achieve the improvement of a drain breakdown voltage.

19 Claims, 42 Drawing Sheets

US 9,209,249 B2

SEMICONDUCTOR DEVICE AND METHOD OF MANUFACTURING THE SAME

CROSS-REFERENCE TO RELATED APPLICATION

The disclosure of Japanese Patent Application No. 2013-020722 filed on Feb. 5, 2013 including the specification, drawings and abstract is incorporated herein by reference in its entirety.

BACKGROUND

The present invention relates to a semiconductor device and a technology of manufacturing the same, and can suitably be utilized, for example, for semiconductor devices having a power MOSFET (Power Metal Oxide Semiconductor Field Effect Transistor) of a super junction structure.

The super junction structure can satisfy both a low conduction resistance and a high junction breakdown voltage by arranging periodically narrow-pitched p-n junction cells. However, the outer peripheral part of the p-n junction cell is inevitably not of a periodic structure (not of a super junction structure) and, therefore, some ways and means for obtaining a high breakdown voltage without using a super junction structure are required in the outer peripheral part of the p-n junction cell.

For example, in US Patent No. 2009085147 (Patent Document 1) and US Patent No. 2005181564 (Patent Document 2), there are disclosed technologies of obtaining easily a high breakdown voltage by forming the outer peripheral part with the same conductivity type as that of a conduction layer and making the impurity concentration in the outer peripheral part lower than that in a unit cell.

In US Patent No. 2006231915 (Patent Document 3), there is disclosed a technology of covering the outer peripheral part with a broad and thick insulating film, in order to obtain a high outer periphery breakdown voltage.

In US Patent No. 2005181577 (Patent Document 4), there is disclosed a technology of not introducing an impurity into the side face of a trench in the outer peripheral part, in order to obtain a high outer periphery breakdown voltage.

SUMMARY

As described in Patent Document 1 to Patent Document 4, in order to obtain a stable breakdown voltage in a super junction structure, various methods are proposed about the structure of the p-n junction cell in the outer peripheral part. However, in either method, the compatibility of a low conduction resistance and a high junction breakdown voltage is difficult. In addition, various technical problems to be solved are left, such as increase in the number of manufacturing processes.

The other problems and the new feature will become clear from the description of the present specification and the accompanying drawings.

According to one embodiment, a p-type epitaxial layer of a low concentration is formed on an n-type substrate, and, in an active part, a plurality of active regions is defined by a plurality of trenches extending in a first direction formed in the epitaxial layer. In the epitaxial layer between the adjacent trenches, an n-type diffusion region that functions as a drain offset layer of a power MOSFET is formed, and, in the epitaxial layer between the side wall of the trench and the n-type diffusion region, a p-type diffusion region connected with a channel region of the power MOSFET is formed. In addition, the n-type diffusion region having a prescribed width from the side wall of the trench lying at the end part of the active part toward the outer peripheral part is formed in the epitaxial layer.

According to one embodiment, a semiconductor device having a power MOSFET satisfying both a low conduction resistance and a high junction breakdown voltage can be provided. Further, the semiconductor device can be realized by a simple and easy manufacturing method.

DETAILED DESCRIPTION

Figure 1:
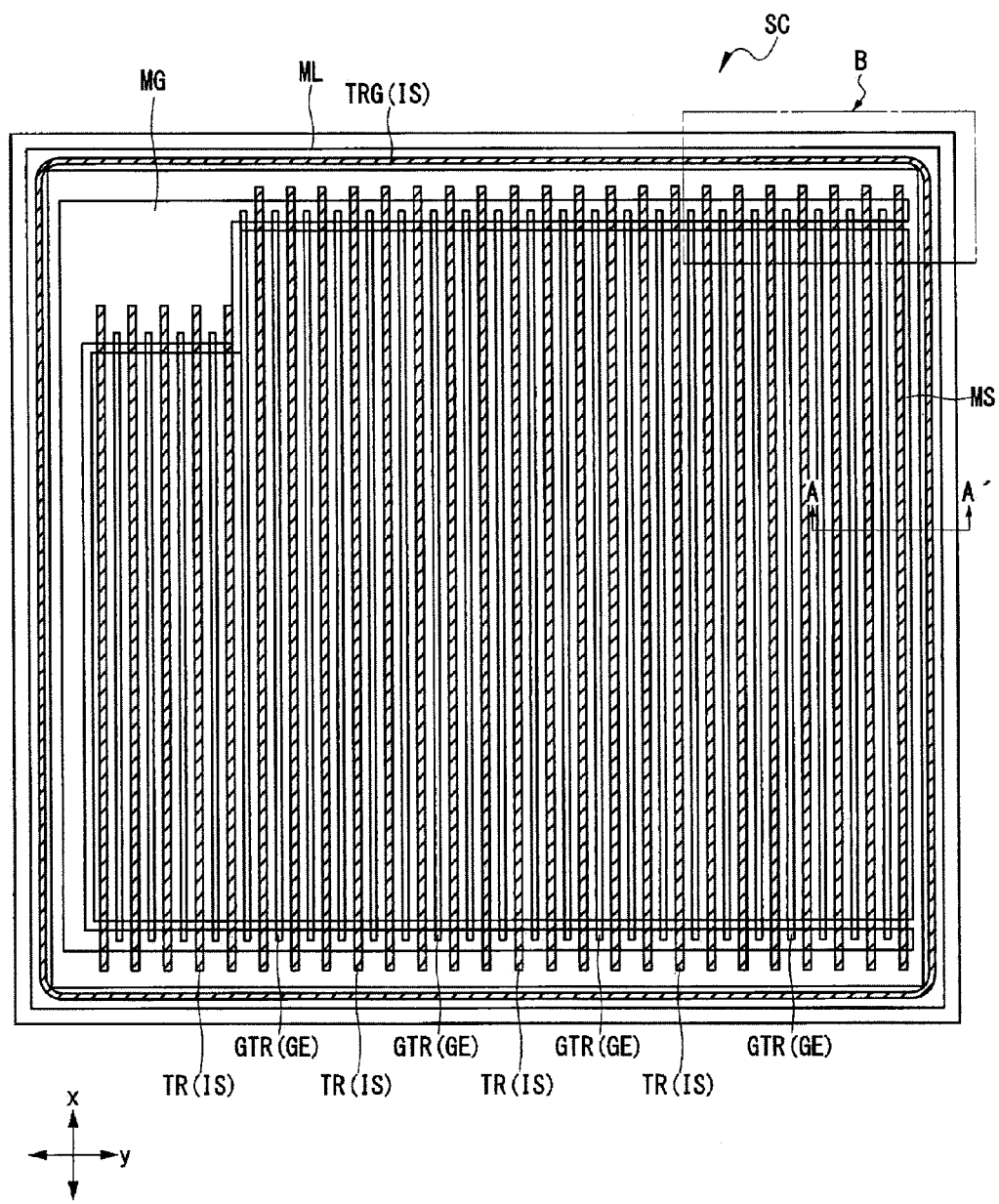
FIG. 1 is an essential part plan view of a semiconductor chip that forms the power MOSFET of a super junction structure according to a first embodiment.

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements and the like (including the number, a numeric value, an amount, a range and the like), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step and the like) is not necessarily indispensable, except for the case where it is clearly specified in particular, or where it is considered to be clearly indispensable from a theoretical point of view or the like.

When such expressions as "constituted of A," "composed of A," "having A" and "containing A" are used, it is needless to say that other elements are not excluded, except for the case where it is clearly specified in particular to be the restricted element. Similarly, in the following embodiments, when shape, position relationship, or the like of an element is referred to, what resembles or is similar to the shape substantially shall be included, except for the case where it is clearly specified in particular and where it is considered to be clearly not right from a theoretical point of view. This statement also applies to the numeric value and range described above.

Further, in the drawing to be used in the following embodiments, in order to make a drawing intelligible, hatching may be attached even if it is a plan view. Further, in all the drawings for explaining the following embodiments, the same symbol is attached to one having the same function, as a principle, and the repeated explanation thereof is omitted. Hereinafter, the present embodiments will be explained in detail according to the drawings.

The power MOSFET used in the present embodiments is one of power devices treating high power for various power supply circuits and automobile applications, and means an element formed by connecting in parallel many unit cells composed, for example, of an n-channel type or a p-channel type MOSFET.

First Embodiment

Semiconductor Device

Figure 2:
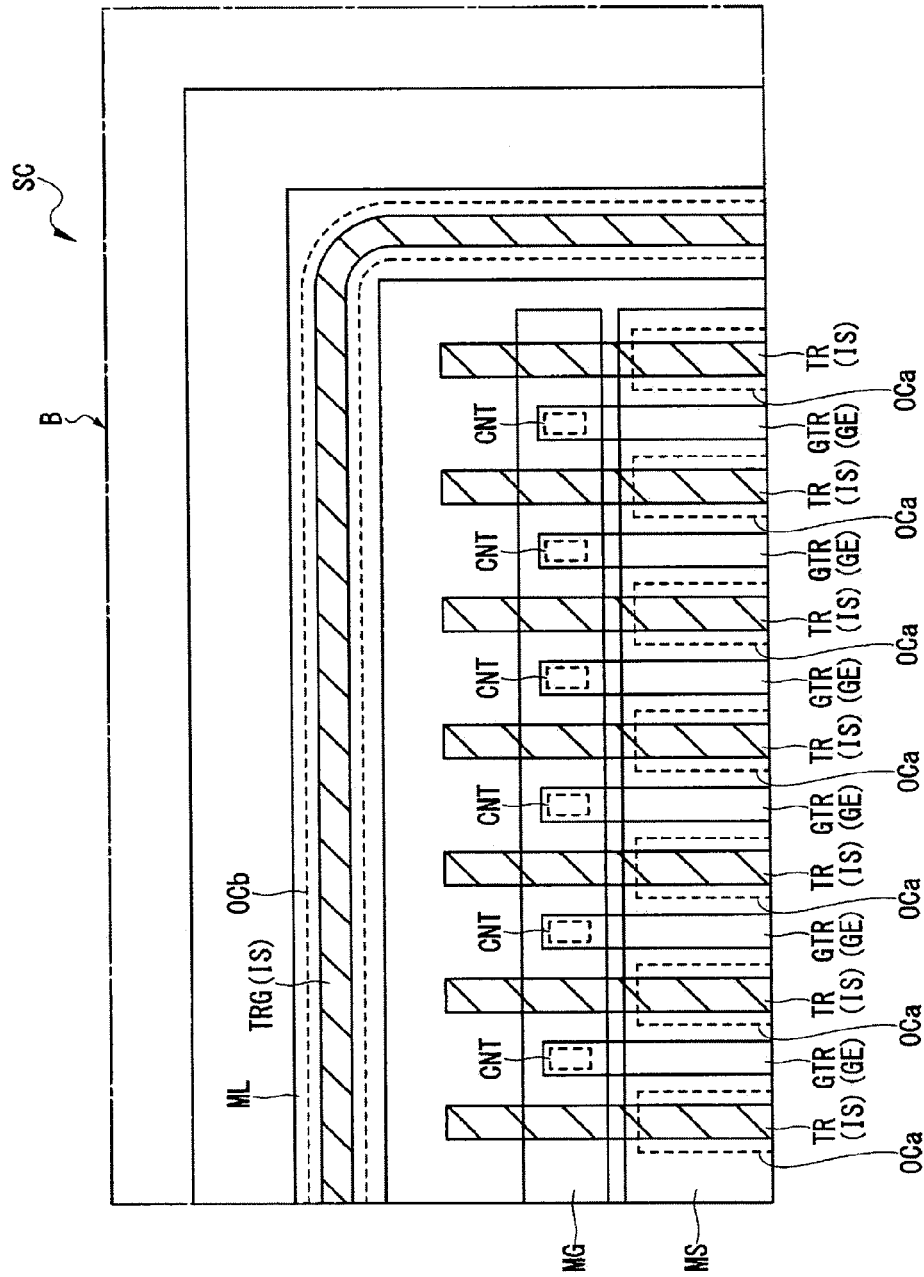
FIG. 2 is an essential part plan view showing, in an enlarged manner, a part of an active part and a part of an outer peripheral part of the semiconductor chip that forms the power MOSFET of a super junction structure according to the first embodiment (an essential part plan view corresponding to a B region shown in FIG. 1)
Figure 3:
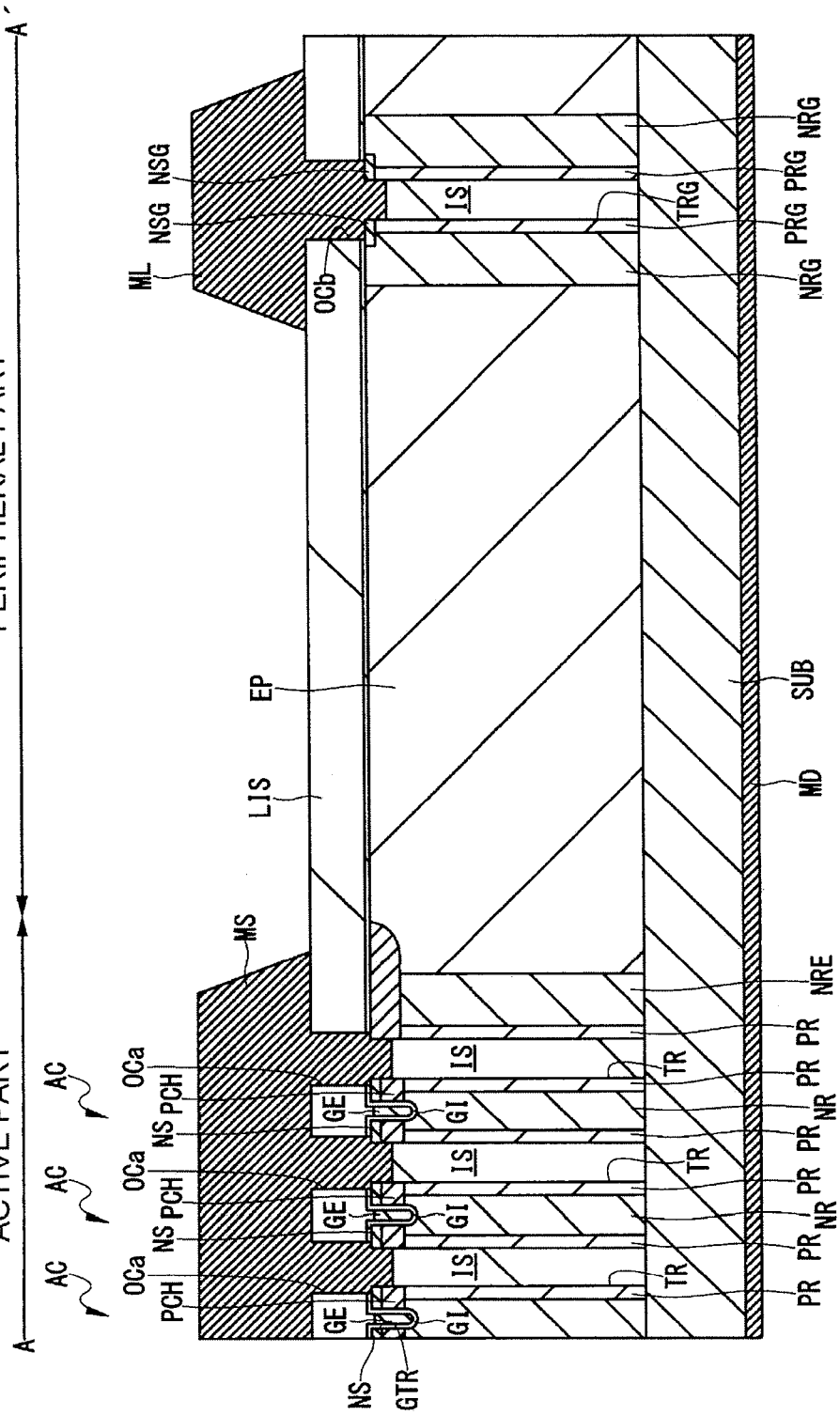
FIG. 3 is an essential part cross-sectional view showing a part of the active part and a part of the outer peripheral part of the semiconductor chip forming the power MOSFET of a super junction structure according to the first embodiment (an essential part cross-sectional view corresponding to the cross-section along an A-A' line shown in FIG. 1)

The structure of the power MOSFET of a super junction structure according to a first embodiment will be explained using FIG. 1 to FIG. 3. FIG. 1 is an essential part plan view of a semiconductor chip forming the power MOSFET of a super junction structure. FIG. 2 is an essential part plan view showing, in an enlarged manner, a part of the active part and a part of the outer peripheral part of the semiconductor chip forming the power MOSFET of a super junction structure (an essential part plan view corresponding to a B region shown in FIG. 1). FIG. 3 is an essential part cross-sectional view showing a part of the active part and a part of the outer peripheral part of the semiconductor chip forming the power MOSFET of a super junction structure (an essential part cross-sectional view corresponding to the cross-section along an A-A' line shown in FIG. 1).

In the active part of a semiconductor chip SC, a power MOSFET is formed. The power MOSFET is formed, for example, in a p-type epitaxial layer EP formed over the main face (surface) of a substrate SUB constituted of an n-type single crystalline silicon. The resistance of the substrate SUB is, for example, not more than 5 mΩ·cm, and the resistance of the epitaxial layer EP is, for example, 1 Ω·cm to 50 Ω·cm. That is, the substrate SUB has a relatively low resistance (a high concentration) and the epitaxial layer EP has a relatively high resistance (a low concentration). The thickness of the epitaxial layer EP is determined in accordance with the breakdown voltage of the power MOSFET, and, for example, when the breakdown voltage is 30 V, it can be set to be 3 μm to 4 μm and when the breakdown voltage is 100 V, it can be set to be 5 μm to 6 μm.

In the epitaxial layer EP, a plurality of trenches TR each having a first depth from the upper face of the epitaxial layer EP is formed along a first direction (an x-direction in FIG. 1), and, an insulating film IS embedded inside the trench TR defines a plurality of active regions AC. The trenches TR give a stripe pattern having constant intervals and a constant width.

In the epitaxial layer EP between the adjacent trenches TR, an n-type diffusion region NR having a first width in a second direction (a y-direction in FIG. 1) orthogonal to the first direction in top view is formed, and, furthermore, in the epitaxial layer EP between a side wall of the trench TR and the n-type diffusion region NR, a p-type diffusion region PR is formed. That is, in the epitaxial layer EP between the adjacent trenches TR, from a side wall of one trench TR toward a side wall of the other trench TR (toward the second direction), there are formed the p-type diffusion region PR having the second width from the side wall of one trench TR, the n-type diffusion region NR having the first width, and the p-type diffusion region PR having a third width from the side wall of the other trench TR. Here, desirably the second width and the third width are equal to each other.

The n-type diffusion region NR functions as a drain offset layer of the power MOSFET, and the p-type diffusion region PR is connected with a channel region (a p-type diffusion region PCH) of the power MOSFET. The impurity concentration in the n-type diffusion region NR is, for example, around 5E16 $cm^{-3}$, and the impurity concentration in the p-type diffusion region PR is, for example, around 1E17 $cm^{-3}$.

In the end part of the active part of a semiconductor chip SC, from the side wall of the trench TR lying in the end part toward an outer peripheral part of the semiconductor chip SC (toward the second direction), the p-type diffusion region PR and an n-type diffusion region NRE are formed in the epitaxial layer EP.

Furthermore, on an upper face side of the epitaxial layer EP, at the center (since specific validity is lacked from the standpoint of processing accuracy or the like, "center" is not restricted to the center itself, but includes also some range while taking variation into consideration) of the epitaxial layer EP between the adjacent trenches TR in top view, a gate electrode GE is formed along the first direction.

The gate electrode GE is formed, via a gate insulating film GI, in a trench GTR for a gate that is formed in the epitaxial layer EP and has a third depth from the upper face of the epitaxial layer EP. A plurality of gate electrodes GE gives a stripe pattern. The gate insulating film GI is composed, for example, of a silicon oxide film, and the gate electrode GE is composed, for example, of a polycrystalline silicon film.

Furthermore, on the upper face side of the epitaxial layer EP, an n-type diffusion region NS having a fourth depth from the upper face of the epitaxial layer EP is formed, and, so as to surround the n-type diffusion region NS, a p-type diffusion region PCH having a fifth depth from the upper face of the epitaxial layer EP is formed. The n-type diffusion region NS functions as the source region of the power MOSFET, and the p-type diffusion region PCH functions as the channel region of the power MOSFET. The fifth depth of the p-type diffusion region PCH is deeper than the fourth depth of the n-type diffusion region NS, and the p-type diffusion region PCH is connected with the above-described p-type diffusion region PR.

The n-type diffusion region NS constituting the source region and the p-type diffusion region PCH constituting the channel region lie on both sides of the trench GTR for a gate in which the gate electrode GE is formed. The trench GTR for a gate has a fourth width in top view, and the fourth width is narrower than the first width of the n-type diffusion region NR. Further, the third depth of the trench GTR for a gate is deeper than the fifth depth of the p-type diffusion region PCH, and a bottom part of the trench GTR for a gate reaches the n-type diffusion region NR.

In the outer peripheral part of the semiconductor chip SC, a guard ring is formed. The guard ring is formed over the entire circumference of the semiconductor chip SC, and has such a role as separating electrically an edge part from the active part of the semiconductor chip SC to protect the power MOSFET after dicing the semiconductor wafer into individual semiconductor chips SC.

The guard ring is constituted, in plan view, of a trench TRG formed so as to surround the active part, a p-type diffusion region PRG formed in the epitaxial layer EP on both sides of the trench TRG, and an n-type diffusion region NRG formed in the epitaxial layer EP outside the p-type diffusion region PRG.

The trench TRG formed in the outer peripheral part is formed into a ring shape in which the whole is linked so as to surround the active part. Further, the trench TRG formed along respective sides of the semiconductor chip SC is in a straight line shape, but a part of the trench TRG close to a corner part of the semiconductor chip is formed, having a first curvature radius in top view.

The p-type diffusion region PRG in the outer peripheral part is formed, for example, at the same time as the p-type diffusion region PR in the active part, and the n-type diffusion region NRG in the outer peripheral part is formed, for example, at the same time as the n-type diffusion regions NR and NRE in the active part. The impurity concentration in the p-type diffusion region PRG is, for example, around $1E17$ $cm^{-3}$, and the impurity concentration in the n-type diffusion region NRG is, for example, around $5E16$ $cm^{-3}$.

Furthermore, on the upper face side of the epitaxial layer EP, an n-type diffusion region NSG having a sixth depth from the upper face of the epitaxial layer EP is formed. The n-type diffusion region NSG in the outer peripheral part is formed, for example, at the same time as the n-type diffusion region NS in the active part. The n-type diffusion region NSG is connected with the n-type diffusion region NRG, and connected electrically to the substrate SUB via the n-type diffusion region NRG.

The part between the n-type diffusion region NRE of a low resistance (a high concentration) formed from the side wall of the trench TR lying in the edge part of the active part toward the outer peripheral part and the n-type diffusion region NRG of a low resistance (a high concentration) formed from the side wall of the trench TRG lying in the outer peripheral part toward the active part is an epitaxial layer EP of a high resistance (a low concentration).

In the active part and the outer peripheral part of the semiconductor chip SC, an interlayer insulating film LIS is formed so as to cover the power MOSFET. In the interlayer insulating film LIS, opening parts OCa and OCb, and a contact hole CNT are formed. A part of the insulating film IS in the trench TR lying below the opening part OCa formed in the active part is etched, and a part of the n-type diffusion region NS and a part of the p-type diffusion region PCH of the power MOSFET are exposed at the side wall of the trench TR. Further, a part of the insulating film IS in the trench TRG lying below the opening part OCb formed in the outer peripheral part is etched, and a part of the n-type diffusion region NSG and a part of the p-type diffusion region PRG of the guard ring are exposed at the side wall of the trench TRG. In addition, a part of the gate electrode GE is exposed by the contact hole CNT.

Here, the upper face of the insulating film IS embedded in the trench TR lies deeper than the fourth depth from the upper face of the epitaxial layer EP in the n-type diffusion region NS (the source region of the power MOSFET) and lies shallower than the fifth depth from the upper face of the epitaxial layer EP in the p-type diffusion region PCH (the channel region of the power MOSFET).

In the state where the opening parts OCa and OCb, and the contact hole CNT are formed, over the interlayer insulating film LIS, a source wiring MS connected to the n-type diffusion region NS and p-type diffusion region PCH in the active part, a gate wiring MG connected to the gate electrode GE, and a guard ring wiring ML connected to the n-type diffusion region NSG and p-type diffusion region PRG in the outer peripheral part are formed, separated from one another. Over the rear face of the substrate SUB, a contact wiring MD is formed.

The source wiring MS formed in the active part is connected with the n-type diffusion region NS and p-type diffusion region PCH exposed at the side wall of the trench TR.

The guard ring wiring ML formed in the outer peripheral part is connected electrically with the substrate SUB via the n-type diffusion regions NSG and NRG. In the first embodiment, the guard ring wiring ML is connected in order to block a leak current at the surface of the semiconductor chip SC or intrusion of moisture from an edge part of the semiconductor chip SC, but, according to amounted state of a surface protection film or the semiconductor chip SC, it may not be formed.

<<Method of Manufacturing Semiconductor Device>>

The method of manufacturing the power MOSFET of a super junction structure according to the first embodiment will be explained in order of process using FIG. 4 to FIG. 24. FIG. 4 to FIG. 24 are essential part cross-sectional views showing, in an enlarged manner, a part of the active part and a part of the outer peripheral part of the semiconductor chip during the manufacturing process of a semiconductor device including the power MOSFET of a super junction structure (essential part cross-sectional views corresponding to the cross-section along the A-A' line shown in FIG. 1).

Figure 4:
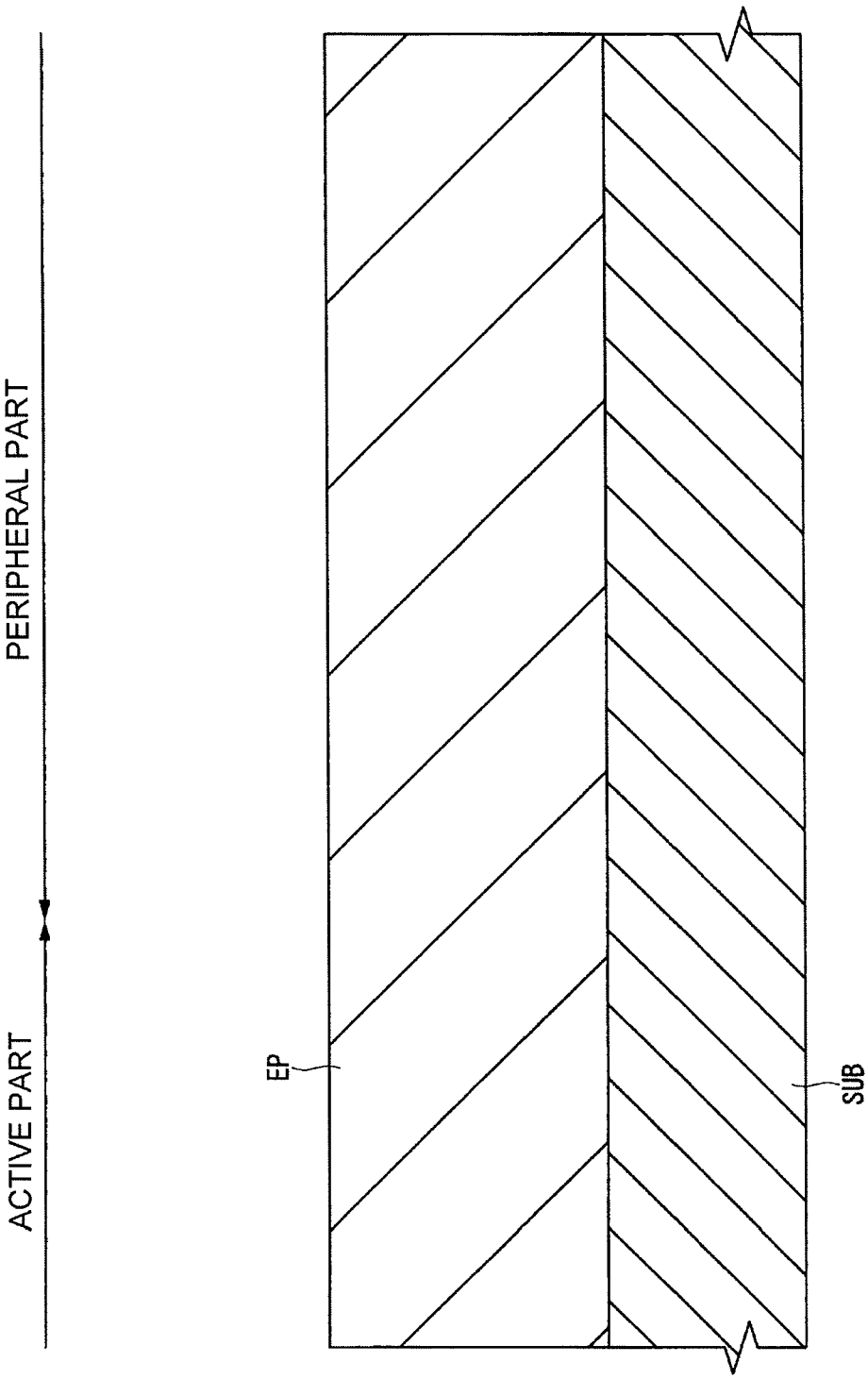
FIG. 4 is an essential part cross-sectional view showing, in an enlarged manner, a part of the active part and a part of the outer peripheral part of the semiconductor chip during a manufacturing process of a semiconductor device including the power MOSFET of a super junction structure according to the first embodiment (an essential part cross-sectional view corresponding to a cross-section along the A-A' line shown in FIG. 1)

First, as shown in FIG. 4, a substrate SUB composed of single crystalline silicon doped with an n-type impurity at a high concentration is prepared. The substrate SUB at this stage is a thin plate of a semiconductor in an approximately circular shape in plan view, which is referred to as a semiconductor wafer, having a resistance, for example, of not more than 5 mΩ·cm.

Subsequently, on the main surface of the substrate SUB, an epitaxial layer EP composed of single crystalline silicon doped with a p-type impurity at a low concentration is formed by an epitaxial growth method. The resistance of the epitaxial layer EP is, for example, 1 Ω·cm to 50 Ω·cm. The thickness of the epitaxial layer EP is to be determined in accordance with the breakdown voltage of the power MOSFET, which can be, for example, 3 μm to 4 μm when the breakdown voltage is 30 V or 5 μm to 6 μm when the breakdown voltage is 100 V.

Figure 5:
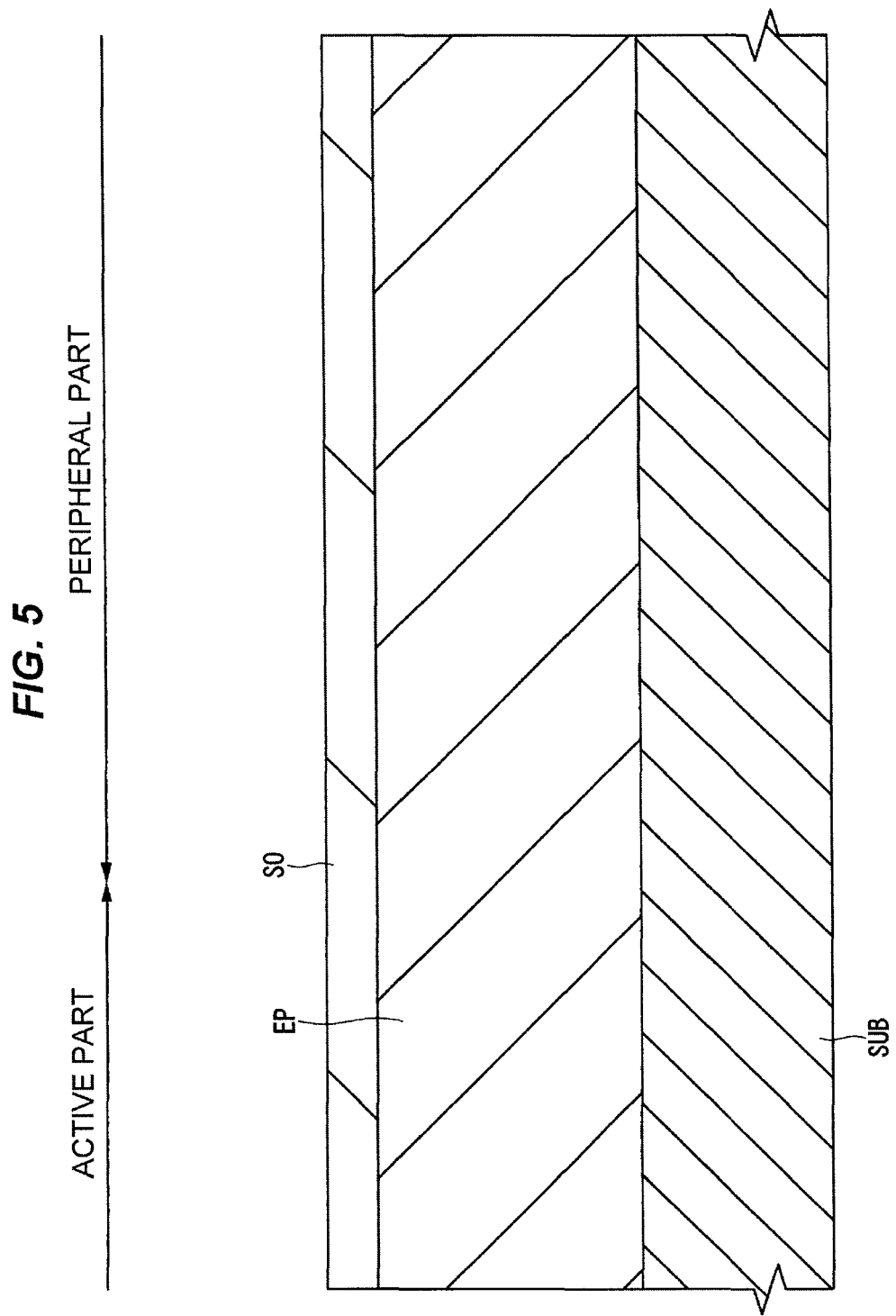
FIG. 5 is an essential part cross-sectional view of the same place as that in FIG. 4 during the manufacturing process of the semiconductor device, following FIG. 4.

Next, as shown in FIG. 5, for example, by providing a thermal oxidation treatment, an oxidized film SO is formed on the upper face of the epitaxial layer EP.

Figure 6:
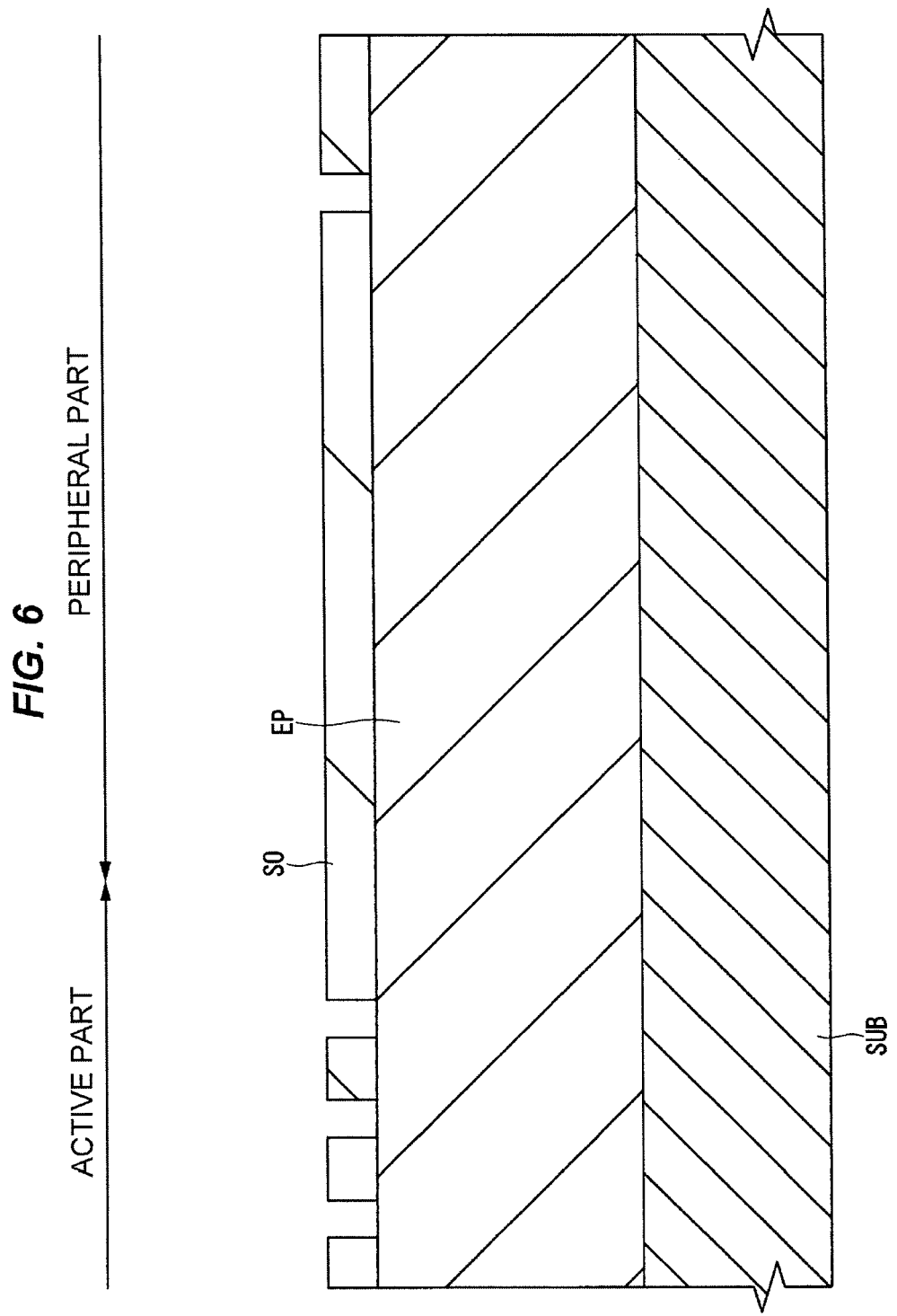
FIG. 6 is an essential part cross-sectional view of the same place as that in FIG. 4 during the manufacturing process of the semiconductor device, following FIG. 5.

Next, as shown in FIG. 6, using a photoresist film patterned by a photolithographic technology as a mask, the oxidized film SO in a region in which a trench is to be formed in the epitaxial layer EP in a subsequent process is removed by an anisotropic dry etching method.

Figure 7:
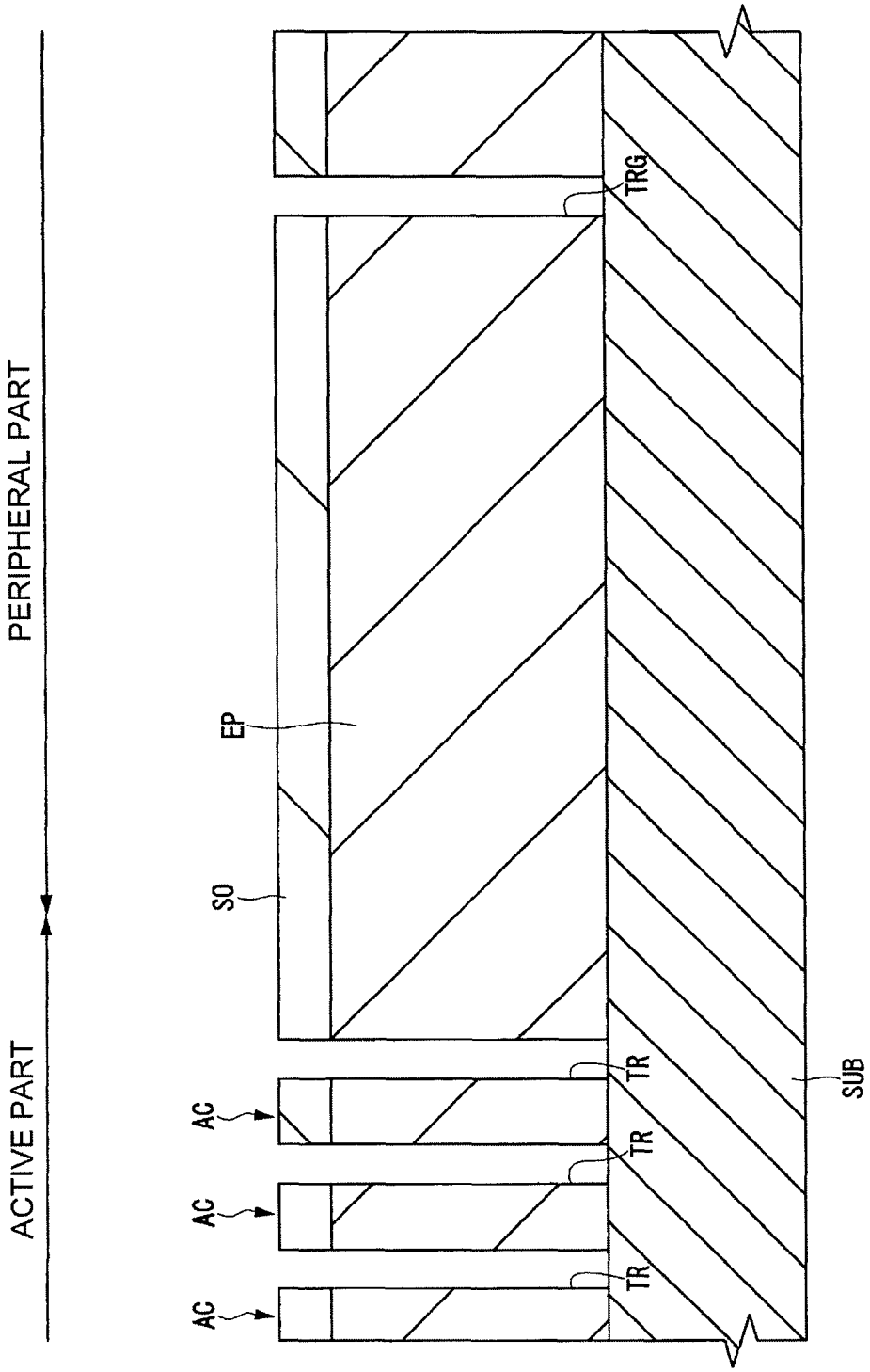
FIG. 7 is an essential part cross-sectional view of the same place as that in FIG. 4 during the manufacturing process of the semiconductor device, following FIG. 6.

Next, as shown in FIG. 7, using the oxidized film SO as a mask, the epitaxial layer EP is removed by an anisotropic dry etching method to form the trench TR that passes through the epitaxial layer EP and reaches the substrate SUB. The trench TR formed in the active part defines an active region AC. The width of the trench TR is, for example, 0.3 μm to 1.5 μm.

At the same time, also in a region in which the guard ring of the outer peripheral part is to be formed, the trench TRG is formed. As shown in FIG. 1 described above, the trench TRG formed in the outer peripheral part is formed in a ring shape in which the whole is linked so as to surround the active part. In addition, the trench TRG formed along respective sides of the semiconductor chip is in a straight line shape, but a part of the trench TRG close to a corner part of the semiconductor chip is formed, having a first curvature radius in top view.

In the trenches TR formed in the active part, all the intervals between the adjacent trenches TR are the same. In contrast, the interval between the trench TR formed in the edge part of the active part and the trench TRG formed in the outer peripheral part is set to be wider than the interval between the adjacent trenches TR formed in the active part.

Figure 8:
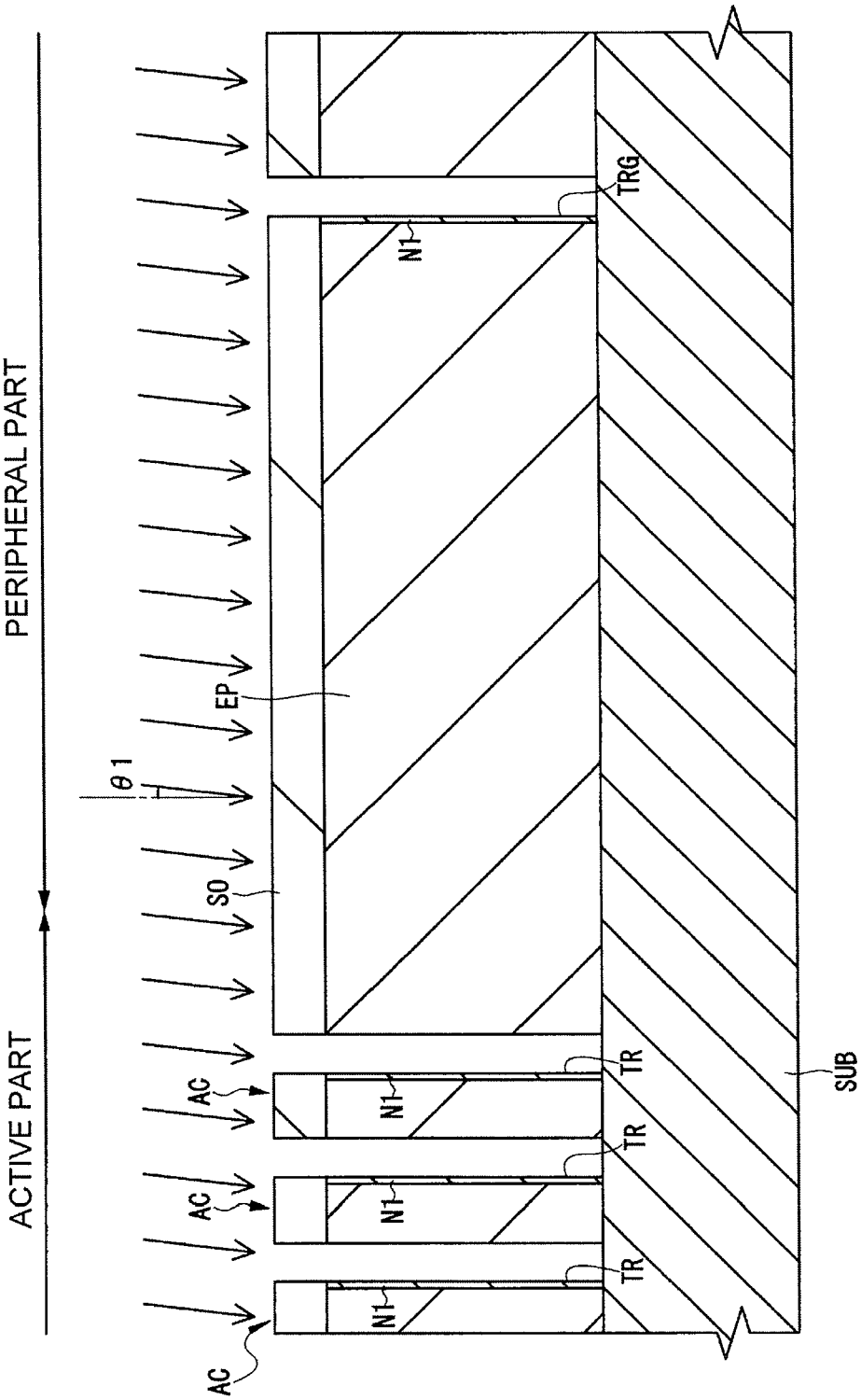
FIG. 8 is an essential part cross-sectional view of the same place as that in FIG. 4 during the manufacturing process of the semiconductor device, following FIG. 7.

Next, as shown in FIG. 8, an n-type impurity, for example, phosphorous (P) is ion-implanted into one side wall of each of the trenches TR and TRG with a prescribed angle $\theta 1$ relative to the normal line. Consequently, in the epitaxial layer EP lying on one side wall side of each of the trenches TR and TRG, an n-type region N1 is formed. The prescribed angle $\theta 1$ is desirably set to be an angle that does not allow phosphorous (P) ions to reach the bottoms of the trenches TR and TRG.

Figure 9:
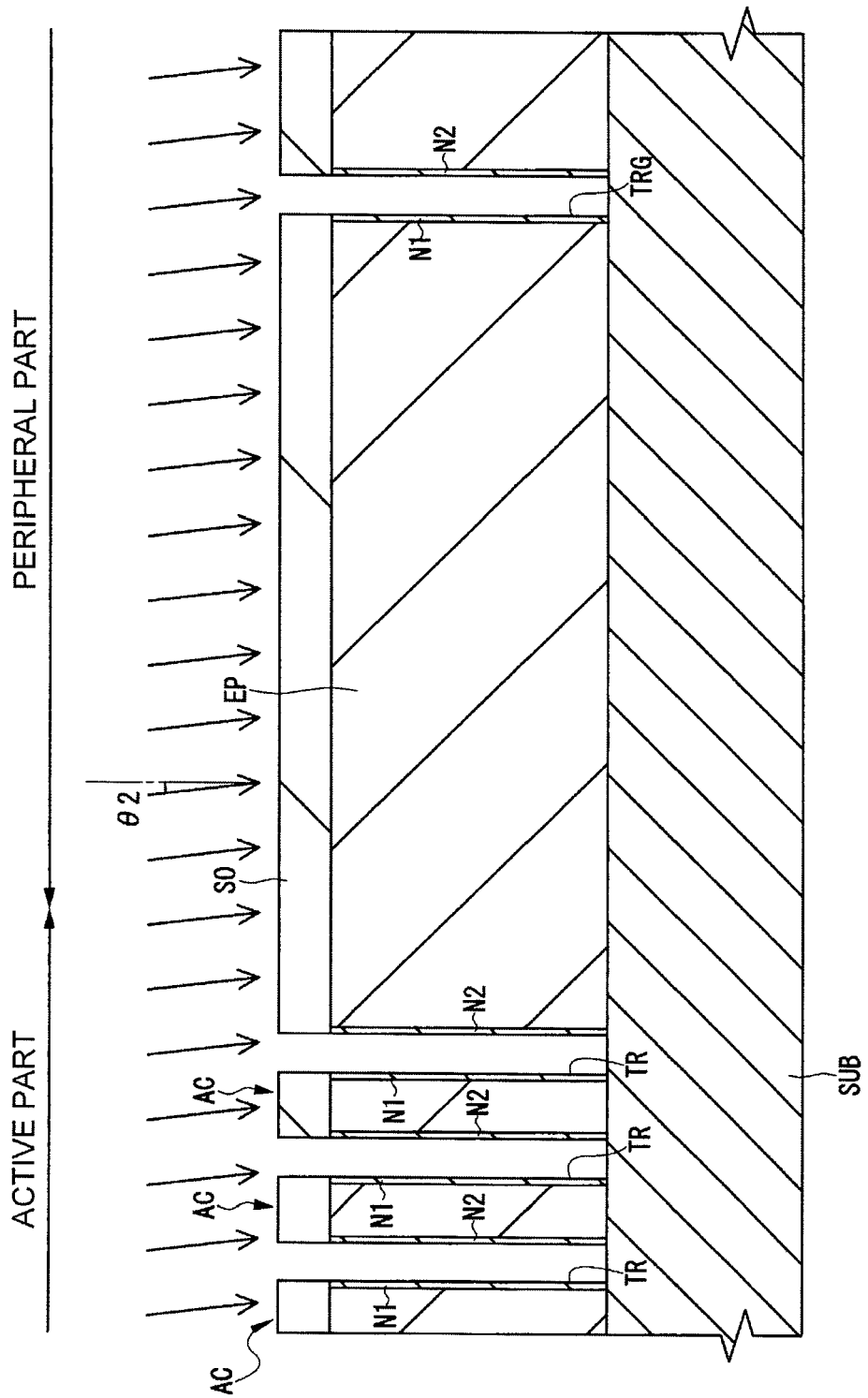
FIG. 9 is an essential part cross-sectional view of the same place as that in FIG. 4 during the manufacturing process of the semiconductor device, following FIG. 8.

Next, as shown in FIG. 9, an n-type impurity, for example, phosphorous (P) is ion-planted into the other side wall of each of the trenches TR and TRG with a prescribed angle $\theta 2$ relative to the normal line. Consequently, in the epitaxial layer EP lying on the other side wall side of each of the trenches TR and TRG, an n-type region N2 is formed. The prescribed angle $\theta 2$ is the same as the angle $\theta 1$, and is desirably set to be an angle that does not allow phosphorous (P) ions to reach the bottoms of the trenches TR and TRG.

Figure 10:
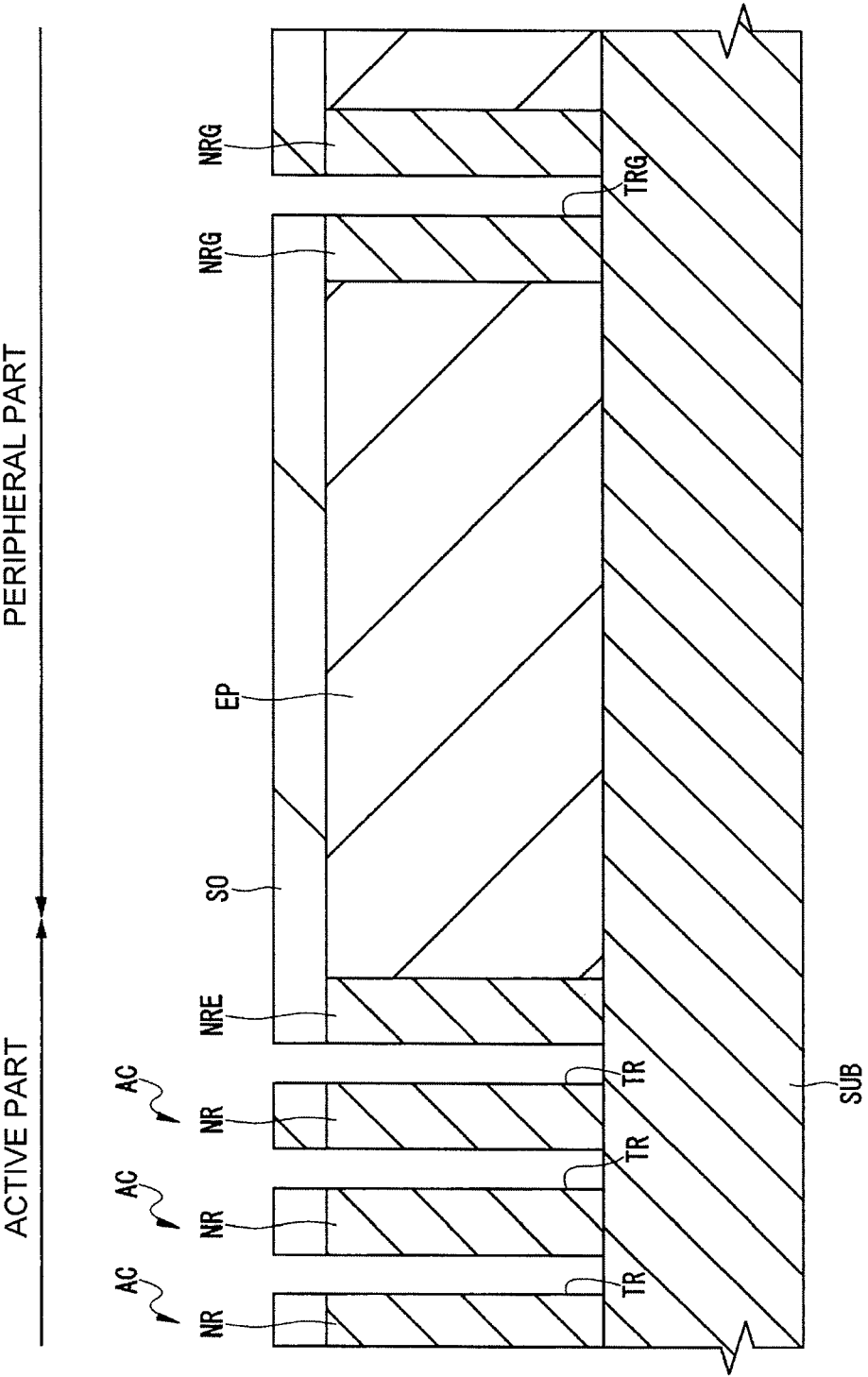
FIG. 10 is an essential part cross-sectional view of the same place as that in FIG. 4 during the manufacturing process of the semiconductor device, following FIG. 9.

Next, as shown in FIG. 10, by providing a heat treatment, phosphorous (P) ions ion-implanted into both side walls of the trenches TR and TRG are activated and thermally diffused. Consequently, in the active part, the n-type diffusion region NR is formed in the whole of the active region AC between the adjacent trenches TR, and the n-type diffusion region NRE is formed from the side wall of the trench TR lying in the edge part of the active part toward the outer peripheral part. In the outer peripheral part, in the epitaxial layer EP on the both side wall sides of the trench TRG, the n-type diffusion region NRG is formed. Temperature and time of the heat treatment are set so that the whole of the active region AC between the adjacent trenches TR in the active part becomes the n-type diffusion region NR, and the heat treatment temperature is, for example, 1000° C. to 1200° C.

In the epitaxial layer EP on the outer peripheral part side of the trench TR formed in the edge part of the active part, too, the n-type diffusion region NRE is formed. However, the n-type diffusion regions NRE and NRG are not formed in the whole between the trench TR formed in the edge part of the active part and the trench TRG formed in the outer peripheral part, but, between the trench TR formed in the edge part of the active part and the trench TRG formed in the outer peripheral part, there is the epitaxial layer EP in which the n-type diffusion regions NRE and NRG are not formed.

Figure 11:
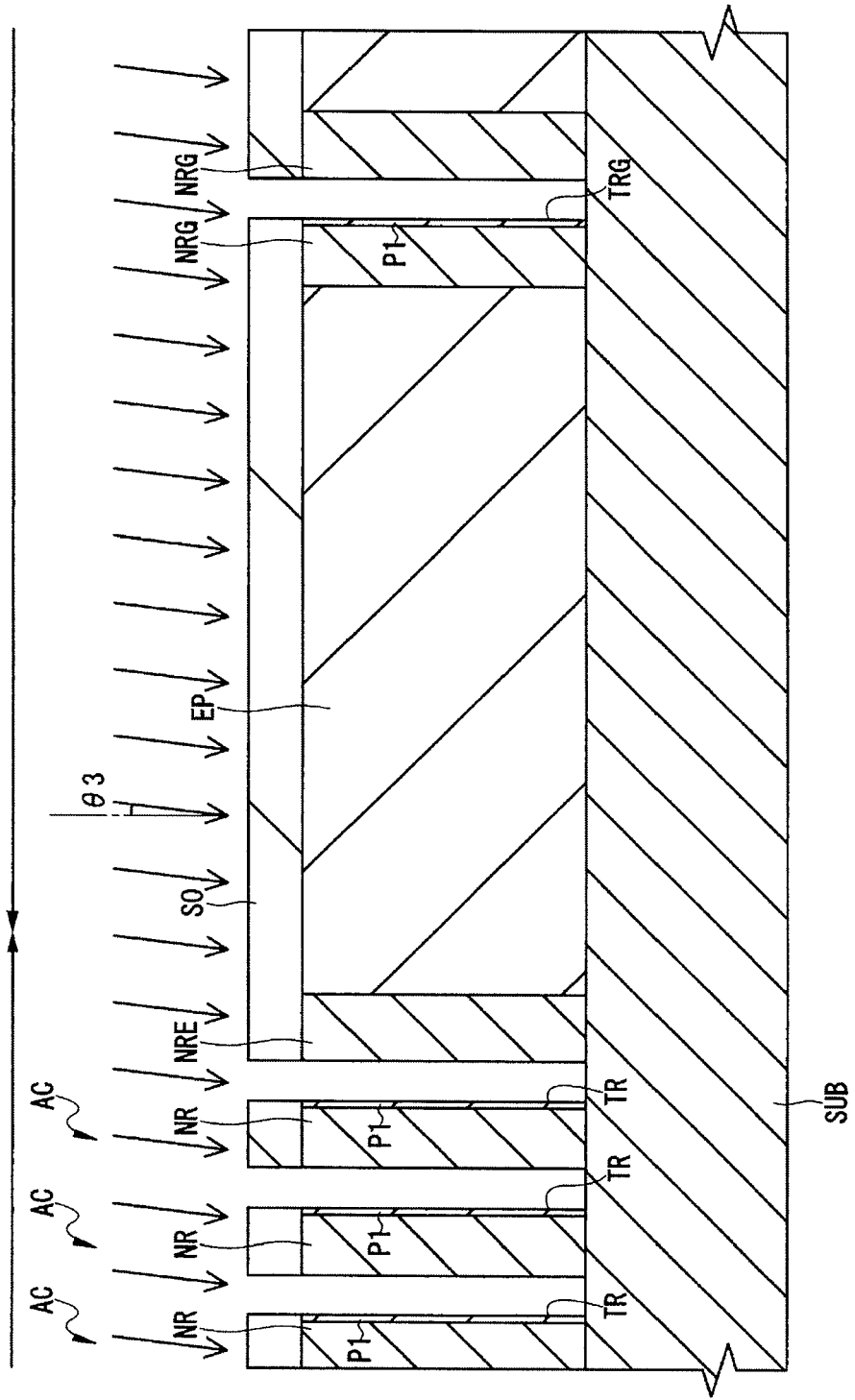
FIG. 11 is an essential part cross-sectional view of the same place as that in FIG. 4 during the manufacturing process of the semiconductor device, following FIG. 10.

Next, as shown in FIG. 11, a p-type impurity, for example, boron (B) is ion-implanted into one side wall of each of the trenches TR and TRG with a prescribed angle $\theta 3$ relative to the normal line. Consequently, in the epitaxial layer EP lying on one side wall side of each of the trenches TR and TRG, a p-type region P1 is formed. The prescribed angle $\theta 3$ is the same as the angles $\theta 1$ and $\theta 2$, and is desirably set to be an angle that does not allow boron (B) ions to reach the bottoms of the trenches TR and TRG.

Figure 12:
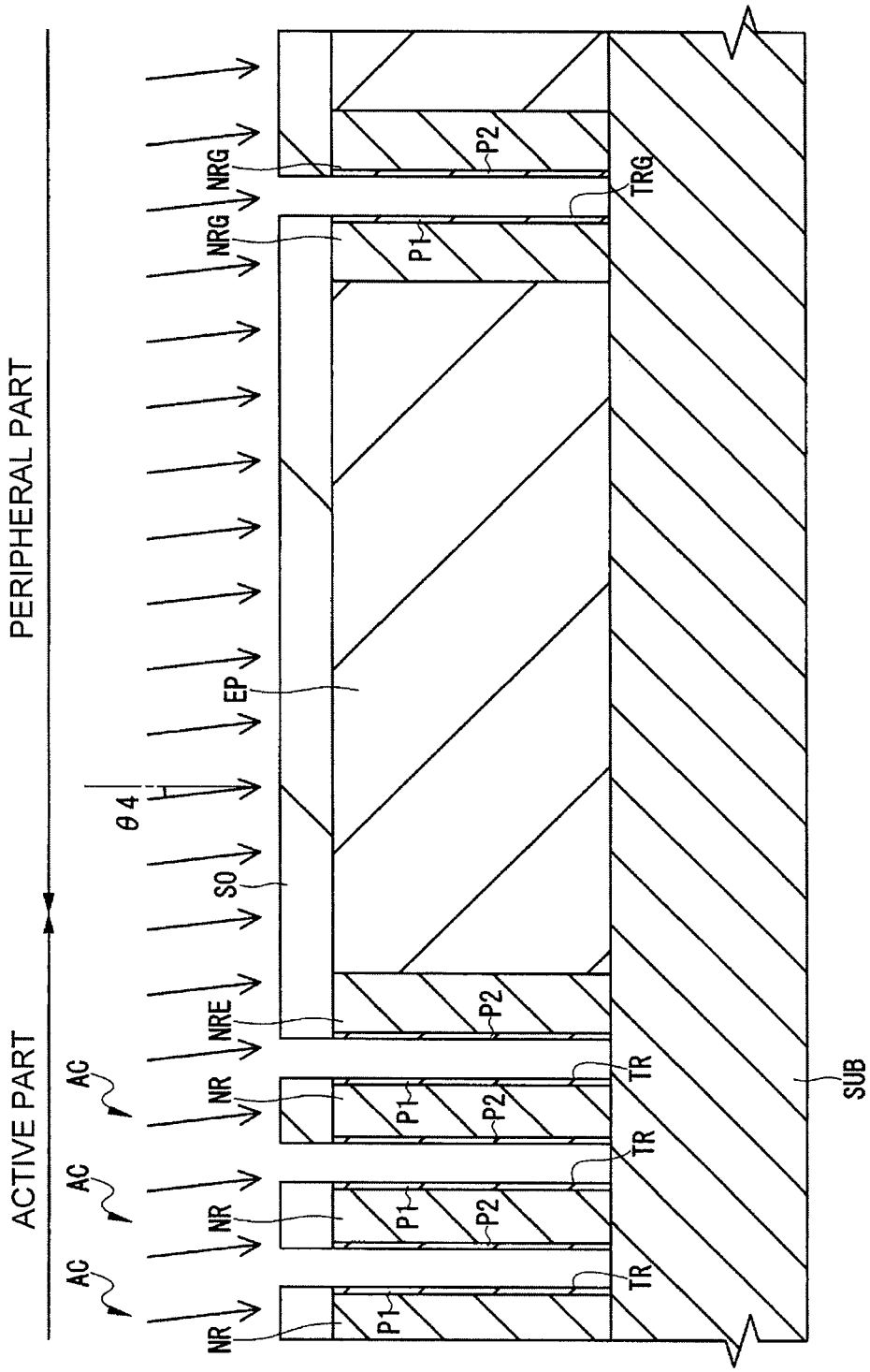
FIG. 12 is an essential part cross-sectional view of the same place as that in FIG. 4 during the manufacturing process of the semiconductor device, following FIG. 11.

Next, as shown in FIG. 12, a p-type impurity, for example, boron (B) is ion-implanted into the other side wall of each of the trenches TR and TRG with a prescribed angle $\theta 4$ relative to the normal line. Consequently, in the epitaxial layer EP lying on the other side wall side of each of the trenches TR and TRG, a p-type region P2 is formed. The prescribed angle $\theta 4$ is the same as the angles $\theta 1$, $\theta 2$ and $\theta 3$, and is desirably set to be an angle that does not allow boron (B) ions to reach the bottoms of the trenches TR and TRG.

Figure 13:
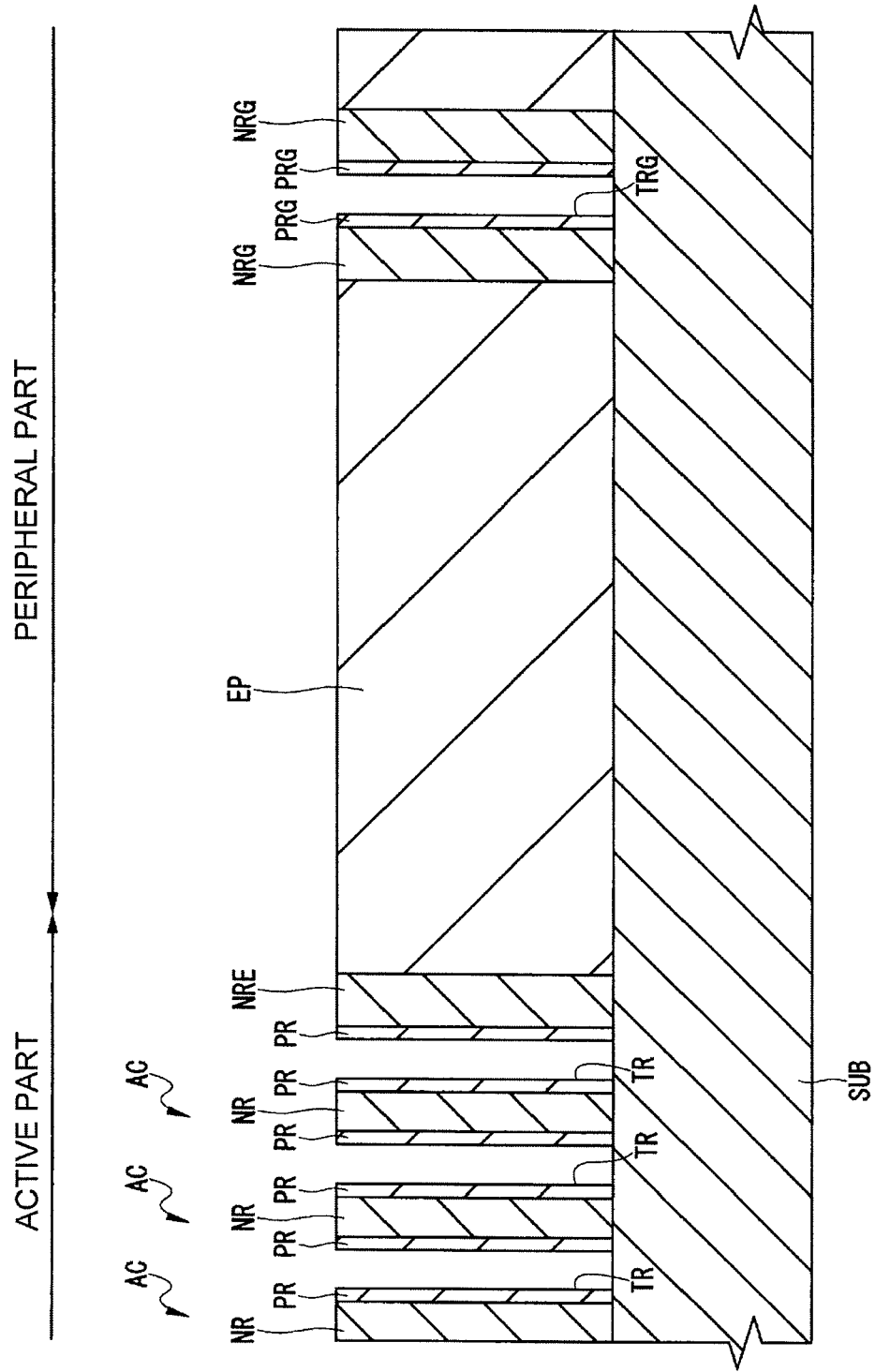
FIG. 13 is an essential part cross-sectional view of the same place as that in FIG. 4 during the manufacturing process of the semiconductor device, following FIG. 12.

Next, as shown in FIG. 13, after removing the oxidized film SO, for example, by a wet etching method, by providing a heat treatment, boron (B) ions ion-implanted into both side walls of the trenches TR and TRG are activated. Consequently, in the epitaxial layer EP on the both side wall sides of the trench TR, the p-type diffusion region PR is formed. Temperature and time of the heat treatment are set so that not the whole of the active region AC between the adjacent trenches TR in the active part becomes the p-type diffusion region PR, and the heat treatment temperature is, for example, 800° C. to 900° C. Accordingly, in the active region AC between the adjacent trenches TR in the active part, from the side wall of one trench TR toward the side wall of the other trench TR, the p-type diffusion region PR, the n-type diffusion region NR and the p-type diffusion region PR are formed.

Figure 14:
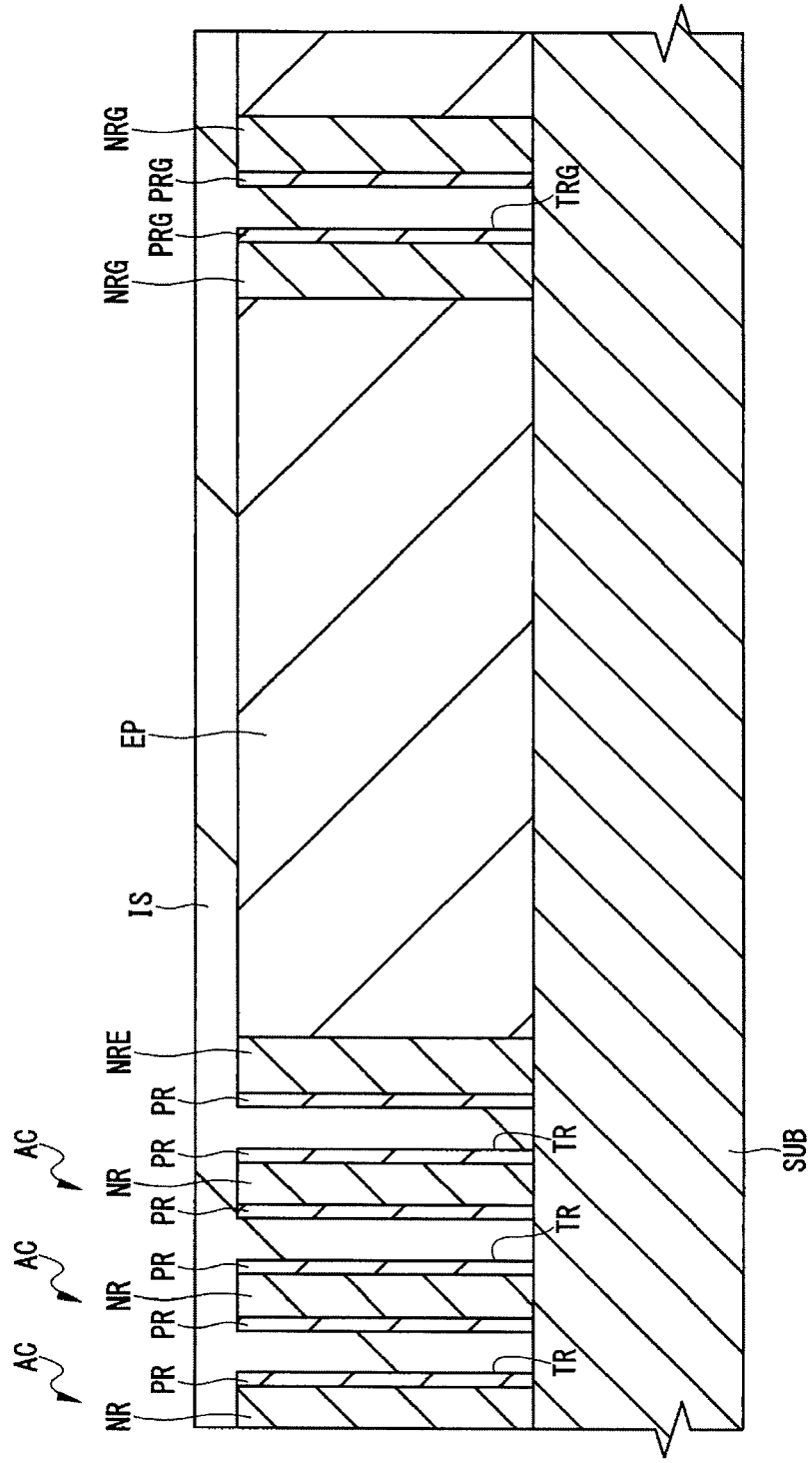
FIG. 14 is an essential part cross-sectional view of the same place as that in FIG. 4 during the manufacturing process of the semiconductor device, following FIG. 13.

Next, as shown in FIG. 14, on the upper face of the epitaxial layer EP, the insulating film IS, for example, a silicon oxide film is deposited by a CVD (Chemical Vapor Deposition) method.

On this occasion, the insulating film IS is embedded also inside the trenches TR and TRG, and, in the insulating film IS embedded inside the trenches TR and TRG, "a cavity (or also called a vacancy)" may be formed. Meanwhile, in this case, the vacancy exists also in the final structure shown in FIG. 3. The existence of the vacancy can improve insulating properties as compared with the case where only the insulating film IS is embedded. That is, the breakdown voltage of the power MOSFET can be improved.

Figure 15:
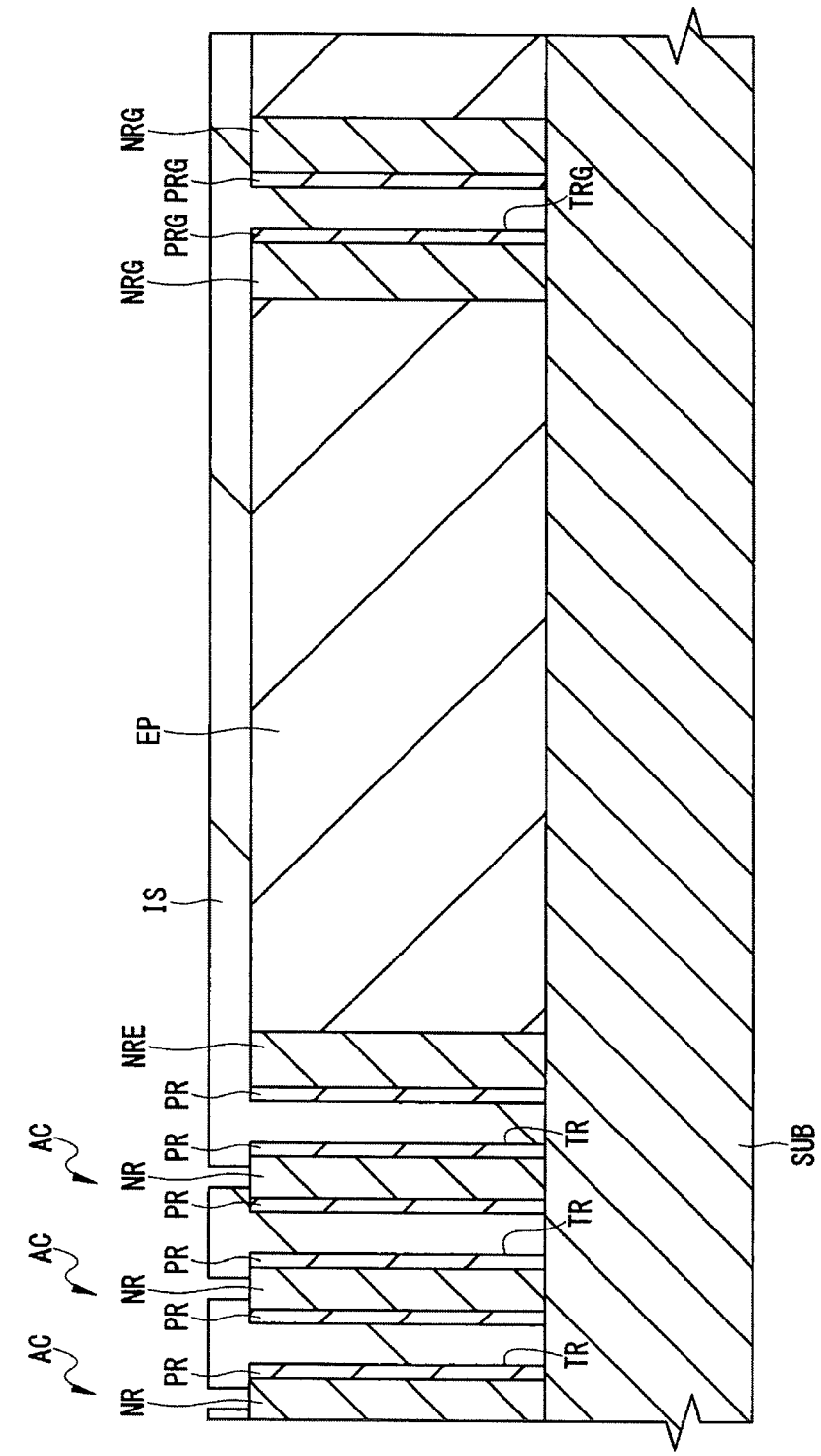
FIG. 15 is an essential part cross-sectional view of the same place as that in FIG. 4 during the manufacturing process of the semiconductor device, following FIG. 14.

Next, as shown in FIG. 15, using a photoresist film patterned by a photolithographic technology as a mask, the insulating film IS in the region in which a gate electrode is to be formed in a later process is removed by an anisotropic dry etching method.

Figure 16:
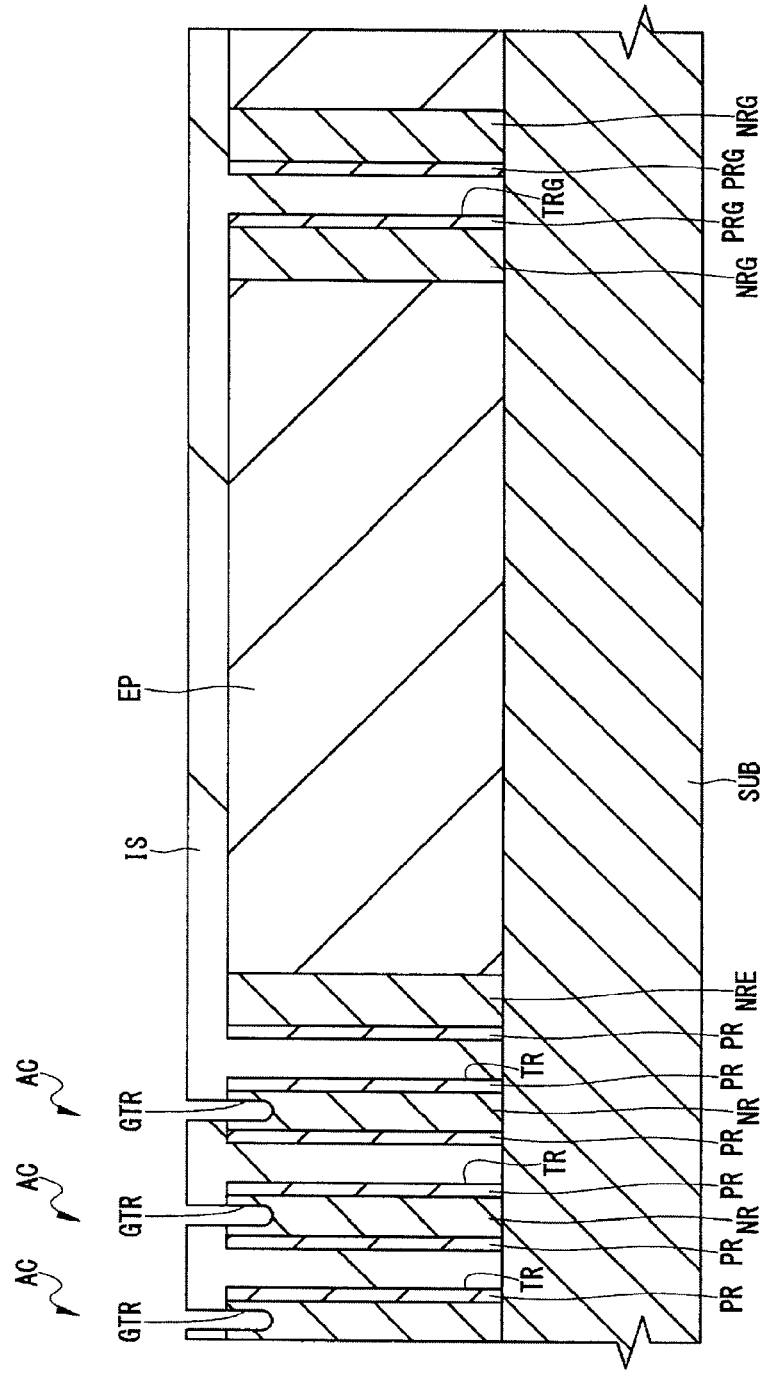
FIG. 16 is an essential part cross-sectional view of the same place as that in FIG. 4 during the manufacturing process of the semiconductor device, following FIG. 15.

Next, as shown in FIG. 16, by removing the epitaxial layer EP by an anisotropic dry etching method using the insulating film IS as a mask, a trench GTR for a gate is formed in the n-type diffusion region NR formed in the respective active regions AC in the epitaxial layer EP in the active part.

Figure 17:
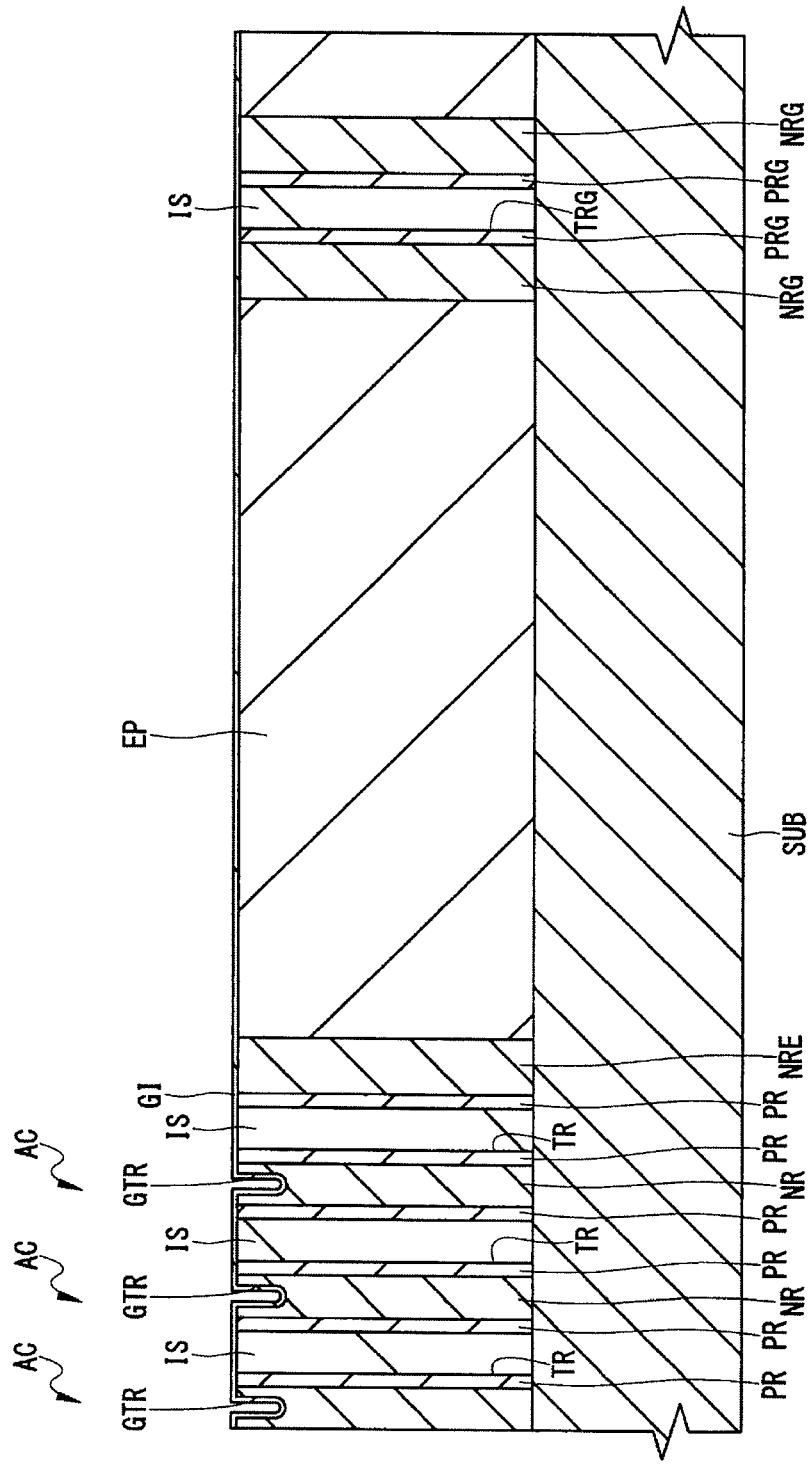
FIG. 17 is an essential part cross-sectional view of the same place as that in FIG. 4 during the manufacturing process of the semiconductor device, following FIG. 16.

Next, as shown in FIG. 17, by a wet etching method, a dry etching method, a CMP (Chemical Mechanical Polishing) method or the like, the insulating film IS on the upper face of the epitaxial layer EP is removed to expose the upper face of the epitaxial layer EP. On this occasion, the insulating film IS embedded inside the trench TR defining the active region AC and the trench TRG is not removed.

Subsequently, on the upper face of the epitaxial layer EP including the inside wall (the side wall and the bottom face) of the trench GTR for a gate, the gate insulating film GI of the power MOSFET composed of an oxidized film is formed.

Figure 18:
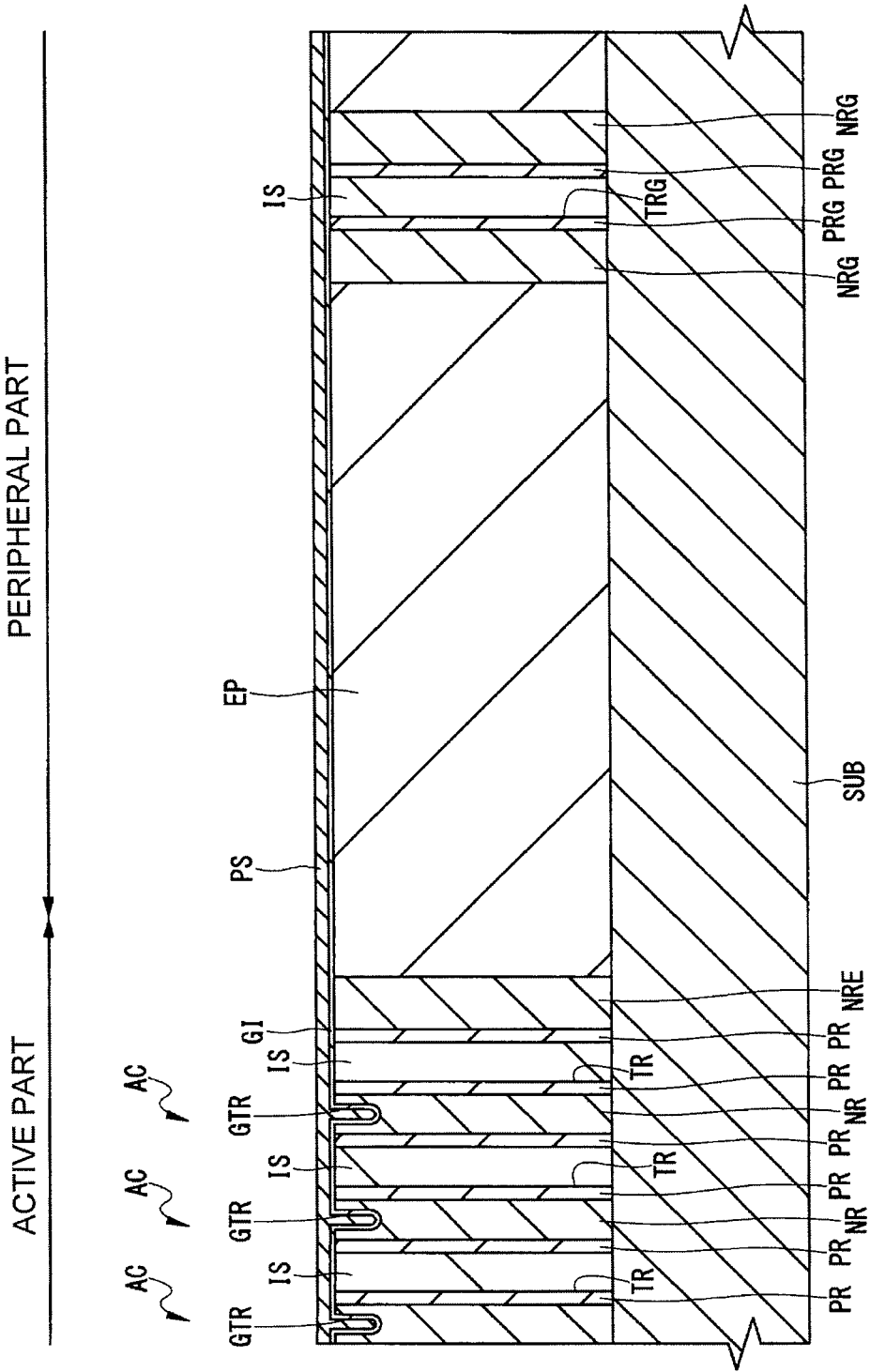
FIG. 18 is an essential part cross-sectional view of the same place as that in FIG. 4 during the manufacturing process of the semiconductor device, following FIG. 17.

Next, as shown in FIG. 18, over the upper face of the epitaxial layer EP, a polycrystalline silicon film PS doped with an n-type impurity, for example, phosphorous (P) is deposited. On this occasion, the polycrystalline silicon film PS is embedded also inside the trench GTR for a gate.

Figure 19:
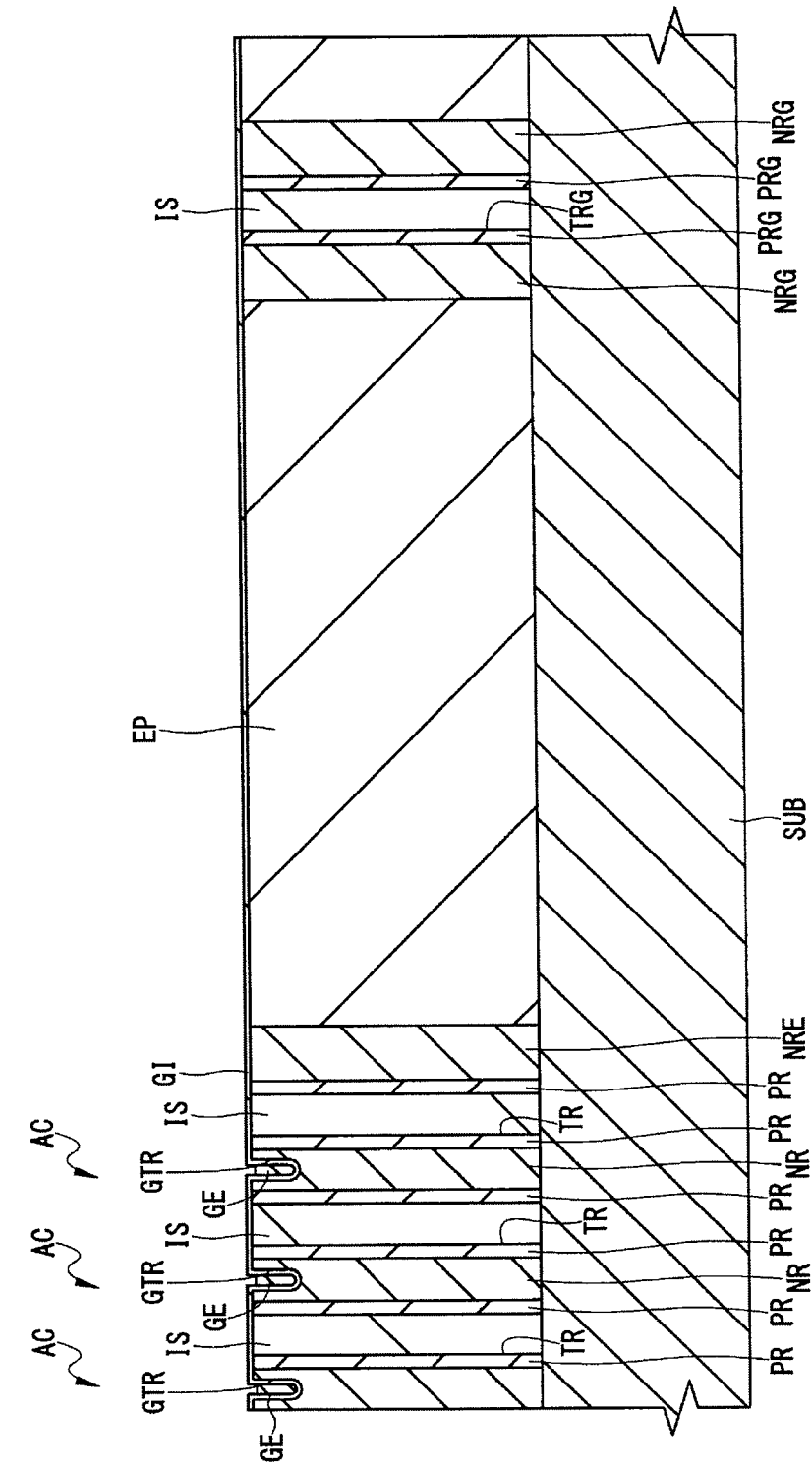
FIG. 19 is an essential part cross-sectional view of the same place as that in FIG. 4 during the manufacturing process of the semiconductor device, following FIG. 18.

Next, as shown in FIG. 19, by etching the polycrystalline silicon film PS other than that in the trench GTR for a gate to leave the polycrystalline silicon film PS only inside the trench GTR for a gate, the gate electrode GE of the power MOSFET is formed.

Figure 20:
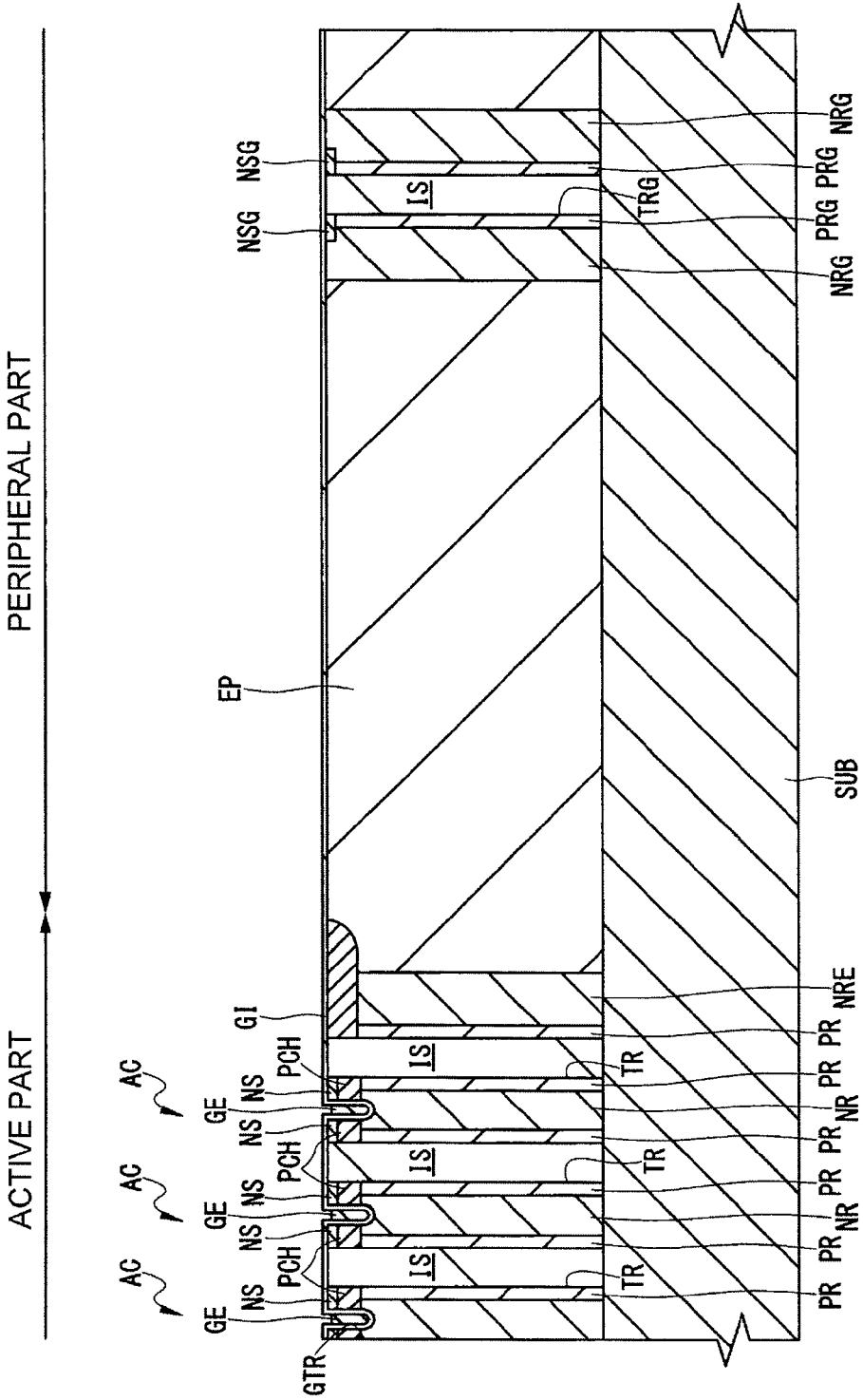
FIG. 20 is an essential part cross-sectional view of the same place as that in FIG. 4 during the manufacturing process of the semiconductor device, following FIG. 19.

Next, as shown in FIG. 20, using a photoresist film patterned by a photolithographic technology as a mask, p-type impurity, for example, boron (B) is ion-implanted into the epitaxial layer EP in the active part. Subsequently, by providing a heat treatment, the p-type impurity is diffused to form the p-type diffusion region PCH. The p-type diffusion region PCH works as the channel region of the power MOSFET. The p-type diffusion region PCH is formed so that the depth of the p-type diffusion region PCH from the upper face of the epitaxial layer EP is shallower than the depth of the trench GTR for a gate from the upper face of the epitaxial layer EP.

Next, using a photoresist film patterned by a photolithographic technology as a mask, an n-type impurity, for example, arsenic (As) is ion-implanted into the epitaxial layer EP in the active part and in the outer peripheral part. Subsequently, by providing a heat treatment, the n-type impurity is diffused to form the n-type diffusion region NS in the active part and the n-type diffusion region NSG in the outer peripheral part. The n-type diffusion region NS formed in the active part works as the source region of the power MOSFET. The n-type diffusion region NS is formed so that the depth of the n-type diffusion region NS from the upper face of the epitaxial layer EP is shallower than the depth of the p-type diffusion region PCH from the upper face of the epitaxial layer EP.

Figure 21:
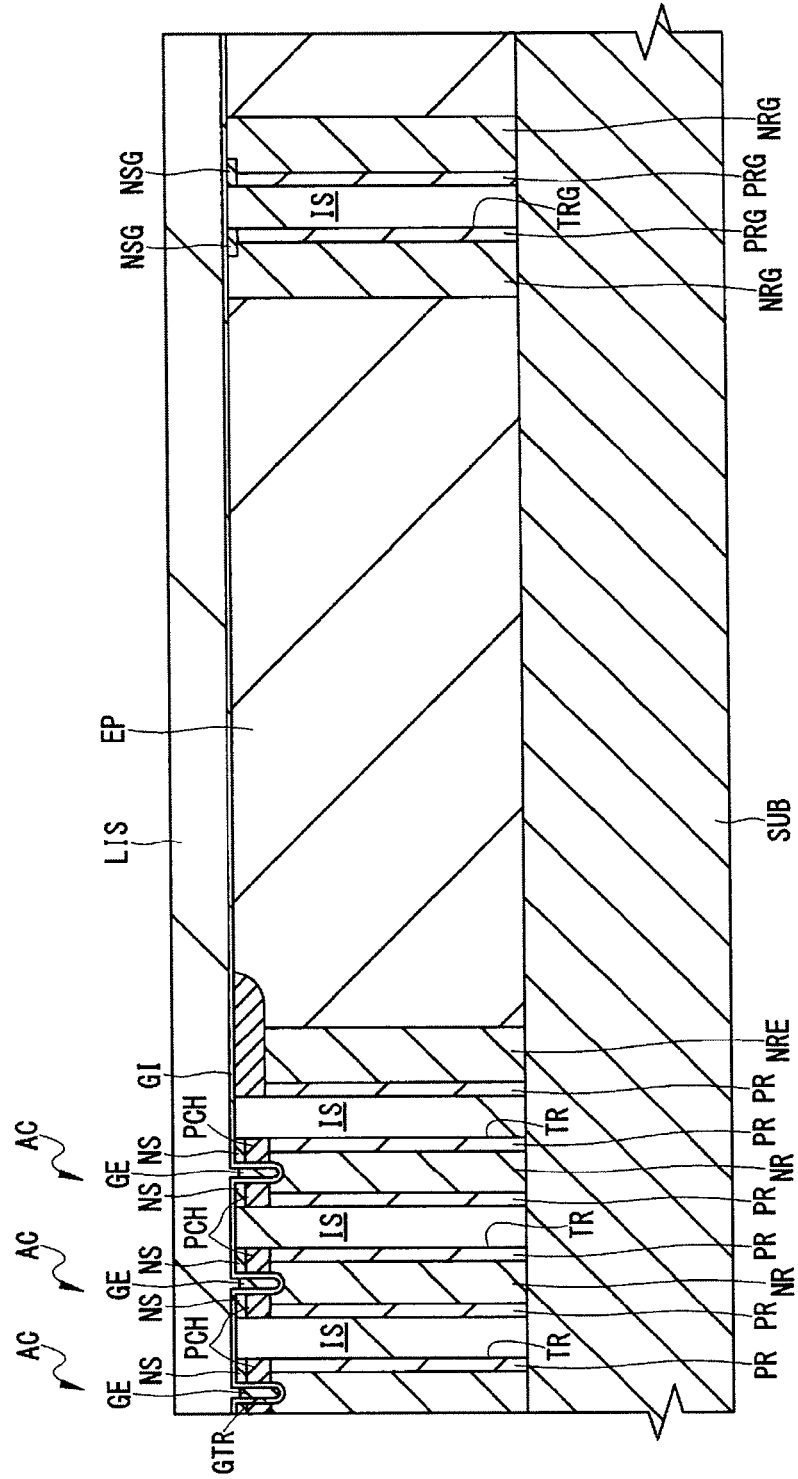
FIG. 21 is an essential part cross-sectional view of the same place as that in FIG. 4 during the manufacturing process of the semiconductor device, following FIG. 20.

Next, as shown in FIG. 21, over the upper face of the epitaxial layer EP, the interlayer insulating film LIS, for example, a silicon oxide film is deposited by a CVD method.

Figure 22:
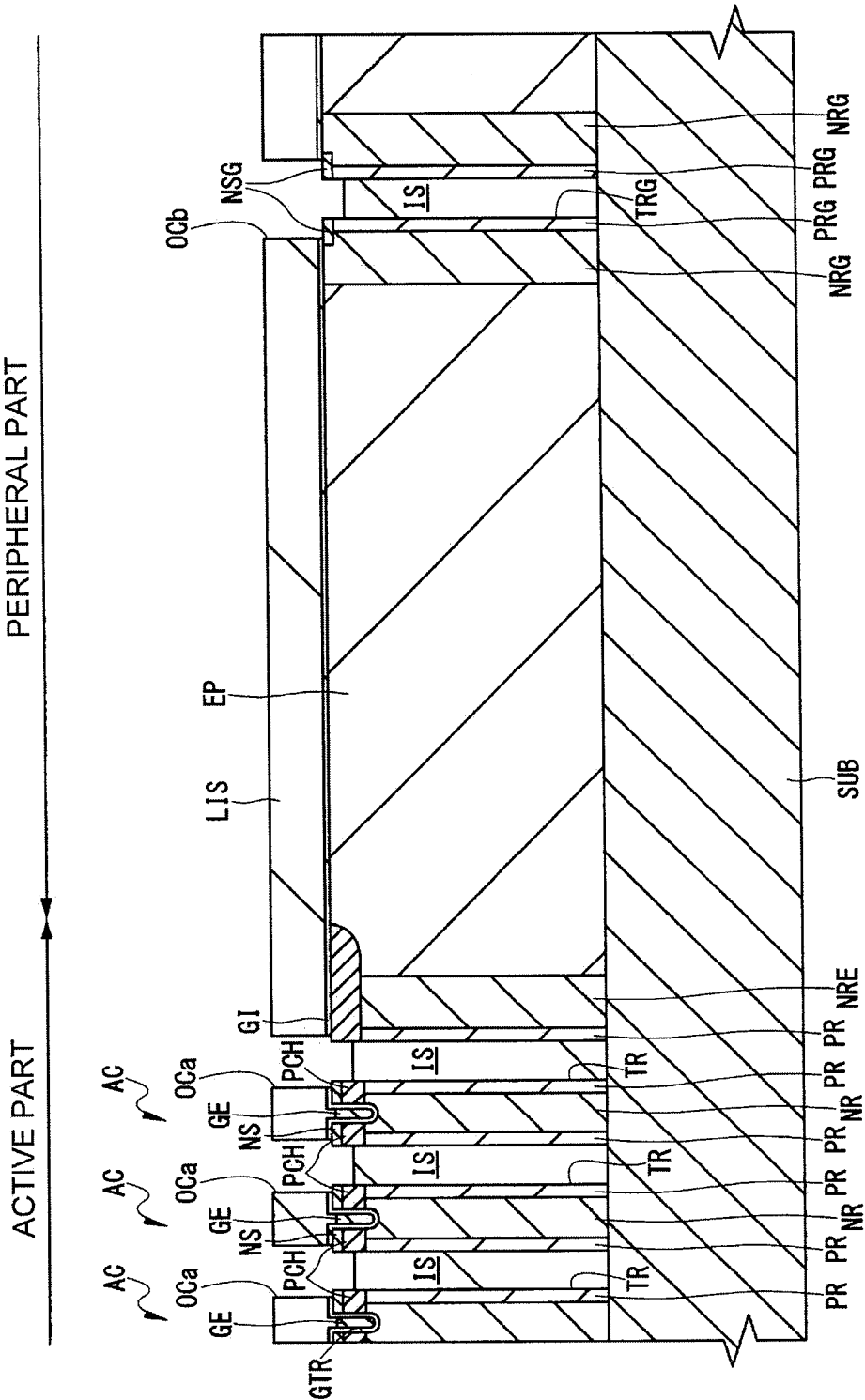
FIG. 22 is an essential part cross-sectional view of the same place as that in FIG. 4 during the manufacturing process of the semiconductor device, following FIG. 21.

Next, as shown in FIG. 22, using a photoresist film patterned by a photolithographic technology as a mask, in the interlayer insulating film LIS lying above the trenches TR and TRG, the opening parts OCa and OCb are formed, respectively. Furthermore, the gate insulating film GI and a part of the insulating film IS embedded in the trench TR lying below the opening part OCa are removed to expose the n-type diffusion region NS (the source region of the power MOSFET) and the p-type diffusion region PCH (the channel region of the power MOSFET) in the active part at the side wall of the trench TR. At the same time, the gate insulating film GI and a part of the insulating film IS embedded in the trench TRG lying below the opening part OCb are removed to expose the n-type diffusion region NSG and the p-type diffusion region PRG in the outer peripheral part at the side wall of the trench TRG.

Here, the upper face of the insulating film IS embedded in the trench TR lies deeper than the depth of the n-type diffusion region NS (the source region of the power MOSFET) from the upper face of the epitaxial layer EP, and lies shallower than the depth of the p-type diffusion region PCH (the channel region of the power MOSFET) from the upper face of the epitaxial layer EP.

Further, although not shown in the drawing, a contact hole (the contact hole CNT shown in FIG. 2 described above) that connects the gate electrode GE to the gate wiring is also formed.

Figure 23:
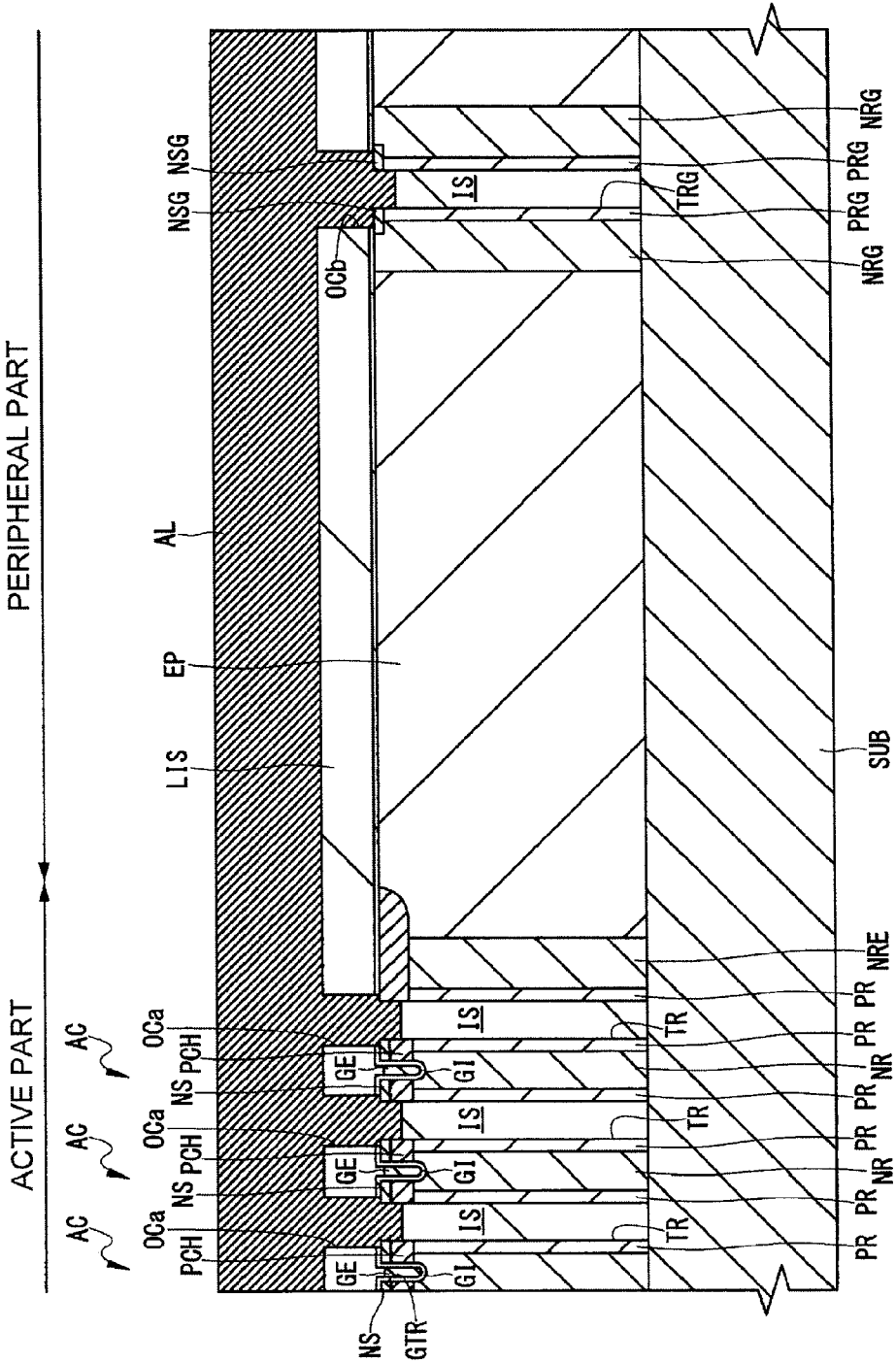
FIG. 23 is an essential part cross-sectional view of the same place as that in FIG. 4 during the manufacturing process of the semiconductor device, following FIG. 22.

Next, as shown in FIG. 23, over the interlayer insulating film LIS including the inside of the opening parts OCa and OCb and the inside of the contact hole (the contact hole CNT shown in FIG. 2 described above), an aluminum (Al) film AL is deposited, for example, by a sputtering method.

Figure 24:
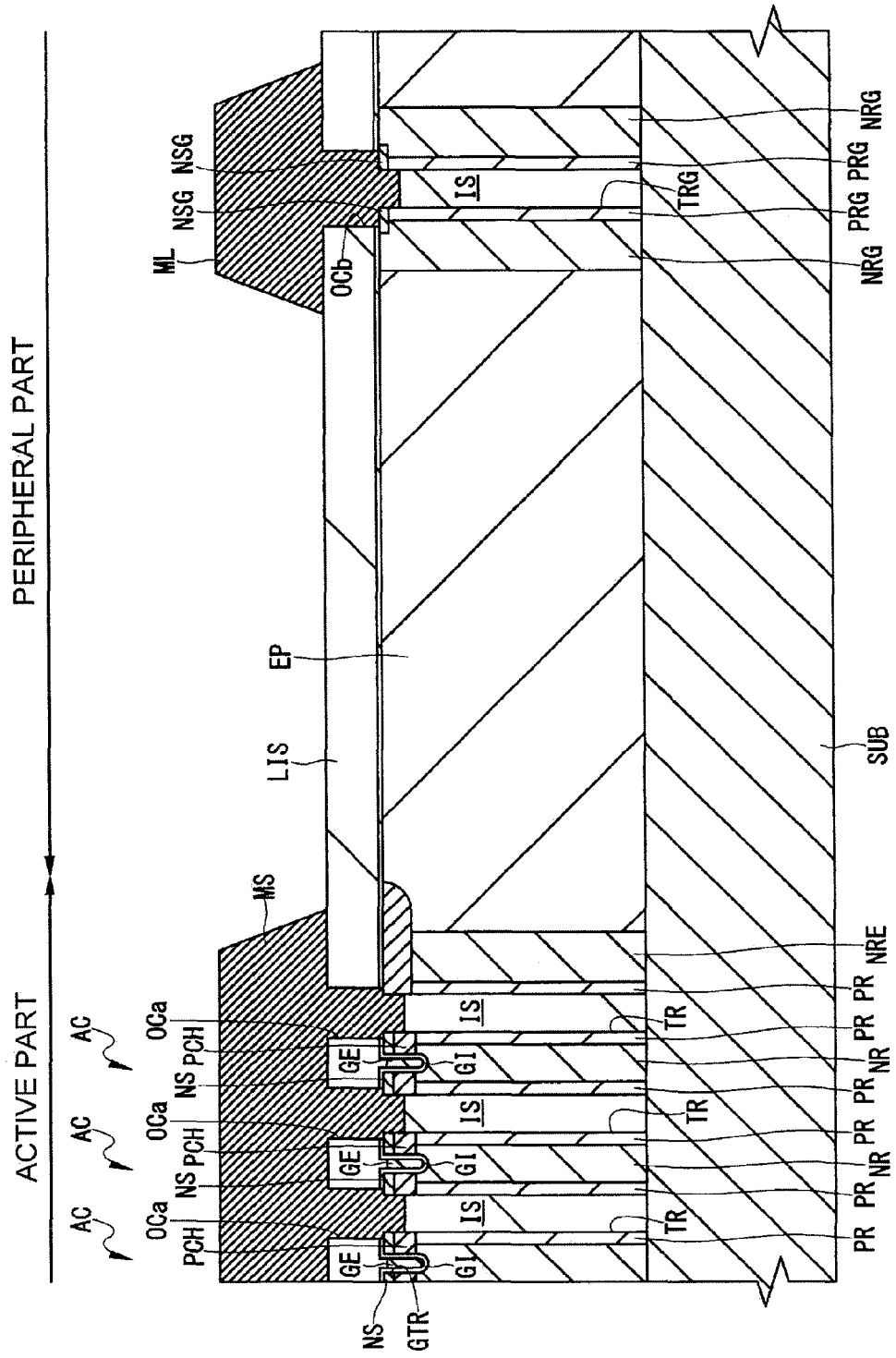
FIG. 24 is an essential part cross-sectional view of the same place as that in FIG. 4 during the manufacturing process of the semiconductor device, following FIG. 23.

Next, as shown in FIG. 24, using a photoresist film patterned by a photolithographic technology as a mask, the aluminum (Al) film AL is etched. Consequently, in the active part, the source wiring MS connected electrically with the n-type diffusion region NS (the source region of the power MOSFET) and the p-type diffusion region PCH (the channel region of the power MOSFET), and a gate wiring (the gate wiring MG shown in FIG. 1 and FIG. 2 described above) connected electrically with the gate electrode GE are formed. Further, in the outer peripheral part, the guard ring wiring ML connected electrically with the substrate SUB via the n-type diffusion region NSG and the n-type diffusion region NRG is formed.

Next, although illustration is omitted, so as to cover the source wiring MS, the gate wiring (the gate wiring MG shown in FIG. 1 and FIG. 2 described above) and the guard ring wiring ML, a polyimide film is deposited over the upper face of the epitaxial layer EP as a surface protection film. Subsequently, in the polyimide film, opening parts that reach each of the source wirings MS, the gate wiring (the gate wiring MG shown in FIG. 1 and FIG. 2 described above) and the guard ring wiring ML are formed.

Next, the rear surface (the surface opposite to the main surface) of the substrate SUB is polished to give a prescribed thickness to the substrate SUB, and, after that, over the rear surface of the substrate SUB, a contact wiring (the contact wiring. MD shown in FIG. 3 described above) made of a metal film is formed. After that, the substrate SUB is diced along a division region (or also called a dicing line), as shown in FIG. 1 described above, into individual semiconductor chips SC.

<<Mechanism and Effect>>

Figure 25:
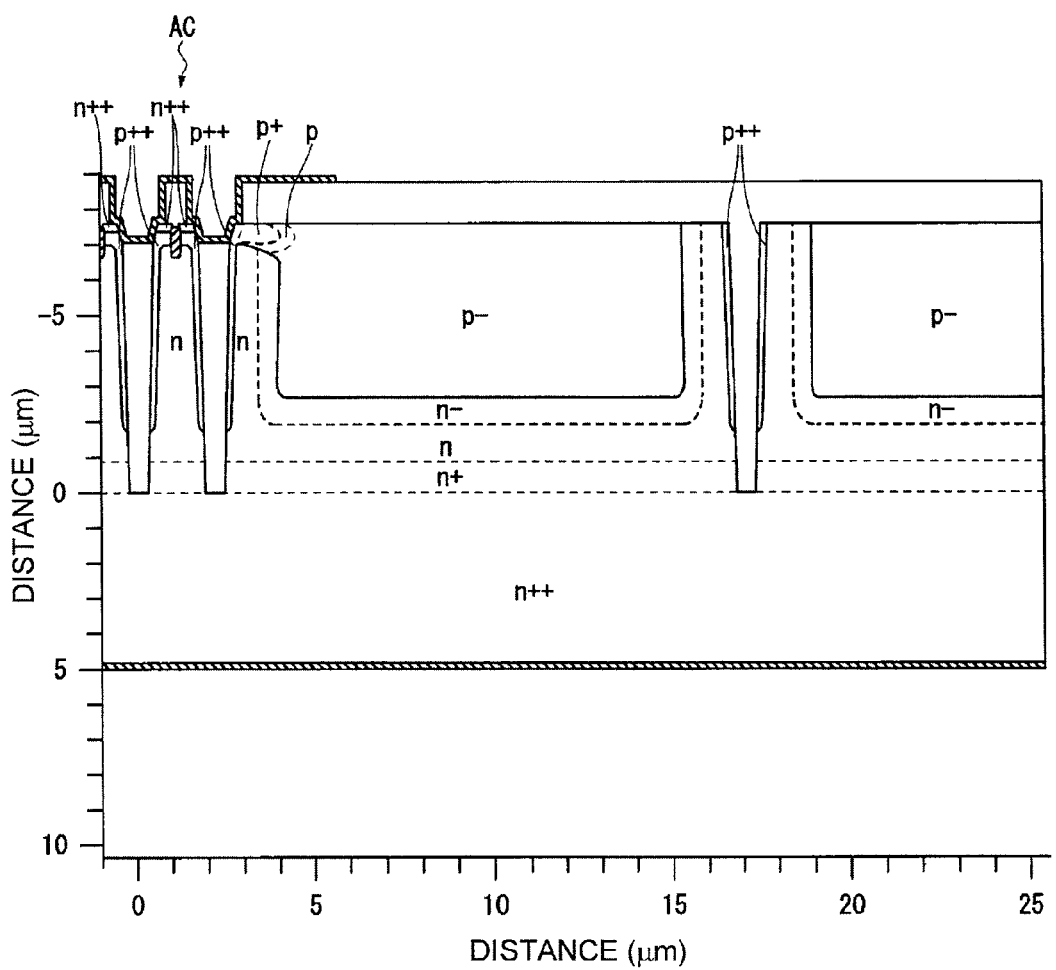
FIG. 25 is a drawing showing an impurity concentration distribution in the power MOSFET according to the first embodiment.

FIG. 25 is a drawing showing an impurity concentration distribution in the power MOSFET according to the first embodiment. In the drawing, n−, n, n+ and n++ in this order show regions in which the n-type impurity concentration becomes higher, and, similarly, p−, p, p+ and p++ in this order show regions in which the p-type impurity concentration becomes higher.

The active region in the active part is an n-type region of a comparatively high concentration. In contrast, the region between a trench lying in the edge part of the active part and a trench lying in the outer peripheral part, and the periphery part of the semiconductor chip are p-type regions of a low concentration. Further, the active part is of a super junction structure in which a column of an n-type region of a high concentration and a column of a p++ type region are placed side by side alternately.

For example, when performing explanation using the structure of the power MOSFET shown in FIG. 3 described above, by adjusting the impurity concentration in the epitaxial layer EP to around $1E15$ cm$^{-3}$, the impurity concentration in the n-type diffusion region NR to around $5E16$ cm$^{-3}$, and the impurity concentration in the p-type diffusion region PR to around $1E17$ cm$^{-3}$, a drain breakdown voltage of 100 V can be obtained. Meanwhile, as to the impurity concentrations in the n-type diffusion region NR and the p-type diffusion region PR in the active region AC, respective optimum values vary depending on the pitch of the super junction structure, the width of the n-type diffusion region NR and the width of the p-type diffusion region PR.

The impurity concentration in, and the thickness of the epitaxial layer EP are set so that the breakdown voltage of a p-n junction formed between the layer and the substrate SUB becomes higher than the breakdown voltage of a p-n junction formed between the n-type diffusion region NR and the p-type diffusion region PR in the active region AC. In the case of a power MOSFET with a higher drain breakdown voltage, it is necessary, as to the epitaxial layer EP, to set the impurity concentration to be lower and the thickness to be thicker.

Figure 26:
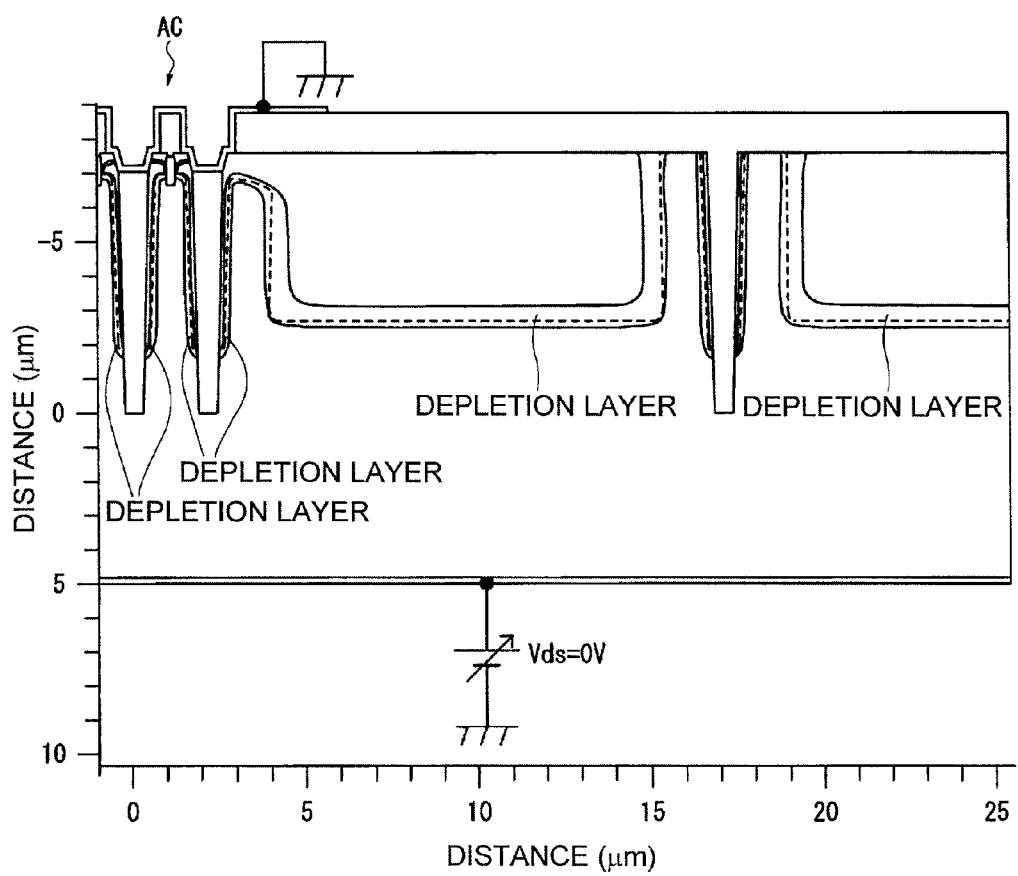
FIG. 26 is a drawing showing respective distributions of an internal electric field strength and a depletion layer of the power MOSFET when a drain voltage is 0 V, according to the first embodiment.
Figure 27:
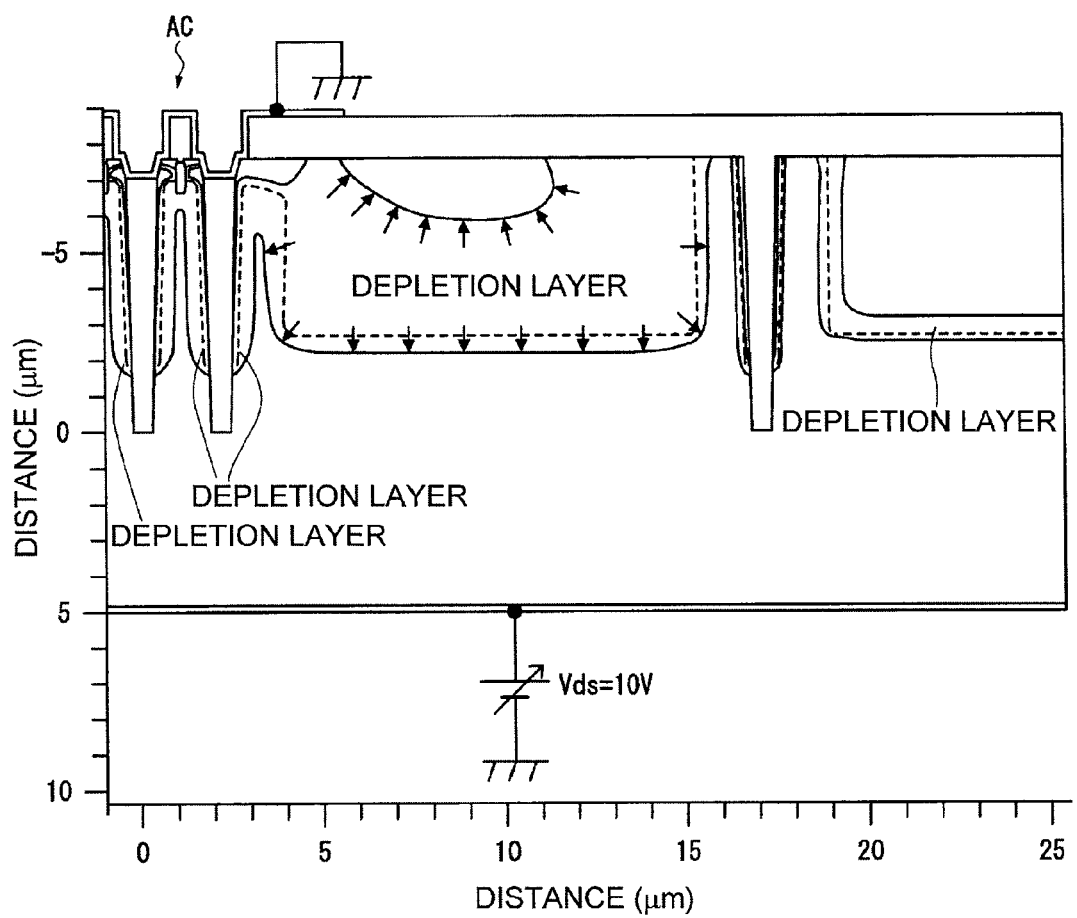
FIG. 27 is a drawing showing respective distributions of an internal electric field strength and a depletion layer of the power MOSFET when a drain voltage is 10 V, according to the first embodiment.
Figure 28:
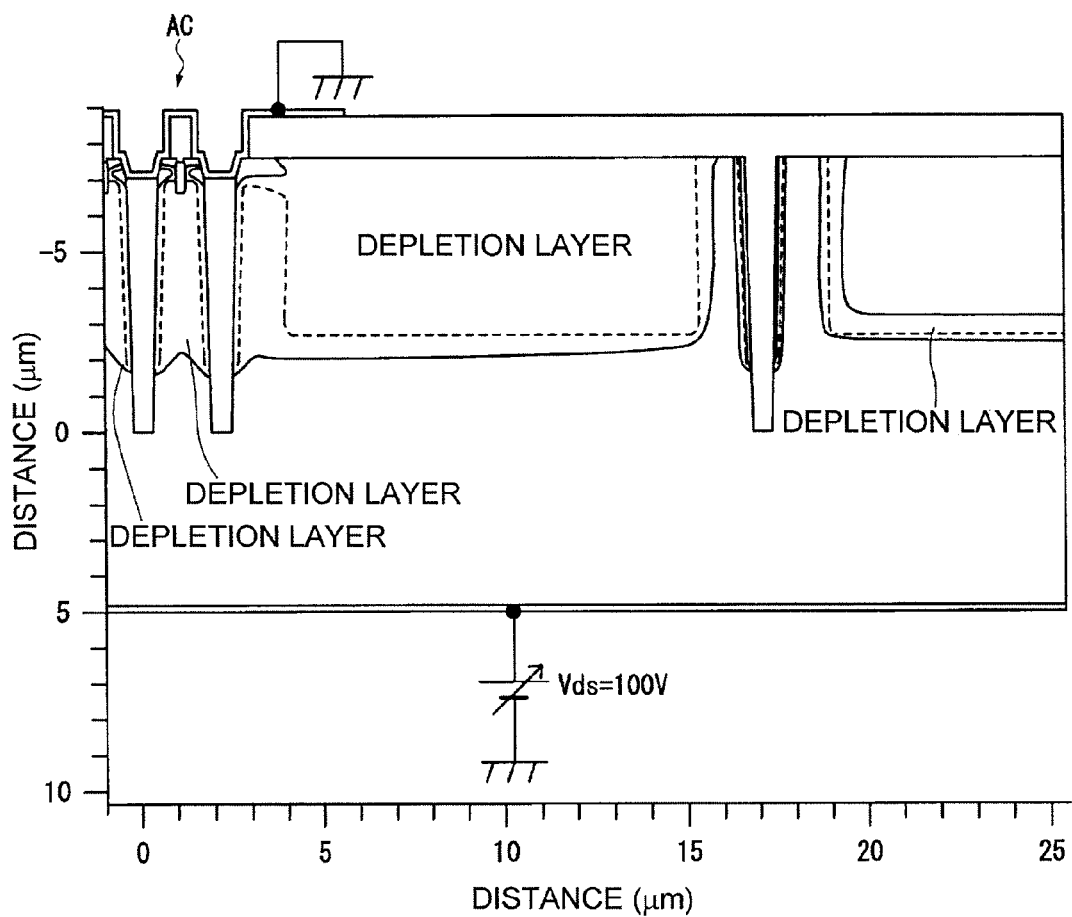
FIG. 28 is a drawing showing respective distributions of an internal electric field strength and a depletion layer of the power MOSFET when a drain voltage is 100 V, according to the first embodiment.

FIG. 26, FIG. 27 and FIG. 28 are drawings showing respective distributions of an internal electric field strength and a depletion layer of the power MOSFET according to the first embodiment when the drain voltage is 0 V, 10 V and 100 V, respectively.

As shown in FIG. 26, when the drain voltage is 0 V (Vds=0 V), there is no electric field other than that based on the built-in potential difference of the p-n junction.

As shown in FIG. 27, when the drain voltage is 10 V (Vds=10 V), in the active region AC in the active part, the depletion layer extends in the lateral direction, but, since the impurity concentration is high, the width of the depletion layer is narrow and a comparatively strong electric field is generated in the depletion layer. On the other hand, in the outer peripheral part, since the impurity concentration in the p-type region lying between the trench lying in the edge part of the active part and the trench lying in the outer peripheral part is low, the depletion layer extends largely onto the p-type region side. Accordingly, the electric field strength in the depletion layer in the outer peripheral part (a part between the trench lying in the edge part of the active part and the trench lying in the outer peripheral part) is lower than the electric field strength in the depletion layer in the active part (the active region AC).

As shown in FIG. 28, when the drain voltage is 100 V (Vds=100 V), an avalanche breakdown is generated between the drain-source and the depletion layer reaches the upper face of the epitaxial layer in both the active region AC in the active part and the outer peripheral part. However, even in such state, the electric field strength is the highest at the p-n junction in the active region AC in the active part, and the electric field strength in the outer peripheral part is weak. That is, it is known that the outer peripheral part has resistance properties higher than those of the active region AC in the active part.

The breakdown voltage of the active region AC in the active part is determined by the respective impurity concentrations of the n-type region (the n-type diffusion region NR) and the (p++)-type region (the p type diffusion region PR) formed in the side wall of the trench by ion implantation, and, therefore, it can be set independently of the impurity concentration in the p-type region (the epitaxial layer EP) in the outer peripheral part. Since it is possible to set each of the pitch of the super junction structure, the impurity concentration in the n-type region (the n-type diffusion region NR), and the impurity concentration in the p++ region (the p-type diffusion region PR) to be the optimum value without the effect of structural design of the outer peripheral part, a high performance power MOSFET cab be realized easily.

Further, the breakdown voltage of the outer peripheral part is determined only by the impurity concentration in, and the thickness of the p-type region (the epitaxial layer EP) in the outer peripheral part, and is not affected by the pitch of the super junction structure, the trench depth, the impurity concentration in the n-type region (the n-type diffusion region NR) and the impurity concentration in the p-type region (the p-type diffusion region PR).

As described above, according to the first embodiment, a high breakdown voltage can be obtained even in the edge part of the active part without adding a complex manufacturing process, and, therefore, a semiconductor device having a power MOSFET of a super junction structure satisfying both a low conduction resistance and a high junction breakdown voltage can be realized by a simple and easy manufacturing method.

<<Modification of First Embodiment>>

Figure 29:
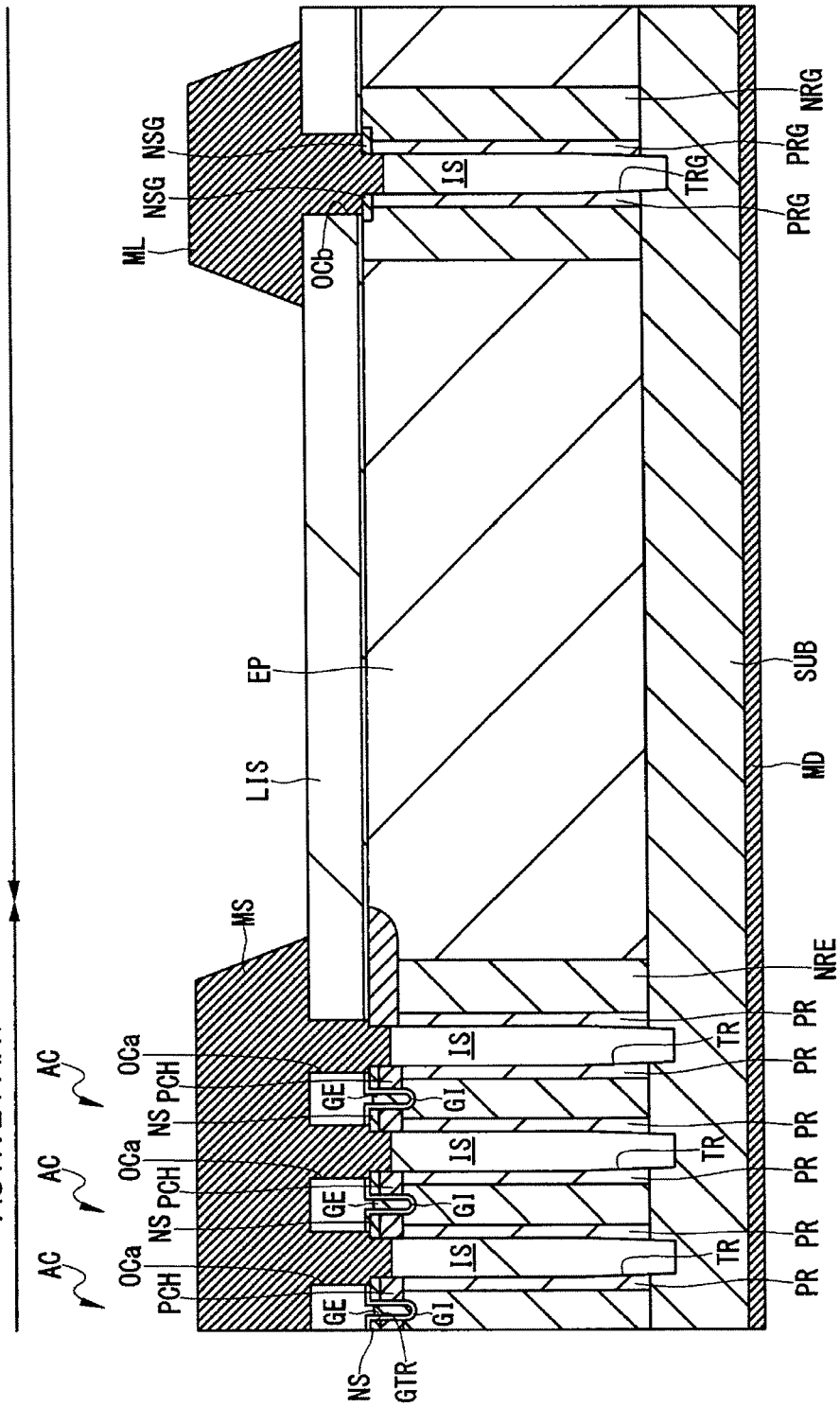
FIG. 29 is an essential part cross-sectional view showing a part of the active part and a part of the outer peripheral part of a semiconductor chip forming a power MOSFET of a super junction structure according to a modification of the first embodiment.

A power MOSFET of a super junction structure according to a modification of the first embodiment will be explained using FIG. 29. FIG. 29 is an essential part cross-sectional view showing a part of the active part and a part of the outer peripheral part of a semiconductor chip forming a power MOSFET of a super junction structure.

In the power MOSFET of a super junction structure according to the first embodiment shown in FIG. 3 described above, the bottom part of the trench TR reaches the substrate SUB, but, caused by variation during the manufacturing process, the bottom part of the trench TR may not reach the substrate SUB. In this case, there is a risk of lowering of the breakdown voltage.

For example, in the case where the width of the trench TR is sufficiently wide, when ion-implanting a p-type impurity into the side wall of the trench TR in the active part (ion-implantation processes of a p-type impurity explained in FIG. 11 and FIG. 12 described above), if the p-type impurity is ion-implanted into the bottom part of the trench TR, in this part, there is formed a p-type layer of a concentration higher than that in the p-type diffusion region PR of the side wall in the trench TR. When the interval between the p-type layer of a high concentration and the n-type substrate SUB of a high concentration is small, the breakdown voltage in this part becomes the lowest in the active part and the breakdown voltage of the power MOSFET may be lower than an intended breakdown voltage.

Accordingly, in the formation of the trench TR, the substrate SUB is dug halfway to make the bottom part of the trench TR lie inside the substrate SUB. Consequently, even when a p-type impurity is ion-implanted into the bottom part of the trench TR, the p-type impurity is canceled by the n-type impurity in the substrate SUB of a higher concentration, and, therefore, the formation of a junction between the p-type layer of a high concentration and the n-type substrate SUB of a high concentration can be avoided.

Second Embodiment

The power MOSFET of a super junction structure according to a second embodiment is different in the position in which the source region is connected with the source wiring from the power MOSFET of a super junction structure according to the first embodiment. That is, in the power MOSFET according to the first embodiment, the source region is connected with the source wiring at the side wall of the trench formed in the epitaxial layer, but, in the power MOSFET according to the second embodiment, the source region is connected with the source wiring at the upper face of the epitaxial layer.

<<Semiconductor Device>>

Figure 30:
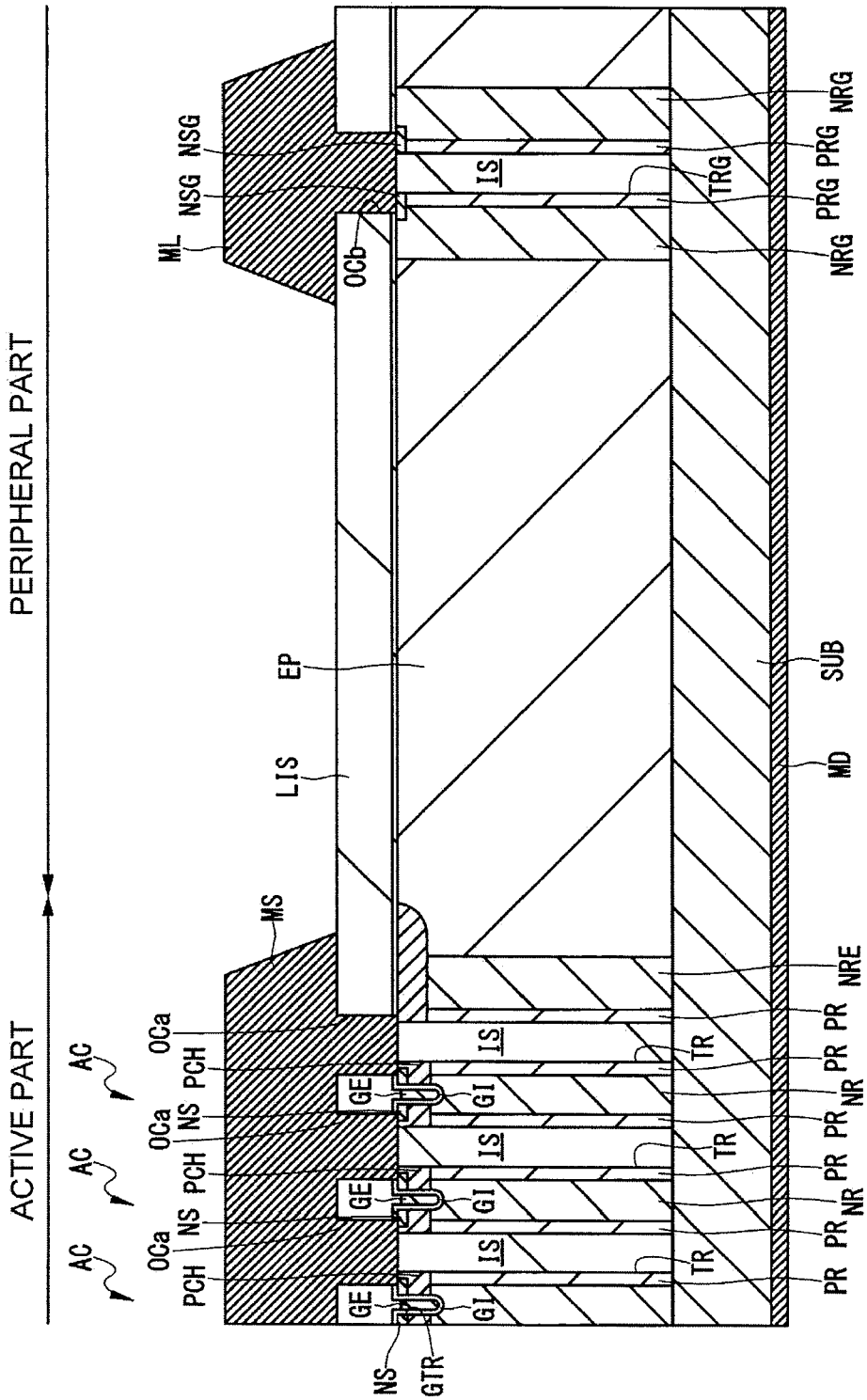
FIG. 30 is an essential part cross-sectional view showing a part of the active part and a part of the outer peripheral part of a semiconductor chip forming a power MOSFET of a super junction structure according to a second embodiment.
Figure 31:
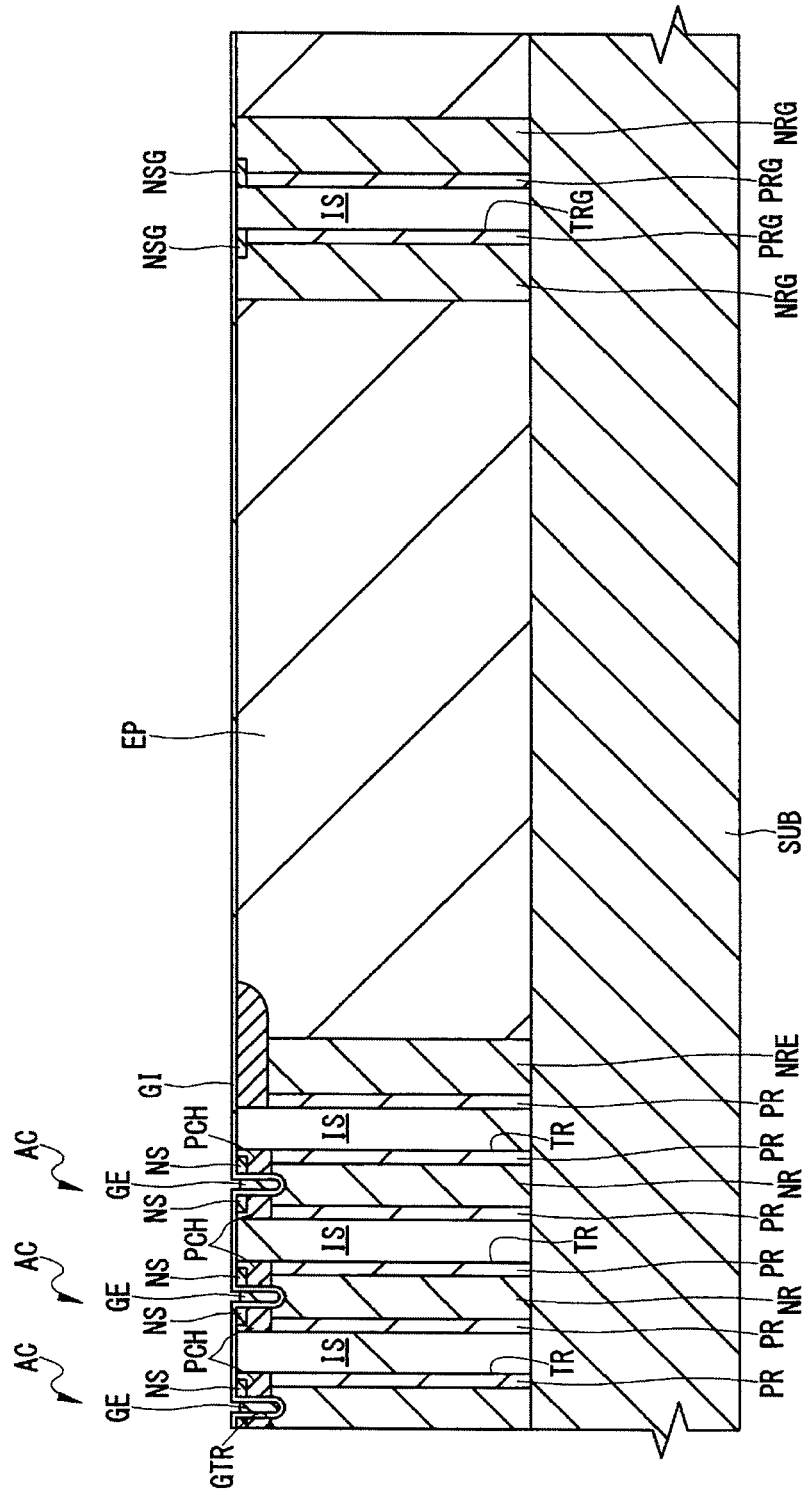
FIG. 31 is an essential part cross-sectional view showing, in an enlarged manner, a part of the active part and a part of the outer peripheral part of the semiconductor chip in a manufacturing process of a semiconductor device including the power MOSFET of a super junction structure according to the second embodiment.

The structure of the power MOSFET of a super junction structure according to the second embodiment will be explained using FIG. 30. FIG. 30 is an essential part cross-sectional view showing a part of the active part and a part of the outer peripheral part of the semiconductor chip forming the power MOSFET of a super junction structure.

As to the power MOSFET according to the second embodiment, the constitution of the source region, and the connection part of the source region and the source wiring are explained, but, since the other constitution and the like are the same as those of the power MOSFET according to the first embodiment, the explanation here is omitted.

As shown in FIG. 30, in the epitaxial layer EP, the plurality of trenches TR is formed along the first direction (the x-direction in FIG. 1 described above) and the insulating film IS embedded inside the trench TR defines the plurality of active regions AC. The upper face of the insulating film IS embedded in the trench TR lies shallower than the depth of the n-type diffusion region NS (the source region of the power MOSFET) from the upper face of the epitaxial layer EP to be described later.

On the upper face side of the epitaxial layer EP, the p-type diffusion region PCH having the fifth depth from the upper face of the epitaxial layer EP and the n-type diffusion region NS having the fourth depth from the upper face of the epitaxial layer EP are formed. The p-type diffusion region PCH functions as the channel region of the power MOSFET, and the n-type diffusion region NS functions as the source region of the power MOSFET. The fifth depth of the p-type diffusion region PCH is deeper than the fourth depth of the n-type diffusion region NS, and the p-type diffusion region PCH is connected with the p-type diffusion region PR.

Furthermore, on the upper face side of the epitaxial layer EP, on the epitaxial layer EP between adjacent trenches TR in top view, the gate electrode GE is formed along the first direction (the x-direction in FIG. 1 described above). The gate electrode GE is formed in the trench GTR for a gate formed in the epitaxial layer EP via the gate insulating film GI.

In the epitaxial layer EP on both sides of the trench GTR for a gate in which the gate electrode GE is formed, there lie the n-type diffusion region NS constituting the source region and the p-type diffusion region PCH constituting the channel region. The n-type diffusion region NS is formed in contact with the trench GTR for a gate, but is formed not in contact with the trench TR defining the active region AC. On the other hand, the p-type diffusion region PCH is formed in contact with the trench GTR for a gate and the trench TR. That is, in top view, on the upper face of the epitaxial layer EP, the n-type diffusion region NS is formed on both sides of the gate electrode GE, and, outside thereof, the p-type diffusion region PCH is formed.

In the interlayer insulating film LIS formed in the active part and the outer peripheral part of the semiconductor chip SC, the opening part OCa is formed. The gate insulating film GI lying below the opening part OCa formed in the active part is etched and a part of the n-type diffusion region NS and a part of the p-type diffusion region PCH are exposed at the upper face of the epitaxial layer EP.

In the state where the opening part OCa is formed, the source wiring MS connected to the n-type diffusion region NS and the p-type diffusion region PCH is formed over the interlayer insulating film LIS, and the source wiring MS is connected to a part of the n-type diffusion region NS and a part of the p-type diffusion region PCH at the upper face of the epitaxial layer EP.

<<Method of Manufacturing Semiconductor Device>>

The method of manufacturing the power MOSFET of a super junction structure according to the second embodiment will be explained in order of process using FIG. 31 to FIG. 35. FIG. 31 to FIG. 35 are essential part cross-sectional views showing, in an enlarged manner, a part of the active part and a part of the outer peripheral part of the semiconductor chip during the manufacturing process of the semiconductor device including the power MOSFET of a super junction structure. Meanwhile, the manufacturing steps until the formation of the gate electrode of the power MOSFET in the trench for a gate (FIG. 19 described above) are the same as those of the aforementioned first embodiment, and thus the explanation thereof is omitted.

Following FIG. 19 described above, as shown in FIG. 31, using a photoresist film patterned by a photolithographic technology as a mask, a p-type impurity, for example, boron (B) is ion-implanted into the epitaxial layer EP in the active part. Subsequently, by providing a heat treatment, the p-type impurity is diffused to form the p-type diffusion region PCH. The p-type diffusion region PCH works as the channel region of the power MOSFET. The p-type diffusion region PCH is formed so that the depth of the p-type diffusion region PCH from the upper face of the epitaxial layer EP is shallower than the depth of the trench GTR for a gate from the upper face of the epitaxial layer EP.

Further, the p-type diffusion region PCH is formed in the whole of the epitaxial layer EP between the trench GTR for a gate and the trench TR.

Next, using a photoresist film patterned by a photolithographic technology as a mask, an n-type impurity, for example, arsenic (As) is ion-planted into the epitaxial layer EP in the active part and in the outer peripheral part. Subsequently, by providing a heat treatment, the n-type impurity is diffused to form the n-type diffusion region NS in the active part and the n-type diffusion region NSG in the outer peripheral part. The n-type diffusion region NS formed in the active part works as the source region of the power MOSFET. The n-type diffusion region NS is formed so that the depth of the n-type diffusion region NS from the upper face of the epitaxial layer EP is shallower than the depth of the p-type diffusion region PCH from the upper face of the epitaxial layer EP.

The n-type diffusion region NS in the active part is formed not in the whole of the epitaxial layer EP between the trench GTR for a gate and the trench TR, and is in contact with the trench GTR for a gate but is not in contact with the trench TR defining the active region AC. Accordingly, in top view, on the upper face of the epitaxial layer EP, the n-type diffusion region NS is formed on both sides of the gate electrode GE, and, outside thereof, the p-type diffusion region PCH is formed.

Further, the n-type diffusion region NSG in the outer peripheral part is formed, connected with the n-type diffusion region NRG.

Figure 32:
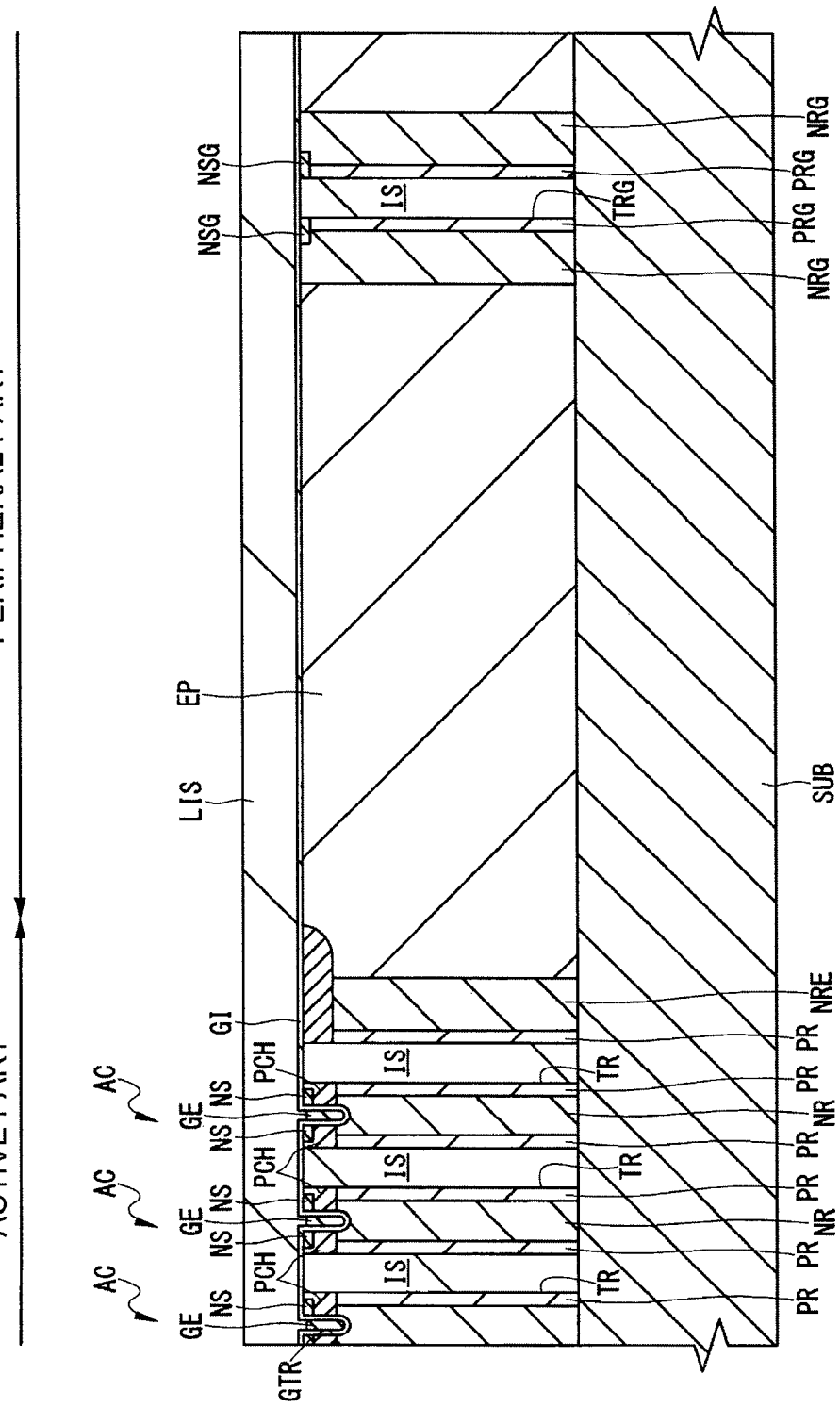
FIG. 32 is an essential part cross-sectional view of the same place as that in FIG. 31 during the manufacturing process of the semiconductor device, following FIG. 31.

Next, as shown in FIG. 32, over the upper face of the epitaxial layer EP, the interlayer insulating film LIS, for example, a silicon oxide film is deposited by a CVD method.

Figure 33:
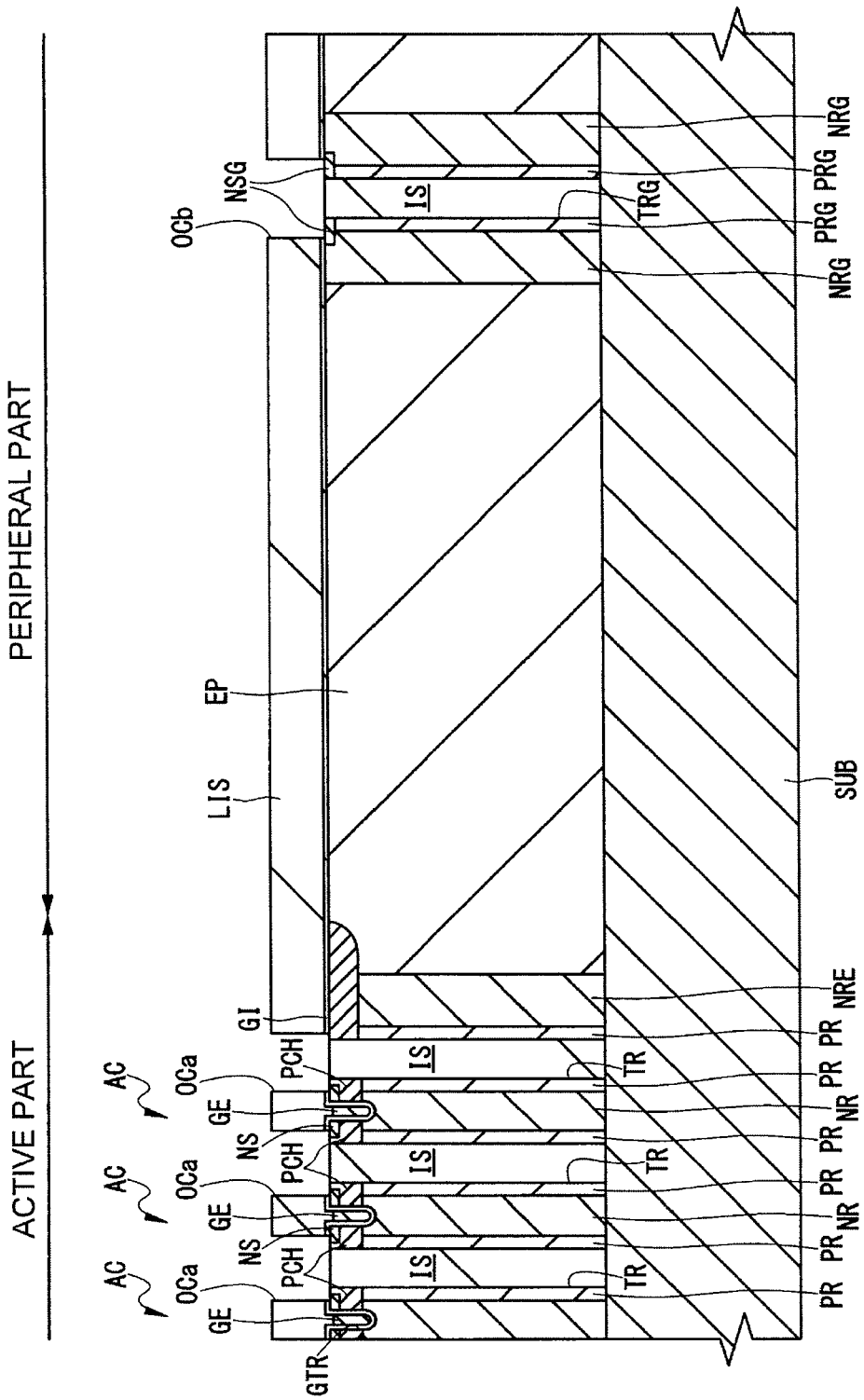
FIG. 33 is an essential part cross-sectional view of the same place as that in FIG. 31 during the manufacturing process of the semiconductor device, following FIG. 32.

Next, as shown in FIG. 33, using a photoresist film patterned by a photolithographic technology as a mask, the opening parts OCa and OCb are formed in the interlayer insulating film LIS lying above the trenches TR and TRG, respectively. Furthermore, the gate insulating film GI lying below the opening part OCa is removed to cause the n-type diffusion region NS (the source region of the power MOSFET) and the p-type diffusion region PCH (the channel region of the power MOSFET) to be exposed. At the same time, the gate insulating film GI lying below the opening part OCb is removed to cause the n-type diffusion region NSG in the outer peripheral part to be exposed.

Here, the gate insulating film GI is removed so that the insulating film IS embedded in the trench TR is not to be etched. Thereby, the upper face of the insulating film IS embedded in the trench TR is caused to lie shallower than the depth of the n-type diffusion region NS (the source region of the power MOSFET) from the upper face of the epitaxial layer EP.

Further, although not shown in the drawing, a contact hole connecting the gate electrode GE to the gate wiring is also formed.

Figure 34:
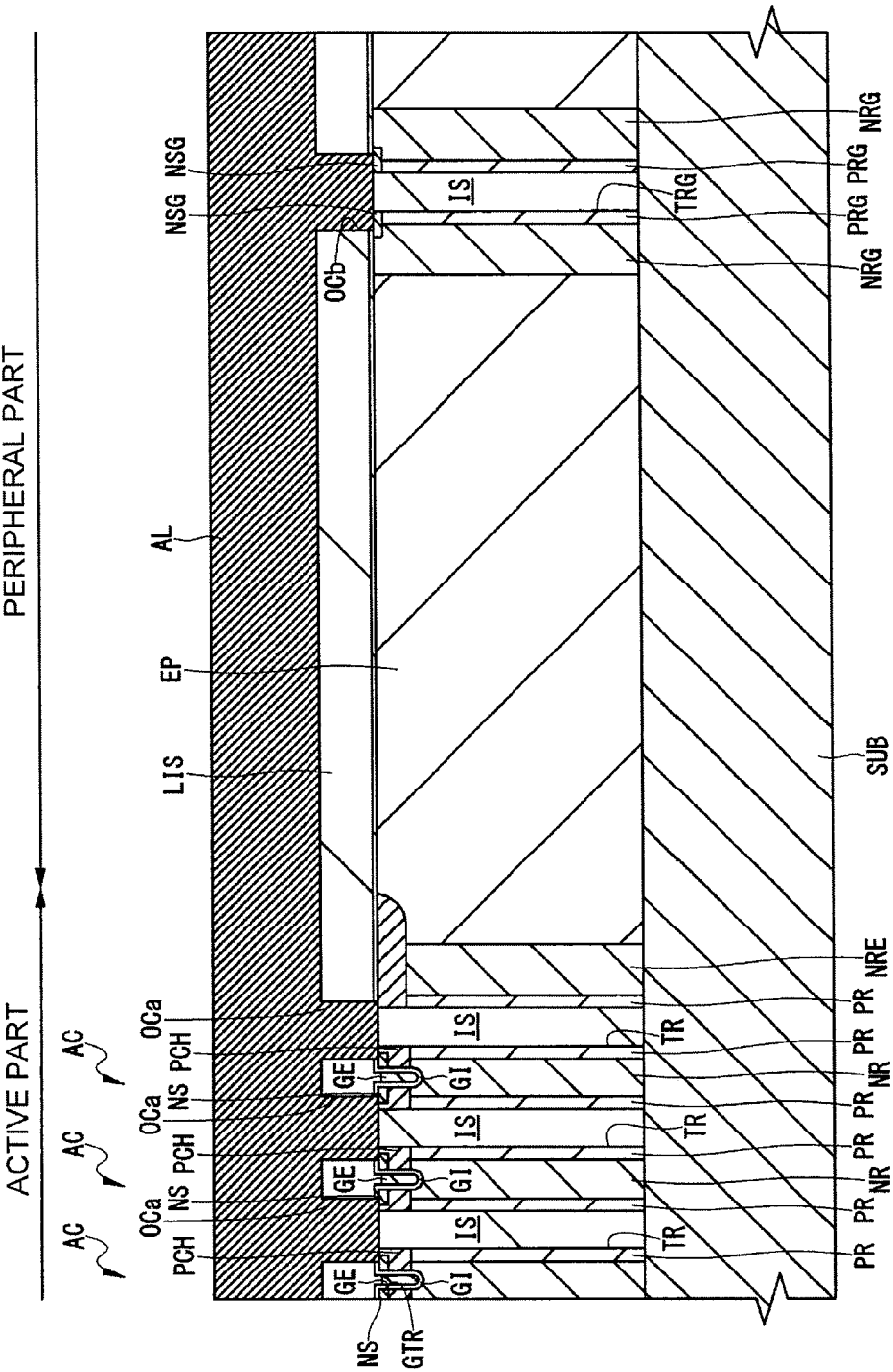
FIG. 34 is an essential part cross-sectional view of the same place as that in FIG. 31 during the manufacturing process of the semiconductor device, following FIG. 33.

Next, as shown in FIG. 34, over the interlayer insulating film LIS including the inside of the opening parts OCa and OCb and the inside of the contact hole, for example, by sputtering method, an aluminum (Al) film AL is deposited.

Figure 35:
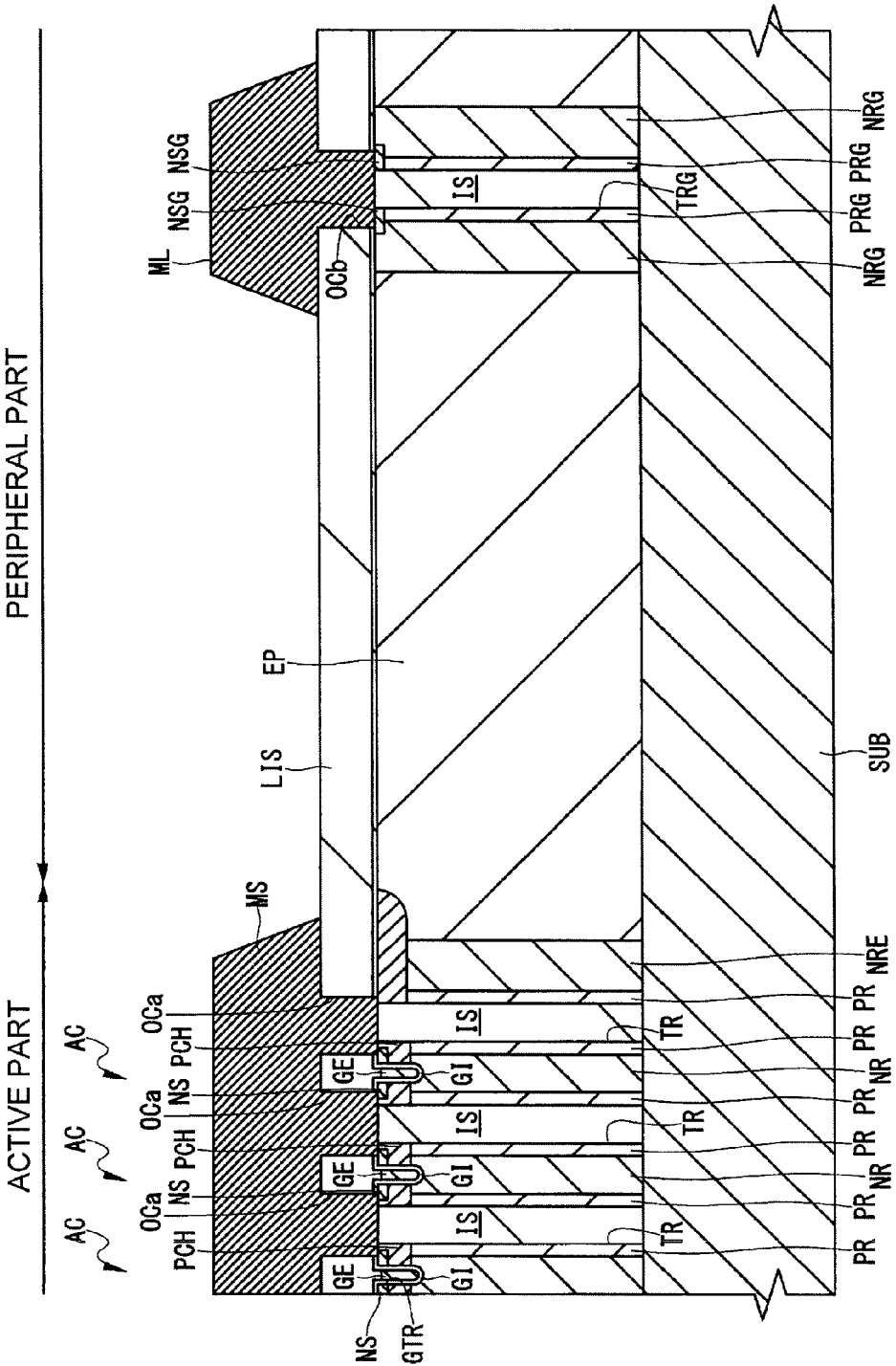
FIG. 35 is an essential part cross-sectional view of the same place as that in FIG. 31 during the manufacturing process of the semiconductor device, following FIG. 34.

Next, as shown in FIG. 35, using a photoresist film patterned by a photolithographic technology as a mask, the aluminum (Al) film AL is etched. Thereby, in the active part, the source wiring MS connected electrically with the n-type diffusion region NS (the source region of the power MOSFET) and the p-type diffusion region PCH (the channel region of the power MOSFET), and the gate wiring connected electrically with the gate electrode GE are formed. In the outer peripheral part, the guard ring wiring ML connected electrically with the substrate SUB via the n-type diffusion region NSG and the n-type diffusion region NRG is formed.

After that, in the same way as that in the first embodiment described above, the surface protection film, the contact wiring and the like are formed.

As described above, according to the second embodiment, since there is no necessity of devising the connection with the source wiring MS at the side wall of the trench TR defining the active region AC, in addition to the aforementioned effect of the first embodiment, variation in properties of power MOSFET caused by variation in processing can be suppressed.

Third Embodiment

The power MOSFET of a super junction structure according to a third embodiment differs in the structure of the gate electrode, from the power MOSFET of a super junction structure according to the first embodiment. That is, in the power MOSFET according to the first embodiment, the gate electrode constituted of the conducting film embedded in the trench formed in the epitaxial layer, a so-called trench type gate electrode is used, but, in the power MOSFET according to the third embodiment, a gate electrode constituted of a conducting film formed on the upper face of the epitaxial layer, a so-called planar type gate electrode is used.

<<Semiconductor Device>>

Figure 36:
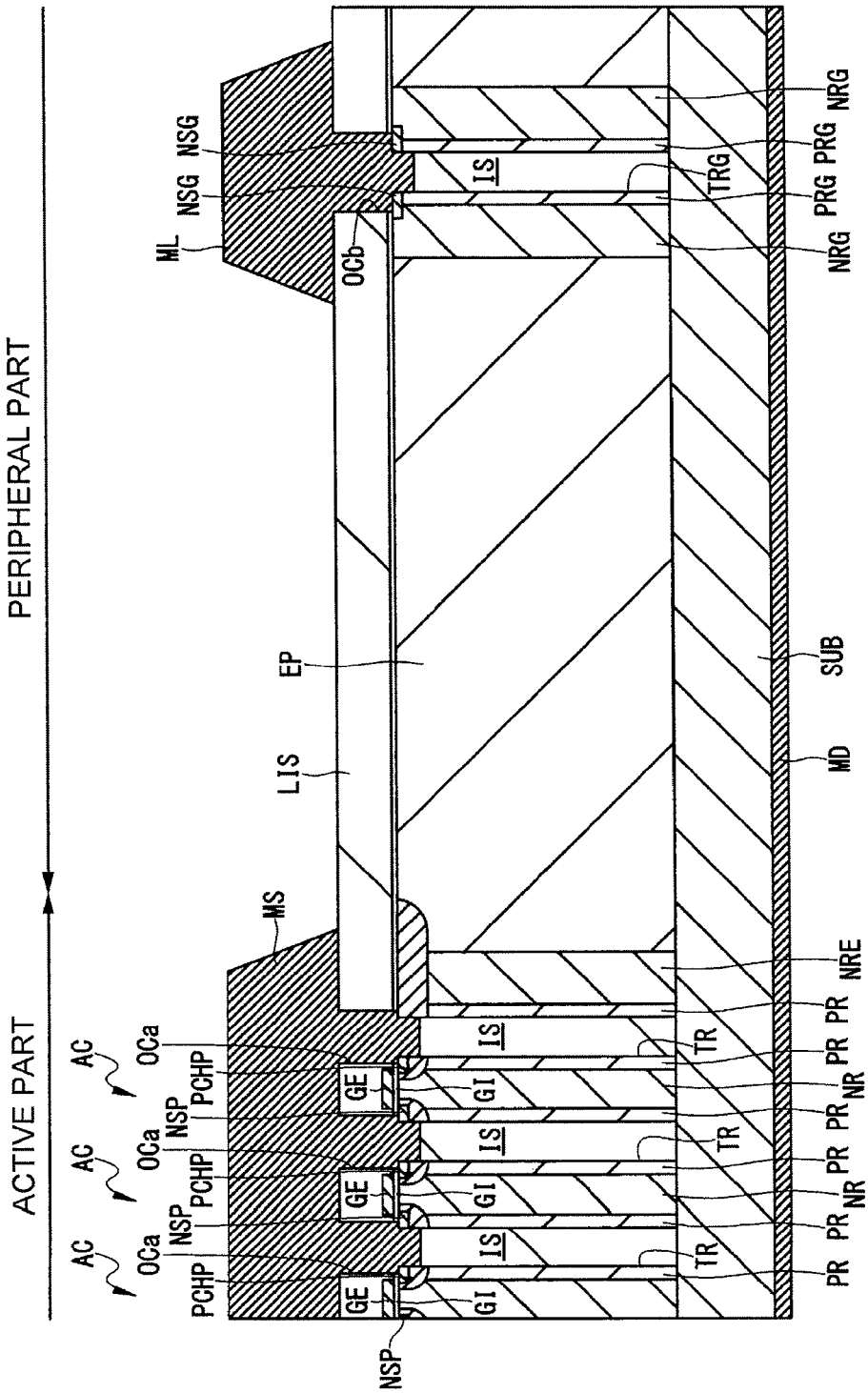
FIG. 36 is an essential part cross-sectional view showing a part of the active part and a part of the outer peripheral part of a semiconductor chip forming a power MOSFET of a super junction structure according to a third embodiment.

The structure of the power MOSFET of a super junction structure according to the third embodiment will be explained using FIG. 36. FIG. 36 is an essential part cross-sectional view showing a part of the active part and a part of the outer peripheral part of the semiconductor chip forming the power MOSFET of a super junction structure.

In the power MOSFET according to the third embodiment, constitutions of the gate electrode, the source region and the channel region are explained, but the other constitution and the like are the same as those of the power MOSFET according to the first embodiment and the explanation here is omitted.

As shown in FIG. 36, in the epitaxial layer EP, the plurality of trenches TR is formed along the first direction (the x-direction in FIG. 1 described above), and, by the insulating film IS embedded inside the trench TR, the plurality of active regions AC is defined.

Over the upper face of the epitaxial layer EP in the active region AC, the plurality of gate electrodes GE is formed via the gate insulating film GI, to form a stripe pattern in which all the gate electrodes GE extend along the first direction in plan view. In the epitaxial layer EP on both sides of the gate electrode GE, the n-type diffusion region NSP is formed, and, so as to surround the n-type diffusion region NSP, the p-type diffusion region PCHP is formed. The n-type, diffusion region NSP functions as the source region of the power MOSFET, and the p-type diffusion region PCHP functions as the channel region of the power MOSFET. The p-type diffusion region PCHP is connected with the p-type diffusion region PR formed in the epitaxial layer EP, while contacting with the side wall of the trench TR.

In the active part and the outer peripheral part of the semiconductor chip SC, the interlayer insulating film LIS is formed so as to cover the power MOSFET. In the interlayer insulating film LIS, the opening parts OCa and OCb are formed. A part of the insulating film IS in the trench TR lying below the opening part OCa formed in the active part is etched, and a part of the n-type diffusion region NSP and a part of the p-type diffusion region PCHP of the power MOSFET are exposed at the side wall of the trench TR. Further, a part of the insulating film IS in the trench TRG lying below the opening part OCb formed in the outer peripheral part is etched, and a part of the n-type diffusion region NSG and a part of the p-type diffusion region PRG of the guard ring are exposed at the side wall of the trench TRG.

Here, the upper face of the insulating film IS embedded in the trench TR lies deeper than the depth of the n-type diffusion region NSP (the source region of the power MOSFET) from the upper face of the epitaxial layer EP, and shallower than the depth of the p-type diffusion region PCHP (the channel region of the power MOSFET) from the upper face of the epitaxial layer EP.

In the state where these opening parts OCa and OCb are formed, over the interlayer insulating film LIS, there are formed the source wiring MS connected with the n-type diffusion region NSP and the p-type diffusion region PCHP in the active part, and the guard ring wiring ML connected with the n-type diffusion region NSG and the p-type diffusion region PRG in the outer peripheral part, separated from each other.

The source wiring MS formed in the active part is connected with the n-type diffusion region NSP and the p-type diffusion region PCHP exposed at the side wall of the trench TR.

As described above, according to the third embodiment, since the process of forming a trench for a gate becomes unnecessary, in addition to the aforementioned effect of the first embodiment, the productivity of the semiconductor device is improved as compared with that in the first embodiment.

Fourth Embodiment

The power MOSFET of a super junction structure according to a fourth embodiment differs in the constitutions of the source region and the channel region, from those of the power MOSFET according to the third embodiment. That is, in the power MOSFET according to the fourth embodiment, the structure of the gate electrode is a so-called planar type gate structure as is the case for the power MOSFET according to the third embodiment, but, in the epitaxial layer on one side of the gate electrode, the source region and the channel region are formed.

<<Semiconductor Device>>

Figure 37:
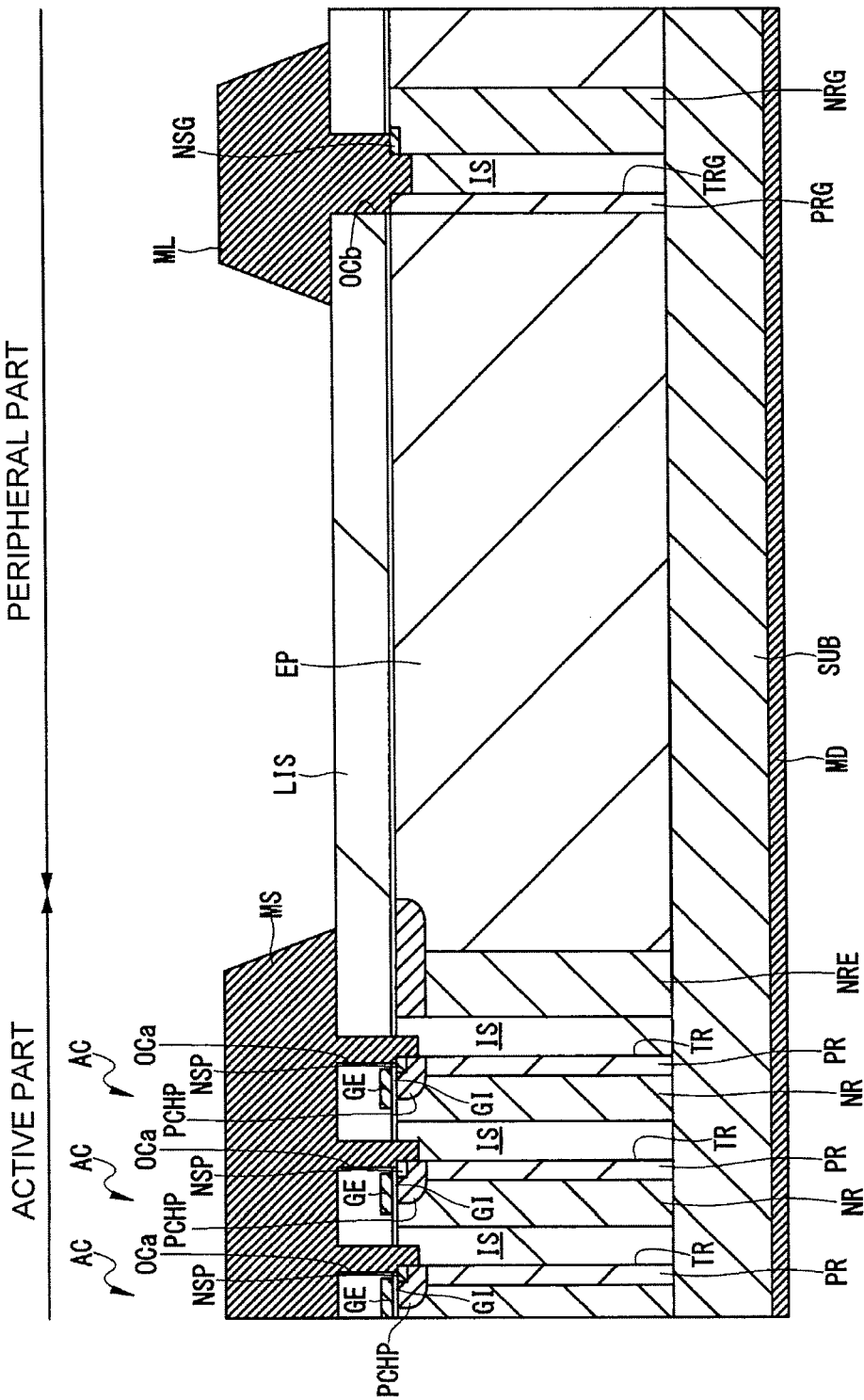
FIG. 37 is an essential part cross-sectional view showing a part of the active part and a part of the outer peripheral part of a semiconductor chip forming a power MOSFET of a super junction structure according to a fourth embodiment.

The structure of the power MOSFET of a super junction structure according to the fourth embodiment will be explained using FIG. 37. FIG. 37 is an essential part cross-sectional view showing a part of the active part and apart of the outer peripheral part of the semiconductor chip forming the power MOSFET of a super junction structure.

In the power MOSFET according to the fourth embodiment, the constitutions of the gate electrode, the source region and the channel region are explained, but, since the other constitution and the like are the same as those of the power MOSFET according to the first embodiment, the explanation here is omitted.

As shown in FIG. 37, in the epitaxial layer EP, the plurality of trenches TR is formed along the first direction (the x-direction in FIG. 1), and the insulating film IS embedded in the trench TR defines the plurality of active regions AC.

In the epitaxial layer EP between the adjacent trenches TR in the active part, there are disposed the n-type diffusion region NR formed in the thickness direction of the epitaxial layer EP and the p-type diffusion region PR formed in the thickness direction of the epitaxial layer EP. That is, in the epitaxial layer EP between the adjacent trenches TR, from one side wall of the trench TR toward the other side wall of the trench TR, the n-type diffusion region NR having the first width from the one side wall of the trench TR in top view is formed, and, from the other side wall of the trench TR toward the one side wall of the trench TR, the p-type diffusion region PR having the second width in top view is formed.

Meanwhile, in the edge part of, the active part, only the n-type diffusion region NRE is formed from the side wall of the trench TR lying in the edge part toward the outer peripheral part. In the chip end on the opposite side of the chip end shown in FIG. 37, in the end part of the active part, only the p-type diffusion region PR is formed from the side wall of trench TR lying in the end part toward the outer peripheral part.

Further, in the epitaxial layer EP in the outer peripheral part, the trench TRG is formed, and, inside the trench TRG, the insulating film IS is embedded. From one side wall of the trench TRG toward the active part, in the epitaxial layer EP, only the p-type diffusion region PRG is formed, and, from the other side wall of the trench TRG toward the periphery of the semiconductor chip, in the epitaxial layer EP, only the n-type diffusion region NRG is formed. In the chip end opposite to the chip end shown in FIG. 37, from one side wall of the trench TRG toward the active part, in the epitaxial layer EP, only the n-type diffusion region NRG is formed, and, from the other side wall of the trench TRG toward the periphery of the semiconductor chip, in the epitaxial layer EP, only the p-type diffusion region PRG is formed.

Furthermore, over the upper face of the epitaxial layer EP in the active region AC, the plurality of gate electrodes GE is formed via the gate insulating film GI to give a stripe pattern in which all the gate electrodes GE extend along the first direction in plan view. The n-type diffusion region NSP is formed only in the epitaxial layer EP on one side of the gate electrode GE (the side on which the p-type diffusion region PR is formed), and, so as to surround the n-type diffusion region NSP, the p-type diffusion region PCHP is formed. The n-type diffusion region NSP functions as the source region of the power MOSFET, and the p-type diffusion region PCHP functions as the channel region of the power MOSFET. The p-type diffusion region PCHP is connected with the p-type diffusion region PR formed in the epitaxial layer EP, in contact with the side wall of the trench TR.

In the active part and the outer peripheral part of the semiconductor chip SC, the interlayer insulating film LIS is formed so as to cover the power MOSFET. In the interlayer insulating film LIS, the opening parts OCa and OCb are formed. The opening part OCa formed in the active part is formed so as to open approximately a half of the width of the trench TR on the side on which the n-type diffusion region NSP and the p-type diffusion region PCHP are formed. A part of the insulating film IS in the trench TR lying below the opening part OCa formed in the active part is etched, and a part of the n-type diffusion region NSP and a part of the p-type diffusion region PCHP of the power MOSFET are exposed at the side wall on one side of the trench TR. Further, a part of the insulating film IS in the trench TRG lying below the opening part OCb formed in the outer peripheral part is etched, and a part of the n-type diffusion region NSG, a part of the n-type diffusion region NRG and a part of the p-type diffusion region PRG of the guard ring are exposed at the side wall of the trench TRG.

Here, the upper face of the insulating film IS embedded in the trench TR lies deeper than the depth of the n-type diffusion region NSP (the source region of the power MOSFET) from the upper face of the epitaxial layer EP, and shallower than the depth of the p-type diffusion region PCHP (the channel region of the power MOSFET) from the upper face of the epitaxial layer EP.

In the state where these opening parts OCa and OCb are formed, over the interlayer insulating film LIS, there are formed the source wiring MS connected to the n-type diffusion region NSP and the p-type diffusion region PCHP in the active part, and the guard ring wiring ML connected to the n-type diffusion regions NSG and NRG and the p-type diffusion region PRG in the outer peripheral part, separated from each other.

The source wiring MS formed in the active part is connected with the n-type diffusion region NSP and the p-type diffusion region PCHP exposed at the side wall of the trench TR.

As described above, according to the fourth embodiment, since the process of forming a trench for a gate becomes unnecessary, in addition to the aforementioned effect of the first embodiment, the productivity of the semiconductor device is improved as compared with that in the first embodiment. Furthermore, since the n-type diffusion region NSP and the channel region PCHP are formed only in the epitaxial layer EP on one side of the gate electrode GE, the width of the n-type diffusion region NR formed in the epitaxial layer EP can be set to be wide and the resistance of the drain offset layer can be lowered.

Meanwhile, in the fourth embodiment, the source region and the channel region are formed in the epitaxial layer on one side of the gate electrode in the power MOSFET having the planar type gate structure, but, the source region and the channel region may be formed in the epitaxial layer on one side of the gate electrode in the power MOSFET having the trench type gate structure.

Fifth Embodiment

The power MOSFET of a super junction structure according to a fifth embodiment differs in the direction in which the plurality of gate electrodes extends, from the aforementioned power MOSFET of a super junction structure according to the first embodiment. That is, in the power MOSFET according to the first embodiment, the plurality of gate electrodes is formed so as to extend in the same direction as the direction in which the trench defining the active region extends, in plan view, but in the power MOSFET according to the fifth embodiment, the plurality of gate electrodes is formed so as to extend in the direction orthogonal to the direction in which the trench defining the active region extends, in plan view.

<<<Semiconductor Device>>>

Figure 38:
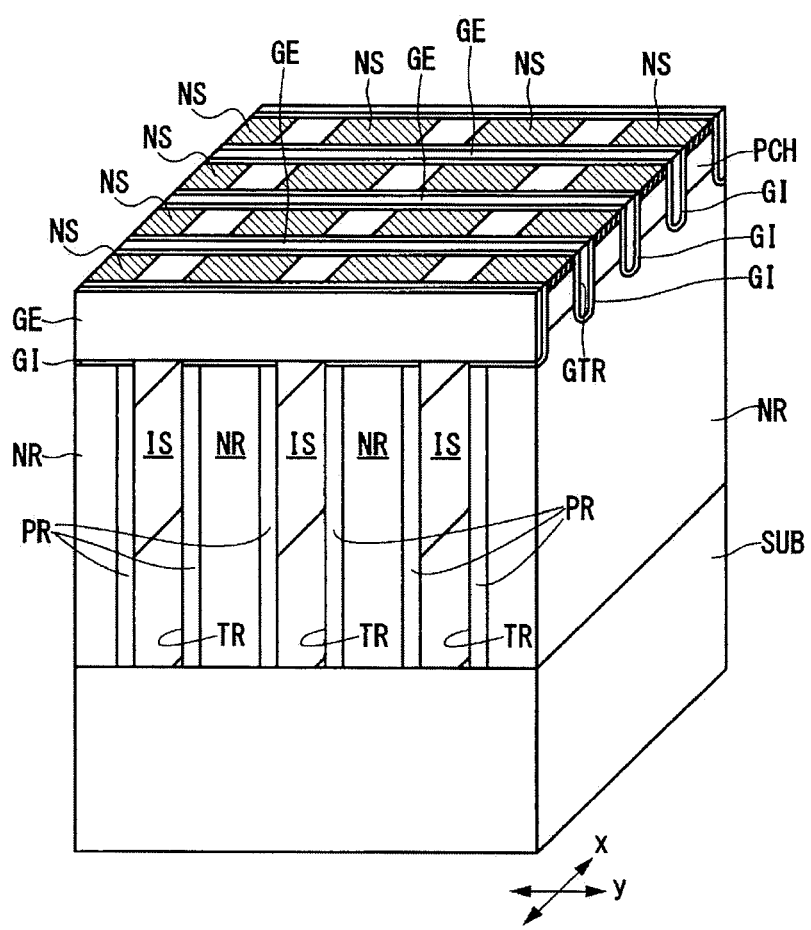
FIG. 38 is an essential part perspective view showing a part of the active part of a semiconductor chip forming a power MOSFET of a super junction structure according to a fifth embodiment.

The structure of the power MOSFET of a super junction structure according to the fifth embodiment will be explained using FIG. 38. FIG. 38 is a perspective view showing a part of the active part of a semiconductor chip forming the power MOSFET of a super junction structure.

In the power MOSFET according to the fifth embodiment, the disposition of the trench defining the gate electrode and the active region is explained, but, since the other constitution and the like are the same as those in the power MOSFET according to the first embodiment, the explanation here is omitted.

As shown in FIG. 38, in the epitaxial layer EP in the active part, the plurality of trenches TR is formed along the first direction (the x-direction shown in FIG. 38), and the insulating film IS embedded inside the trenches TR defines the plurality of active regions. The plurality of trenches TR gives a stripe pattern.

On the other hand, the plurality of gate electrodes GE is formed along the second direction (the y-direction shown in FIG. 38) orthogonal, to the first direction in top view. The gate electrode GE is formed in the trench GTR for a gate formed in the epitaxial layer EP via the gate insulating film GI. The plurality of gate electrodes GE gives a stripe pattern.

On both sides of the trench GTR for a gate in which the gate electrode GE is formed, the n-type diffusion region NS constituting the source region and the p-type diffusion region PCH constituting the channel region lie.

As described above, according to the fifth embodiment, the pitch of the gate electrodes GE can be determined independently of the pitch of the trenches TR. The interval of the trenches TR is a design parameter determining the drain breakdown voltage, and the optimum value is different according to an intended drain breakdown voltage. On the other hand, the pitch of the gate electrodes GE is a design parameter that has an influence on a channel resistance and a gate capacitance of the power MOSFET. It is necessary to make the pitch of the gate electrodes GE small when the channel resistance is to be made low, and to make the pitch of the gate electrodes GE large when the gate capacitance is to be made small. Which one is desirable differs according to use conditions of the power MOSFET, and therefore, by adopting the constitution of the fifth embodiment capable of determining the pitch of the gate electrodes GE while giving no influence on the drain breakdown voltage, flexible design correspondence becomes possible.

Sixth Embodiment

The power MOSFET of a super junction structure according to a sixth embodiment differs in the direction in which the plurality of gate electrodes extends, from the aforementioned power MOSFET of a super junction structure according to the third embodiment. That is, in the power MOSFET according to the third embodiment, the plurality of gate electrodes is formed so as to extend in the same direction as the direction in which the trench defining the active region extends, but, in the power MOSFET according to the sixth embodiment, the plurality of gate electrodes is formed so as to extend in the direction orthogonal to the direction in which the trench defining the active region extends.

<<Semiconductor Device>>

Figure 39:
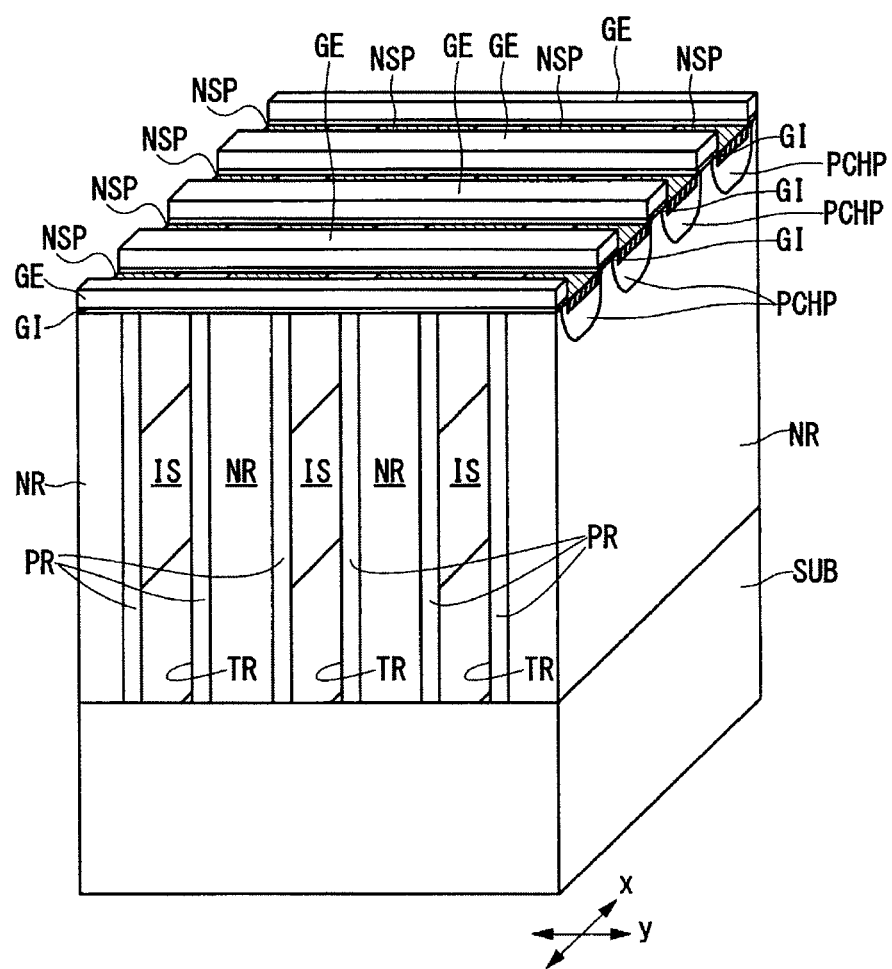
FIG. 39 is an essential part perspective view showing a part of the active part of a semiconductor chip forming a power MOSFET of a super junction structure according to a sixth embodiment.

The structure of the power MOSFET of a super junction structure according to the sixth embodiment will be explained using FIG. 39. FIG. 39 is a perspective view showing a part of the active part of the semiconductor chip forming the power MOSFET of a super junction structure.

In the power MOSFET according to the sixth embodiment, the disposition of the trench defining the gate electrode and the active region is explained, but, since the other constitution and the like are the same as those in the power MOSFET according to the third embodiment, the explanation here is omitted.

As shown in FIG. 39, in the epitaxial layer EP in the active part, the plurality of trenches TR is formed along the first direction (the x-direction shown in FIG. 39), and the insulating film IS embedded inside the trench TR defines the plurality of active regions. The plurality of trenches TR gives a stripe pattern.

On the other hand, the plurality of gate electrodes GE is formed along the second direction (the y-direction shown in FIG. 39) orthogonal to the first direction in top view. The gate electrode GE is formed over the upper face of the epitaxial layer EP via the gate insulating film GI. The plurality of gate electrodes GE gives a stripe pattern. In the epitaxial layer EP on both sides of the gate electrode GE, the n-type diffusion region NSP that functions as the source region is formed, and, so as to surround the n-type diffusion region NSP, the p-type diffusion region PCHP that functions as the channel region is formed.

As described above, according to the sixth embodiment, the same effect as that of the fifth embodiment can be obtained.

Seventh Embodiment

The power MOSFET of a super junction structure according to a seventh embodiment differs in the direction in which the plurality of gate electrodes extends, from the aforementioned power MOSFET of a super junction structure according to the sixth embodiment. That is, in the power MOSFET according to the sixth embodiment, in the epitaxial layer on both sides of the gate electrode, the n-type diffusion region that functions as the source region and the p-type diffusion region that functions as the channel region are formed, but, in the power MOSFET according to the seventh embodiment, in the epitaxial layer on one side of the gate electrode, the n-type diffusion region that functions as the source region and the p-type diffusion region that functions as the channel region are formed.

<<Semiconductor Device>>

Figure 40:
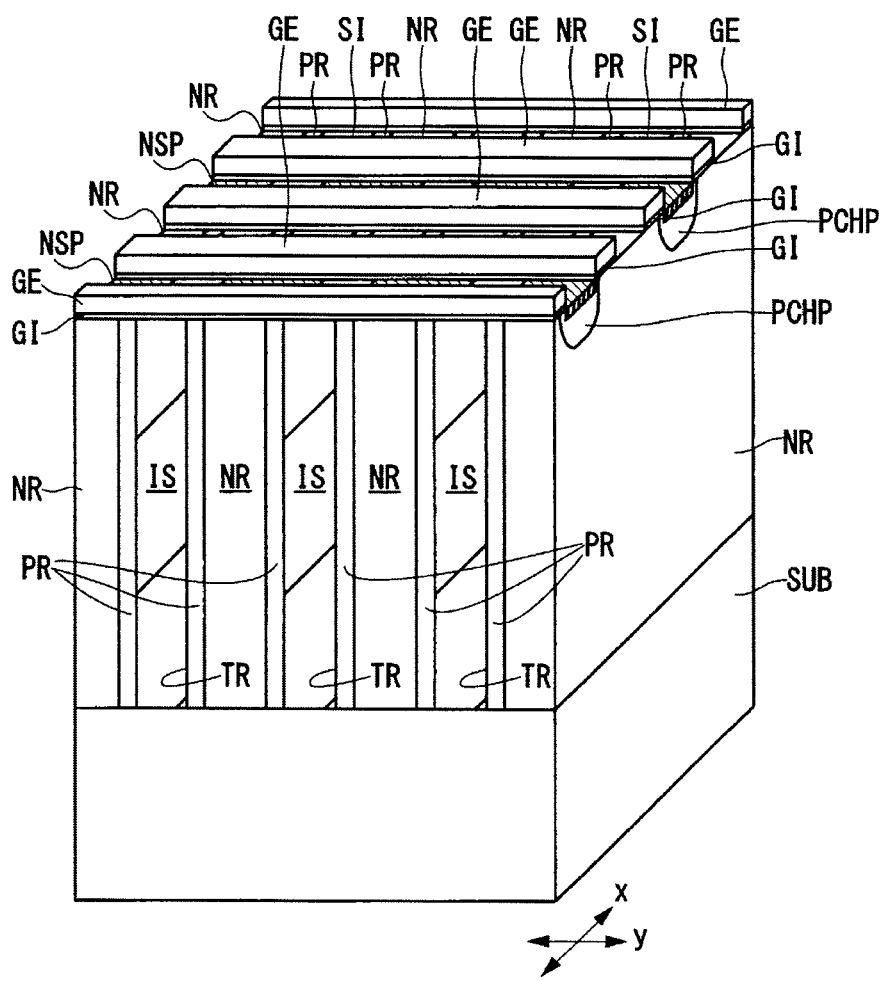
FIG. 40 is an essential part perspective view showing a part of the active part of a semiconductor chip forming a power MOSFET of a super junction structure according to a seventh embodiment.

The structure of the power MOSFET of a super junction structure according to the seventh embodiment will be explained using FIG. 40. FIG. 40 is a perspective view showing a part of the active part of the semiconductor chip forming the power MOSFET of a super junction structure.

In the power MOSFET according to the sixth embodiment, the disposition of the n-type diffusion region that functions as the source region and the p-type diffusion region that functions as the channel region is explained, but, since the other constitution and the like are the same as those in the power MOSFET according to the sixth embodiment, the explanation here is omitted.

As shown in FIG. 40, in the epitaxial layer EP in the active part, the plurality of trenches TR is formed along the first direction (the x-direction shown in FIG. 40), and the insulating film IS embedded inside the trench TR defines the plurality of active regions. The plurality of trenches TR gives a stripe pattern.

On the other hand, the plurality of gate electrodes GE is formed along the second direction (the y-direction shown in FIG. 40) orthogonal to the first direction in top view. The gate electrode GE is formed over the upper face of the epitaxial layer EP via the gate insulating film GI. The plurality of gate electrodes GE gives a stripe pattern. In the epitaxial layer EP on one side of the gate electrode GE, the n-type diffusion region NSP that functions as the source region is formed, and, so as to surround the n-type diffusion region NSP, the p-type diffusion region PCHP that functions as the channel region is formed.

As described above, according to the seventh embodiment, besides obtaining the same effect as that of the fifth embodiment, the capacitance between the gate and the drain can be reduced. Thereby, correspondence to applications that require high-speed switching is possible.

Eighth Embodiment

The power MOSFET of a super junction structure according to an eighth embodiment differs in the structure of a p-type diffusion region formed in the epitaxial layer, having a constant width from both side walls of the trench defining the active regions, from the power MOSFETs of the super junction structure according to the first embodiment to the seventh embodiment. That is, in the power MOSFETs according to the first embodiment to the seventh embodiment, the p-type diffusion region reaches the substrate, but, in the power MOS- FET according to the eighth embodiment, the p-type diffusion region does not reach the substrate.

<<Semiconductor Device>>

Figure 41:
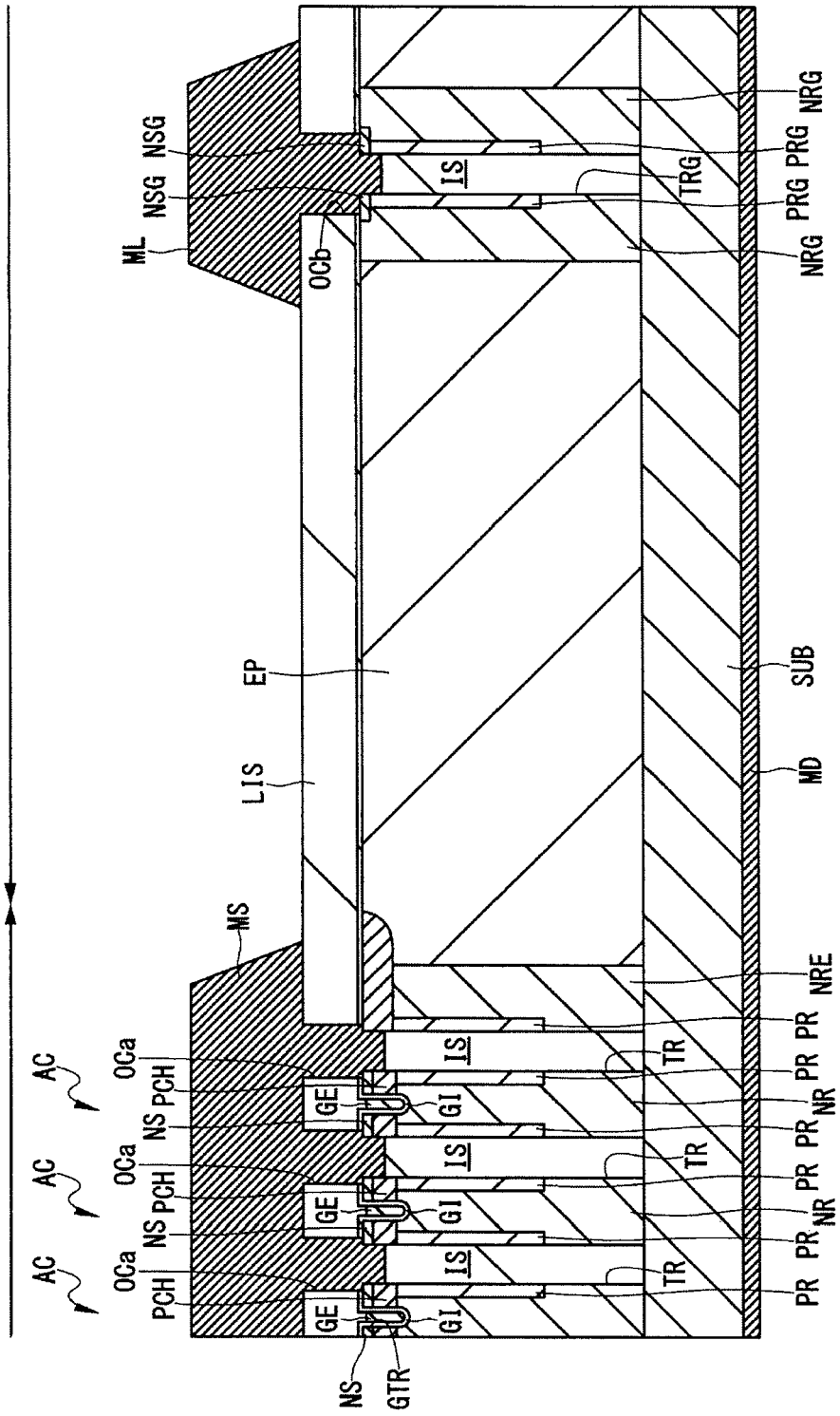
FIG. 41 is an essential part cross-sectional view showing a part of the active part and a part of the outer peripheral part of a semiconductor chip forming a power MOSFET of a super junction structure of a first example according to an eighth embodiment.
Figure 42:
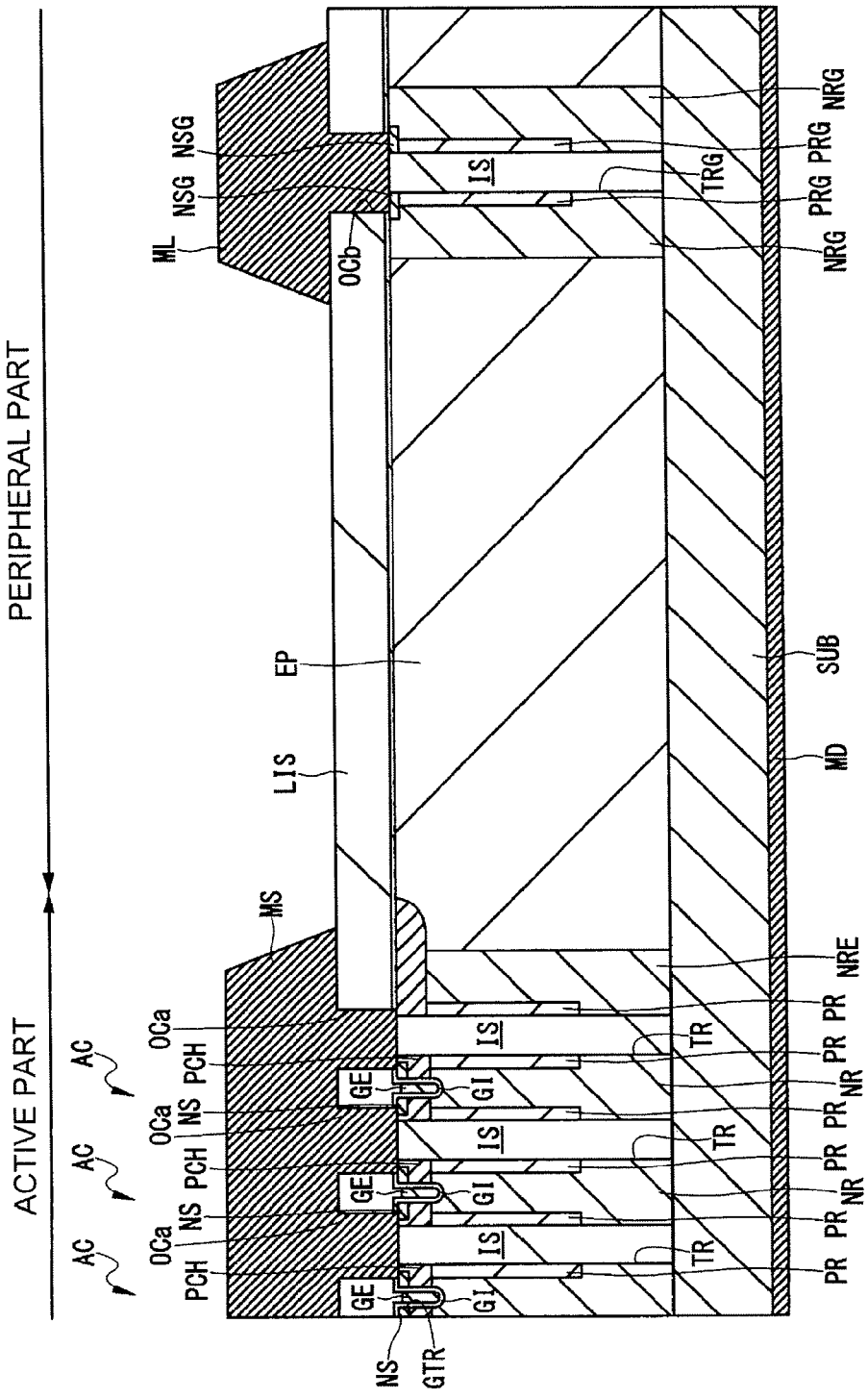
FIG. 42 is an essential part cross-sectional view showing a part of the active part and a part of the outer peripheral part of a semiconductor chip forming a power MOSFET of a super junction structure of a second example according to the eighth embodiment.

The structure of the power MOSFET of a super junction structure according to the eighth embodiment is explained using FIG. 41 and FIG. 42. FIG. 41 is an essential part cross-sectional view showing a part of the active part and a part of the outer peripheral part of a semiconductor chip forming a first example of a power MOSFET of a super junction structure. FIG. 42 is an essential part cross-sectional view showing a part of the active part and a part of the outer peripheral part of a semiconductor chip forming a second example of a power MOSFET of a super junction structure.

As to the power MOSFET according to the eighth embodiment, the constitution of the p-type diffusion region formed in the epitaxial layer, having a constant width from both side walls of the trench defining the active region is explained, but, since the other constitution and the like are the same as those of the power MOSFETs according to the first embodiment to the seventh embodiment, the explanation here is omitted.

In the first example shown in FIG. 41, the case is shown, where, in the power MOSFET described in the first embodiment, the depth of the p-type diffusion region PR from the upper face of the epitaxial layer EP, formed in the epitaxial layer EP while having a constant width from both side walls of the trench TR defining the active region AC, is formed shallower than the depth of the trench TR. Accordingly, the p-type diffusion region PR does not reach the substrate SUB, and the contact area of the p-type diffusion region PR with the n-type diffusion region NR is smaller than that in the case of the power MOSFET according to the first embodiment.

In the second example shown in FIG. 42, the case is shown, where, in the power MOSFET described in the second embodiment, the depth of the p-type diffusion region PR from the upper face of the epitaxial layer EP, formed in the epitaxial layer EP while having a constant width from both side walls of the trench TR defining the active regions AC, is formed shallower than the depth of the trench TR. Accordingly, the p-type diffusion region PR does not reach the substrate SUB, and the contact area of the p-type diffusion region PR with the n-type diffusion region NR is smaller than that in the case of the power MOSFET according to the second embodiment.

The p-type diffusion region PR that does not reach the substrate SUB can be formed, for example, by adjusting the implantation angle upon ion-implanting the p-type impurity during the manufacturing process of the semiconductor device explained using FIG. 11 and FIG. 12 of the first embodiment.

Generally, a power MOSFET of a super junction structure has a larger area of the p-n junction than a power MOSFET of a one-dimensional junction structure, and gives a large junction capacitance in a state where the p-n junction is not biased. According to the eighth embodiment, however, the junction capacitance of the p-type diffusion region PR and the n-type diffusion region NR can be reduced.

A part close to the drain (the substrate SUB) side is, however, not of a super junction structure, and, therefore, the impurity concentration in the n-type diffusion region NR is necessarily to be lowered and ON resistance rises. Accordingly, the power MOSFET of a super junction structure according to the eighth embodiment has a constitution that is effective in the case where an output capacitance is to be lowered even if the ON resistance rises.

Hereinbefore, the invention achieved by the present inventor is explained specifically based on the embodiments, but, needless to say, the present invention is not restricted to the embodiments and can be changed variously without deviating from the purport thereof.

For example, in the aforementioned embodiments, the power MOSFET of a super junction structure is constituted of a unit cell of an n-channel type MOSFET, but, by replacing the n-type with the p-type, it may be constituted of a unit cell of a p-channel type MOSFET.

What is claimed is:

1. A semiconductor device including an active part in which a power MOSFET is formed and an outer peripheral part formed around the active part, the device comprising:
   a substrate of a first conductivity type; and
   an epitaxial layer of a second conductivity type different from the first conductivity type, formed over the substrate,
   wherein the active part has:
   a plurality of first trenches which is formed in the epitaxial layer while extending in a first direction in plan view provided with a first interval each other in a second direction orthogonal to the first direction in plan view, and which has a first depth from an upper face of the epitaxial layer;
   a first insulating film embedded inside the first trench;
   a first diffusion region of the first conductivity type which is formed in the epitaxial layer between the adjacent first trenches and which has a first width smaller than the first interval in the second direction; and
   a second diffusion region of the second conductivity type which is formed in the epitaxial layer between a side wall of the first trench and the first diffusion region, and which has a second width in the second direction.

2. The semiconductor device according to claim 1, wherein the second diffusion region is formed in the epitaxial layer on both side wall sides of the first trench.

3. The semiconductor device according to claim 1, wherein the second diffusion region is formed only in the epitaxial layer on one side wall side of the first trench.

4. The semiconductor device according to claim 1, wherein the first diffusion region is formed by an impurity ion of the first conductivity type introduced from the side wall of the first trench by an inclined ion implantation method; and
   wherein the second diffusion region is formed by an impurity ion of the second conductivity type introduced from the side wall of the first trench by an inclined ion implantation method.

5. The semiconductor device according to claim 1, further comprising a guard ring wiring formed so as to surround the active part in top view over the epitaxial layer in the outer peripheral part,
   wherein the guard ring wiring is connected electrically with the substrate via a third diffusion region formed in the epitaxial layer in the outer peripheral part.

6. The semiconductor device according to claim 5, further comprising:
   a second trench which is formed in the epitaxial layer below the guard ring wiring and which has a second depth from an upper face of the epitaxial layer; and
   a second insulating film embedded inside the second trench,
   wherein a part of the second trench close to a corner part of a semiconductor chip has a first curvature radius in top view.

7. The semiconductor device according to claim 1, wherein a bottom part of the first trench lies inside the substrate.

8. The semiconductor device according to claim 1,
wherein a depth of the second diffusion region from an upper face of the epitaxial layer is shallower than the first depth of the first trench.

9. The semiconductor device according to claim 1, further comprising:
a gate electrode formed over the epitaxial layer between the adjacent first trenches, via a gate insulating film;
a source region of the first conductivity type formed in the epitaxial layer on both sides of the gate electrode; and
a channel region of the second conductivity type which is formed so as to surround the source region and which is connected with the second diffusion region.

10. The semiconductor device according to claim 1, further comprising:
a gate electrode formed over the epitaxial layer between the adjacent first trenches, via a gate insulating film;
a source region of the first conductivity type formed in the epitaxial layer on one side of the gate electrode; and
a channel region of the second conductivity type which is formed so as to surround the source region and which is connected with the second diffusion region.

11. The semiconductor device according to claim 1, further comprising:
a third trench which is formed in the epitaxial layer between the adjacent first trenches and which has a third depth from an upper face of the epitaxial layer;
a gate electrode formed inside the third trench, via a gate insulating film;
a source region of the first conductivity type which is formed in the epitaxial layer on both sides of the gate electrode and which has a fourth depth shallower than the third depth from an upper face of the epitaxial layer; and
a channel region of the second conductivity type which is formed in the epitaxial layer on both sides of the gate electrode so as to surround the source region and which is connected with the second diffusion region.

12. The semiconductor device according to claim 11, further comprising a source electrode connected electrically with the source region and the channel region,
wherein an upper face of the first insulating film embedded inside the first trench lies at a position deeper than an interface between the source region and the channel region; and
wherein the source electrode is connected with the source region and the channel region at a side wall of the first trench.

13. The semiconductor device according to claim 11, further comprising a source electrode connected electrically with the source region and the channel region,
wherein an upper face of the first insulating film embedded inside the first trench lies at a position shallower than an interface between the source region and the channel region; and
wherein the source electrode is connected with the source region and the channel region at an upper face of the epitaxial layer.

14. The semiconductor device according to claim 1, further comprising:
a third trench which is formed in the epitaxial layer between the adjacent first trenches and which has a third depth from an upper face of the epitaxial layer;
a gate electrode formed inside the third trench via a gate insulating film;
a source region of the first conductivity type which is formed in the epitaxial layer on one side of the gate electrode and which has a fourth depth shallower than the third depth from an upper face of the epitaxial layer; and
a channel region of the second conductivity type which is formed in the epitaxial layer on one side of the gate electrode so as to surround the source region and which is connected with the second diffusion region.

15. The semiconductor device according to claim 14, further comprising a source electrode connected electrically with the source region and the channel region,
wherein an upper face of the first insulating film embedded inside the first trench lies at a position deeper than an interface between the source region and the channel region; and
wherein the source electrode is connected with the source region and the channel region at a side wall of the first trench.

16. The semiconductor device according to claim 14, further comprising a source electrode connected electrically with the source region and the channel region,
wherein an upper face of the first insulating film embedded inside the first trench lies at a position shallower than an interface between the source region and the channel region; and
wherein the source electrode is connected with the source region and the channel region at an upper face of the epitaxial layer.

17. The semiconductor device according to claim 1, further comprising a gate electrode which is formed between the adjacent first trenches and which extends in the first direction in plan view.

18. The semiconductor device according to claim 1, further comprising a gate electrode which is formed between the adjacent first trenches and which extends in the second direction in plan view.

19. The semiconductor device according to claim 1,
wherein a vacancy is formed in the first insulating film embedded inside the first trench.

* * * * *